(12) United States Patent
Kobayashi et al.

(10) Patent No.: US 9,231,021 B2
(45) Date of Patent: Jan. 5, 2016

(54) IMAGE PICKUP APPARATUS, IMAGE PICKUP SYSTEM, AND IMAGE PICKUP APPARATUS MANUFACTURING METHOD

(71) Applicant: CANON KABUSHIKI KAISHA, Tokyo (JP)

(72) Inventors: Masahiro Kobayashi, Tokyo (JP); Yuichiro Yamashita, Hsinchu (TW)

(73) Assignee: CANON KABUSHIKI KAISHA, Tokyo (JP)

( * ) Notice: Subject to any disclaimer, the term of this patent is extended or adjusted under 35 U.S.C. 154(b) by 155 days.

(21) Appl. No.: 13/765,525

(22) Filed: Feb. 12, 2013

(65) Prior Publication Data
US 2013/0215287 A1    Aug. 22, 2013

(30) Foreign Application Priority Data

Feb. 17, 2012   (JP) ................................. 2012-033362

(51) Int. Cl.
| H01L 27/148 | (2006.01) |
| H01L 27/146 | (2006.01) |
| H04N 5/3745 | (2011.01) |

(52) U.S. Cl.
CPC .... *H01L 27/14806* (2013.01); *H01L 27/14603* (2013.01); *H01L 27/14609* (2013.01); *H04N 5/37452* (2013.01)

(58) Field of Classification Search
CPC ............................... H04N 9/045; H04N 5/232

USPC ....................................................... 348/222.1
See application file for complete search history.

(56) References Cited

U.S. PATENT DOCUMENTS

| 2010/0091157 A1* | 4/2010 | Yamashita et al. ............ 348/300 |
| 2012/0193745 A1* | 8/2012 | Onuki et al. .................. 257/461 |

FOREIGN PATENT DOCUMENTS

JP       2011-082425 A     4/2011

* cited by examiner

*Primary Examiner* — James Hannett
*Assistant Examiner* — Fayez Bhuiyan
(74) *Attorney, Agent, or Firm* — Canon USA, Inc. IP Division

(57) ABSTRACT

An image pickup apparatus includes a semiconductor substrate, and multiple pixels. Each of the multiple pixels includes a photoelectric-conversion unit disposed in the semiconductor substrate, a first conductive first semiconductor region disposed in the semiconductor substrate, which holds charge generated by the photoelectric-conversion unit at a place different from the photoelectric-conversion unit, a first transfer unit which transfers charge to the first semiconductor region, and a second transfer unit which transfers charge held at the first semiconductor region. The first semiconductor region includes a first portion, a second portion, and a third portion. At the depth where the third portion is disposed, the first portion is disposed between the third portion and first transfer unit, and the second portion is disposed between the third portion and second transfer unit. Impurity concentration of the third portion is lower than that of the first and second portions.

31 Claims, 26 Drawing Sheets

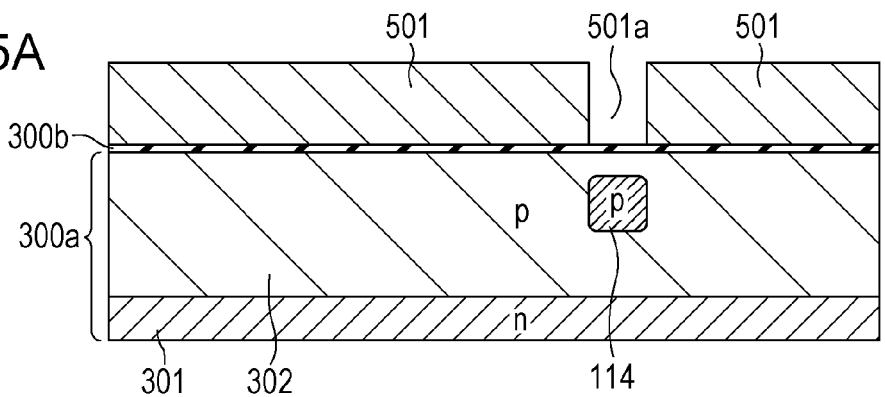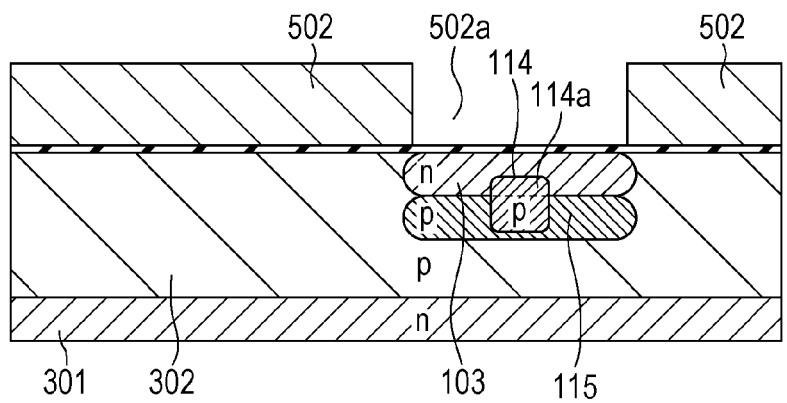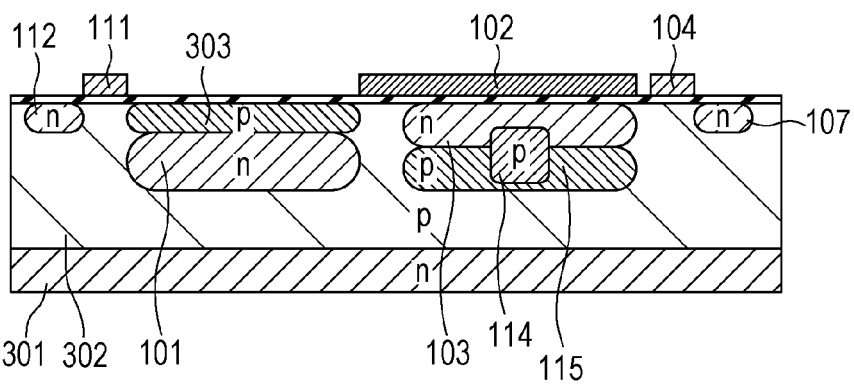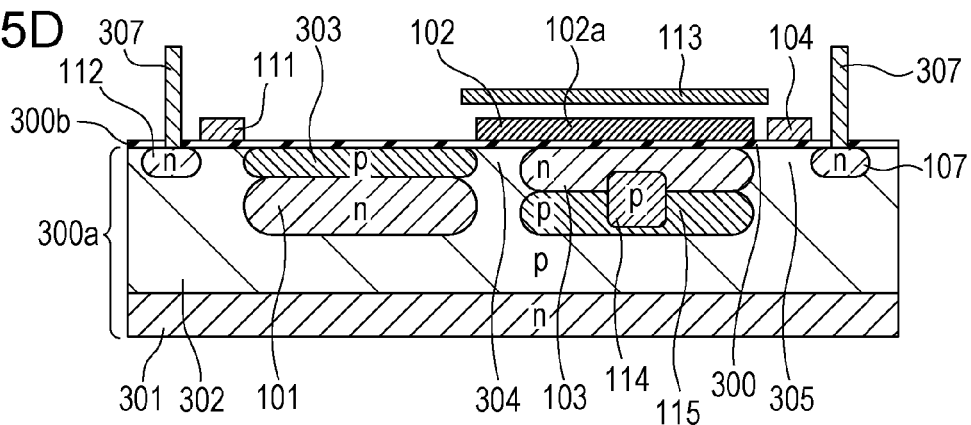

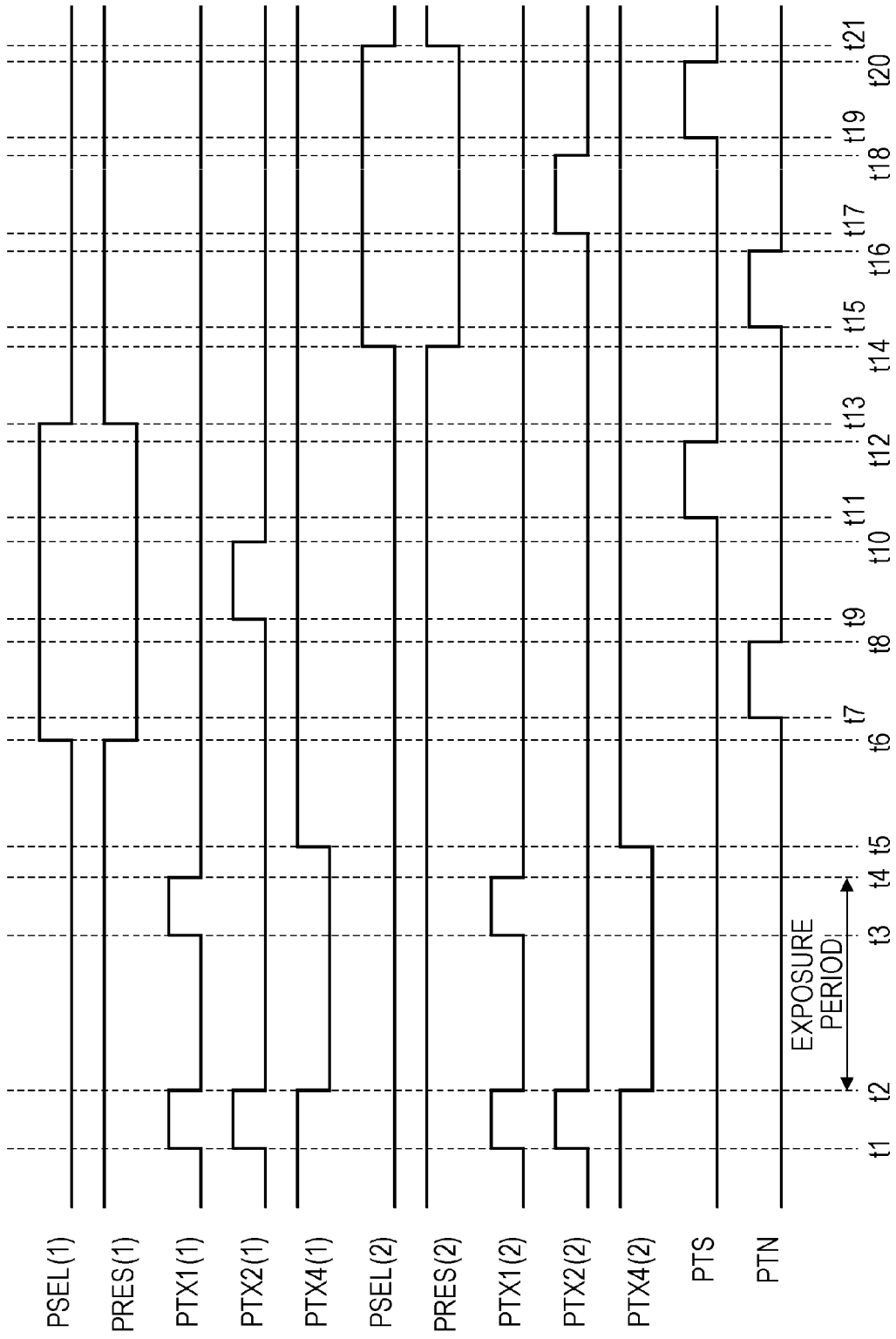

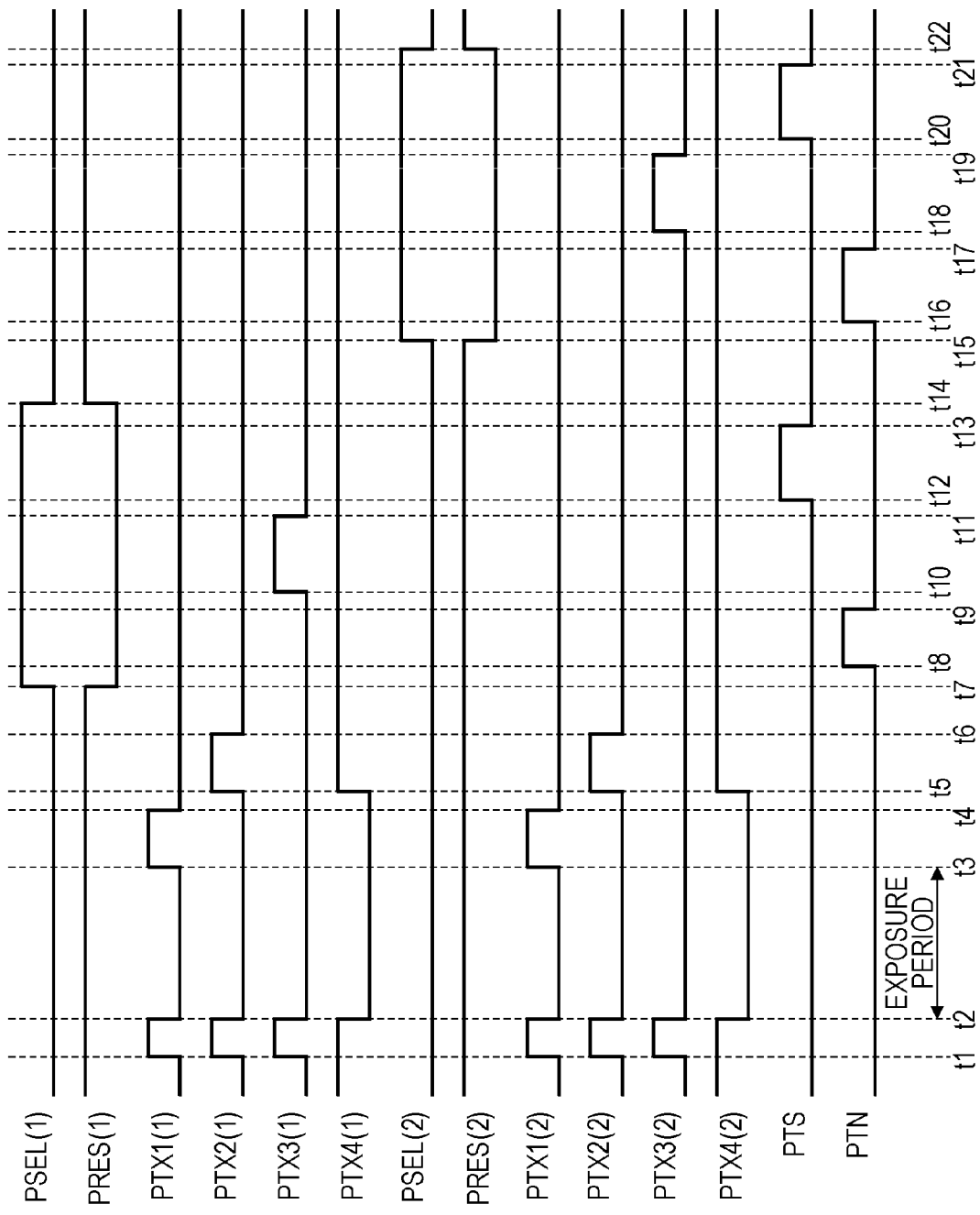

IMAGE PICKUP APPARATUS, IMAGE PICKUP SYSTEM, AND IMAGE PICKUP APPARATUS MANUFACTURING METHOD

BACKGROUND OF THE INVENTION

1. Field of the Invention

One disclosed aspect of the embodiments relates to an image pickup apparatus, an image pickup system, and an image pickup apparatus manufacturing method.

2. Description of the Related Art

In recent years, owing to further improvement in the performance of image pickup apparatuses, there has been studied a configuration including a charge holding unit within a pixel separately from photoelectric conversion unit and a floating diffusion (hereinafter, FD). As for usage of the holding unit, the holding unit is provided to realize a global electronic shutter as disclosed in Japanese Patent Laid-Open No. 2011-082425. There has been disclosed in Japanese Patent Laid-Open No. 2011-082425 a pixel including a photoelectric conversion unit and the holding unit.

SUMMARY OF THE INVENTION

One or more embodiments relate to an image pickup apparatus including a semiconductor substrate, and multiple pixels. Each of the multiple pixels includes a photoelectric conversion unit disposed in the semiconductor substrate, a first conductive-type first semiconductor region disposed in the semiconductor substrate, and configured to hold charge generated by the photoelectric conversion unit at a place different from the photoelectric conversion unit, a first transfer unit configured to transfer charge to the first semiconductor region, and a second transfer unit configured to transfer charge held at the first semiconductor region. The first semiconductor region includes a first portion, a second portion, and a third portion. At a depth where the third portion is disposed, the first portion is disposed between the third portion and the first transfer unit, and the second portion is disposed between the third portion and the second transfer unit. Impurity concentration of the third portion is lower than impurity concentration of the first portion and impurity concentration of the second portion.

One or more embodiments relate to an image pickup apparatus including a semiconductor substrate, and multiple pixels. Each of the multiple pixels includes a photoelectric conversion unit disposed in the semiconductor substrate, a first conductive-type first semiconductor region disposed in the semiconductor substrate, and configured to hold charge generated by the photoelectric conversion unit at a place different from the photoelectric conversion unit, a first transfer unit configured to transfer charge to the first semiconductor region, and a second transfer unit configured to transfer charge held at the first semiconductor region. The first semiconductor region includes a first portion, and a second portion. A second conductive-type second semiconductor region is disposed in the semiconductor substrate. At a depth where the second semiconductor region is disposed, the first portion is disposed between the second semiconductor region and the first transfer unit, and the second portion is disposed between the second semiconductor region and the second transfer unit.

One or more embodiments relate to an image pickup apparatus manufacturing method. The image pickup apparatus manufacturing method according to an embodiment includes: a process arranged to form a photoelectric conversion unit in a first area of a semiconductor substrate; and a process arranged to form a first conductive-type first semiconductor region configured to hold charge generated by the photoelectric conversion unit at a place different from the photoelectric conversion unit in a second area of the semiconductor substrate. The processing arranged to form the first semiconductor region includes a process arranged to introduce a first conductive-type first impurity into the second area. The second area includes a first portion, and a second portion surrounded with the first portion. The manufacturing method according to an embodiment further includes: a process arranged to introduce, so that the amount of a second conductive-type second impurity to be introduced into the second portion is greater than the amount of the second impurity to be introduced into the first portion, the second impurity into the second area.

One or more embodiments relate to an image pickup apparatus manufacturing method. The image pickup apparatus manufacturing method according to an embodiment includes: a process arranged to form a photoelectric conversion unit in a first area of a semiconductor substrate; and a process arranged to form a first conductive-type first semiconductor region configured to hold charge generated by the photoelectric conversion unit at a place different from the photoelectric conversion unit in a second area of the semiconductor substrate. The second area includes a first portion, and a second portion surrounded with the first portion. The processing arranged to form the first semiconductor region includes a process arranged to introduce, so that the amount of a first conductive-type first impurity to be introduced into the first portion is greater than the amount of the first impurity to be introduced into the second portion, the first impurity into the second area.

Further features of the disclosure will become apparent from the following description of exemplary embodiments with reference to the attached drawings.

BRIEF DESCRIPTION OF THE DRAWINGS

FIGS. 5A to 5D are diagrams illustrating a manufacturing method of an embodiment of the image pickup apparatus.

FIG. 6 is a diagram illustrating driving pulses of an embodiment of the image pickup apparatus.

FIG. 22 is a diagram illustrating driving pulses of an embodiment of the image pickup apparatus.

DESCRIPTION OF THE EMBODIMENTS

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

According to one or more embodiments, a pixel configuration which enables global electronic shutter may be provided, and also transfer of charge from a holding unit may be performed with low voltage.

With an image pickup apparatus, a second conductive-type semiconductor region is disposed below a first conductive-type semiconductor region making up the holding unit, whereby transfer of charge from the holding unit may be performed with low voltage.

Figure 2:
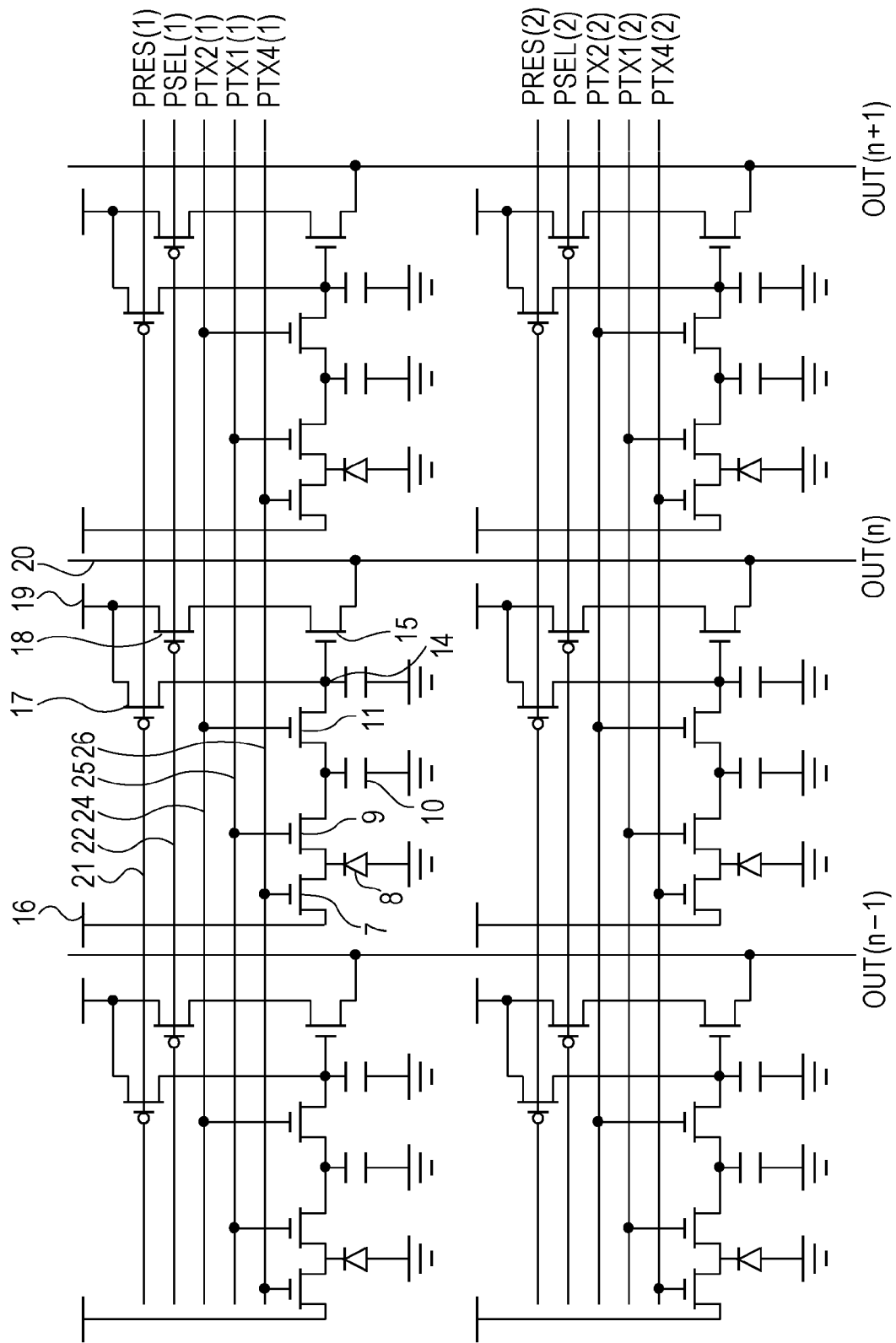
FIG. 2 is a diagram illustrating an equivalent circuit of an embodiment of the image pickup apparatus.

One or more embodiments will be described with reference to the drawings. An image pickup apparatus according to one or more embodiments includes multiple pixels. FIG. 2 illustrates an example of an equivalent circuit of the pixels of the image pickup apparatus. As illustrated in FIG. 2, the pixels include a photoelectric conversion unit 8 and a first holding unit 10 which holds charge at a place different from the photoelectric conversion unit 8. Further, the pixels include a first charge transfer unit 9 which transfers charge to the first holding unit 10 and a second charge transfer unit 11 which transfers charge held at the first holding unit 10. Features of one or more embodiments relate to a configuration of the first holding unit 10, or a manufacturing method for the first holding unit 10.

Figure 3:
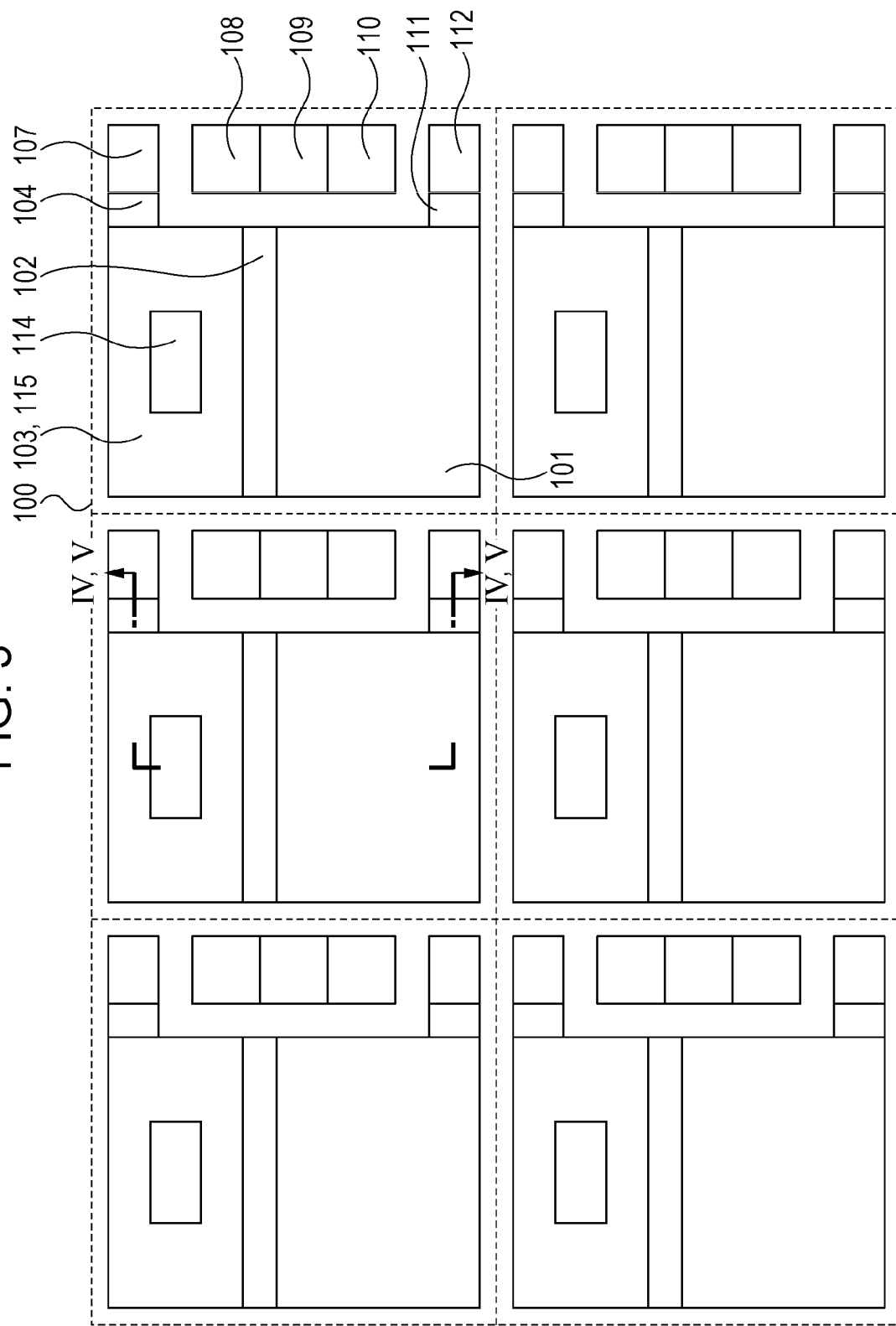
FIG. 3 is a schematic view illustrating the top face of an embodiment of the image pickup apparatus.

One or more embodiments will be described. FIG. 3 illustrates an example of top face views of the pixels including the first holding unit 10. The first holding unit 10 is configured to include a first conductive-type first semiconductor region 103. Signal charge is accumulated in the first semiconductor region 103. The first charge transfer unit 9 is configured to include a control electrode 102. The second charge transfer unit 11 is configured to include a control electrode 104. Also, a second conductive-type second semiconductor region 114 is disposed in a pixel 100. With a planar view, a portion (first portion) of the first semiconductor region 103 is disposed between the second semiconductor region 114 and the first charge transfer unit 9. Further, with a planar view, a portion (second portion) of the first semiconductor region 103 is disposed between the second semiconductor region 114 and the second charge transfer unit 11. In the drawing, the second semiconductor region 114 is surrounded with the first semiconductor region 103. However, an example of the second semiconductor region 114 not surrounded with the first semiconductor region 103 is also encompassed in embodiments of the disclosure.

Figure 4A:
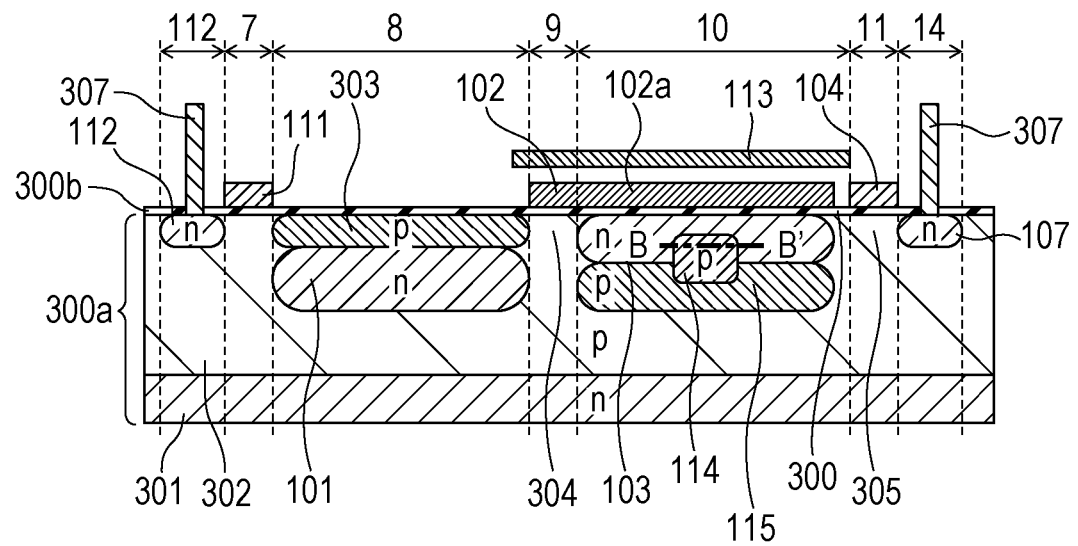
FIGS. 4A and 4B are schematic views of a cross section of an embodiment of the image pickup apparatus.
Figure 4B:
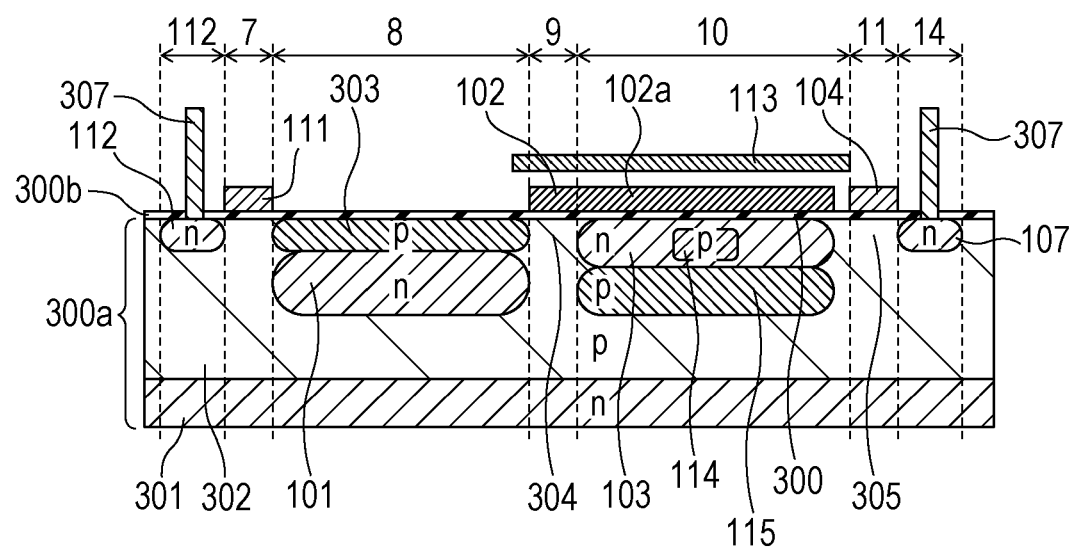

FIGS. 4A and 4B are schematic views illustrating a cross section along the line IV-IV in FIG. 3. At the depth where the second semiconductor region 114 in FIG. 4 is disposed (position in line B-B'), the portion (first portion) of the first semiconductor region 103 is disposed between the second semiconductor region 114 and the first charge transfer unit 9. Also, the other portion (second portion) of the first semiconductor region 103 is disposed between the second semiconductor region 114 and the second charge transfer unit 11. Here, the depth is distance from an interface 300 between a semiconductor substrate 300a and an insulating film 300b. Specifically, with a surface parallel to the interface 300, the one different portion of the first semiconductor region 103 is each disposed between the second semiconductor region 114 and the first charge transfer unit 9, and between the second semiconductor region 114 and the second charge transfer unit 11.

Figure 10:
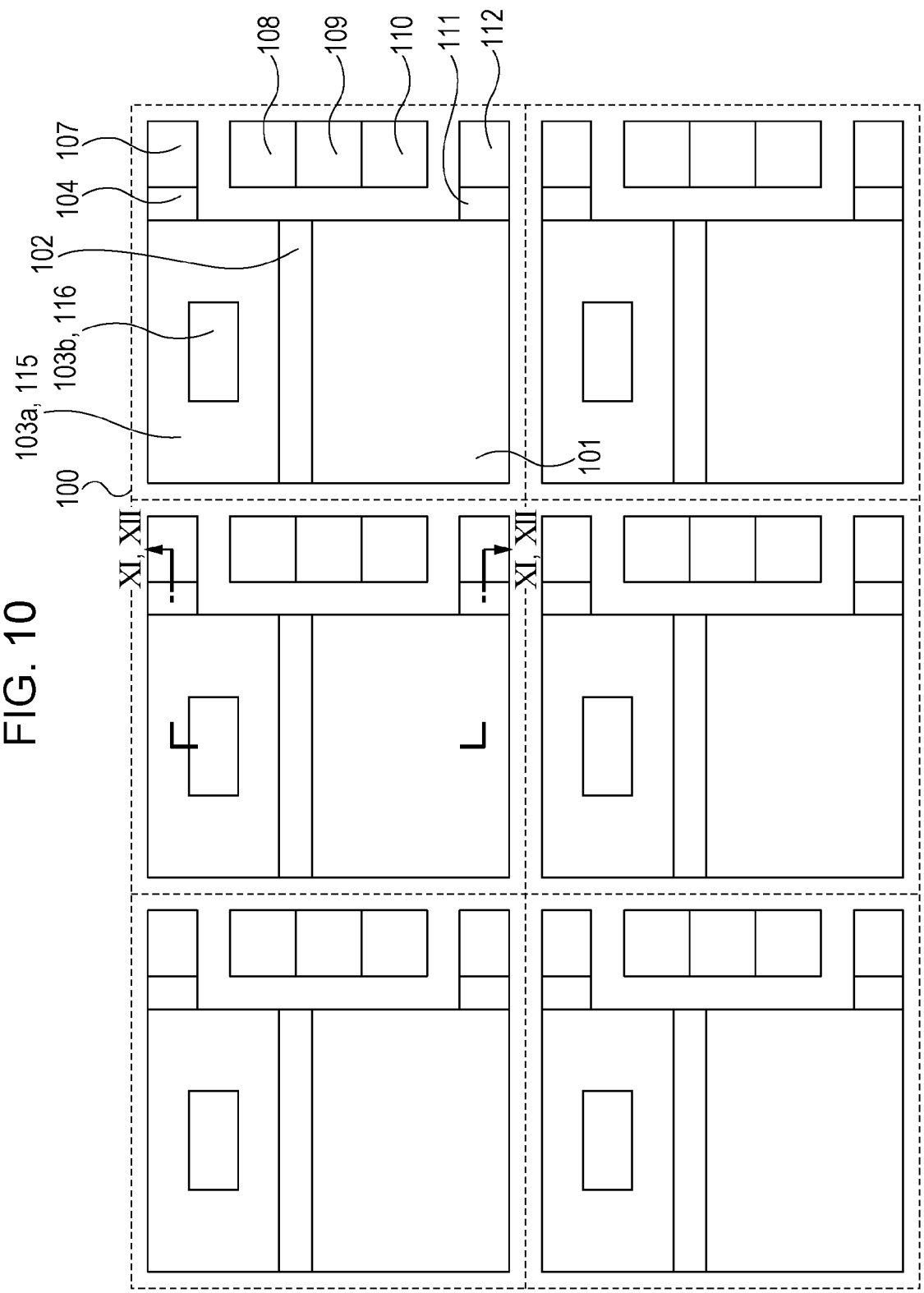
FIG. 10 is a schematic view illustrating the top face of an embodiment of an image pickup apparatus.

One or more embodiments will be described. FIG. 10 illustrates another example of top face views of pixels including the first holding unit 10. The first holding unit 10 is configured to include a first conductive-type first semiconductor region 103. Signal charge is accumulated in the first semiconductor region 103. The first charge transfer unit 9 is configured to include a control electrode 102. The second charge transfer unit 11 is configured to include a control electrode 104. With this example, the first semiconductor region 103 includes a first portion 103a (first and second portions) and a second portion 103b (third portion). Impurity concentration of the first portion 103a is higher than that of the second portion 103b. With a planar view, a portion (first portion) of the first portion 103a of the first semiconductor region 103 is disposed between the second portion 103b (third portion) and the first charge transfer unit 9. Further, with a planar view, another portion (second portion) of the first portion 103a of the first semiconductor region 103 is disposed between the second portion 103b (third portion) and the second charge transfer unit 11. In the drawing, the second portion 103b is surrounded with the first portion 103a. However, an example of the second portion 103b not surrounded with the first portion 103a is also encompassed in embodiments of the disclosure.

Figure 11A:
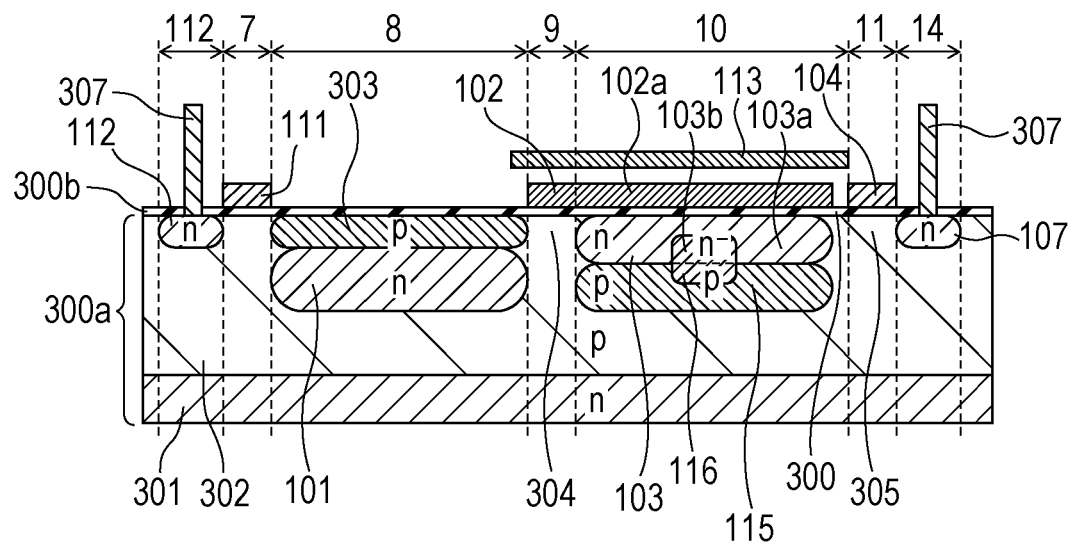
FIGS. 11A and 11B are schematic views of a cross section of an embodiment of the image pickup apparatus.
Figure 11B:
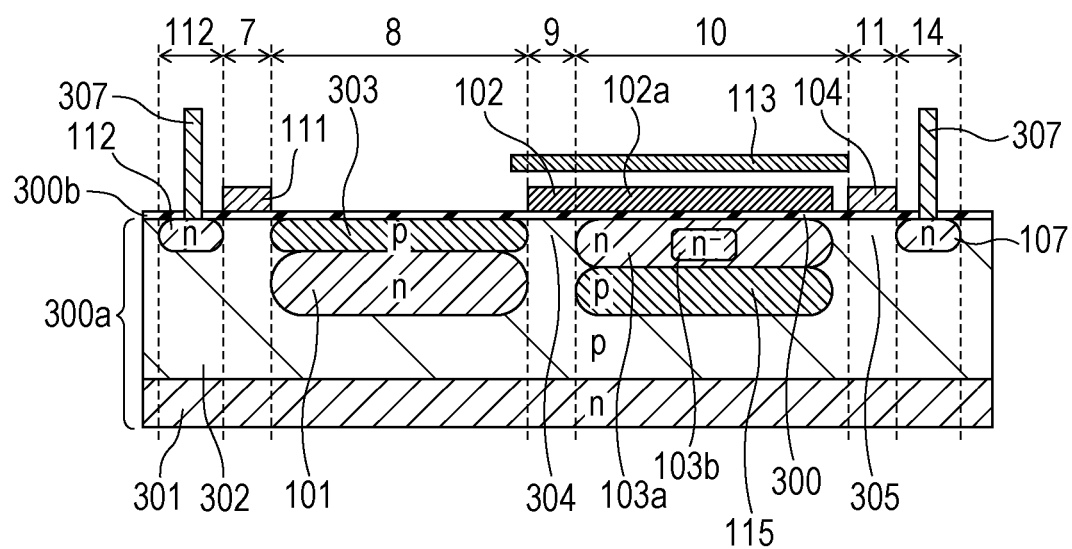

FIGS. 11A and 11B are schematic views illustrating an example of a cross section along the line XI-XI in FIG. 10. At the depth where the second portion 103b (third portion) in FIGS. 11A and 11B is disposed, one portion (first portion) of the first portion 103a of the first semiconductor region 103 is disposed between the second portion 103b and the first charge transfer unit 9. Also, another portion (second portion) of the first portion 103a of the first semiconductor region 103 is disposed between the second portion 103b and the second charge transfer unit 11. Here, the depth is distance from an interface 300 between a semiconductor substrate 300a and an insulating film 300b. Specifically, with a surface parallel to the interface 300, the one different portion of the first portion 103a of the first semiconductor region 103 is each disposed between the second portion 103b and the first charge transfer unit 9, and between the second portion 103b and the second charge transfer unit 11.

The first holding unit 10 thus described is preferably formed by the following manufacturing method. FIGS. 5A to 5D illustrate an example of a manufacturing method of an image pickup apparatus according to one or more embodiments. In order to form the first conductive-type first semiconductor region 103 making up the first holding unit 10, a first conductive-type impurity is introduced into the semiconductor substrate. Next, a second conductive-type impurity is introduced into the area where the first conductive-type impurity has been introduce, or an area 114 which is a portion of the area where the first conductive-type impurity is introduced. Specifically, the second conductive-type impurity is introduced into the semiconductor substrate so that the dose of the second conductive-type impurity in the area 114 becomes higher than the dose of the second conductive-type impurity in an area other than the area 114 which is the area where the first semiconductor region 103 is disposed. The area 114 is an area where the second semiconductor region 114 in FIGS. 3, 4A, and 4B is disposed, or the area 114 is an area where the second area 103b in FIGS. 10, 11A, and 11B is disposed. In this manner, the second semiconductor region 114 or the second portion 103b of the first semiconductor region 103 is formed by controlling the profile of an impurity of the opposite conductive type of an impurity which forms the first semiconductor region 103.

The conductive type of the area 114 is determined with a magnitude relation between the dose of the second conductive-type impurity to be introduced into the area 114 and the dose of the first conductive-type impurity to be introduced for forming the first semiconductor region 103. In the event that the dose of the second conductive-type impurity is lower, the area 114 becomes the second portion 103b of the first semiconductor region 103. In the event that the dose of the second conductive-type impurity is higher, the area 114 becomes the second conductive-type second semiconductor region 114.

Figure 18A:
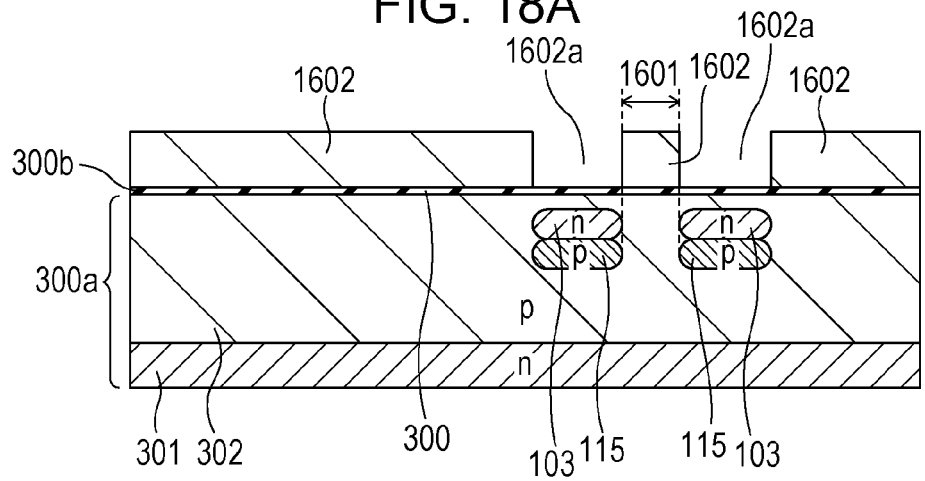
FIGS. 18A to 18C are diagrams illustrating a manufacturing method of an embodiment of the image pickup apparatus.
Figure 18B:
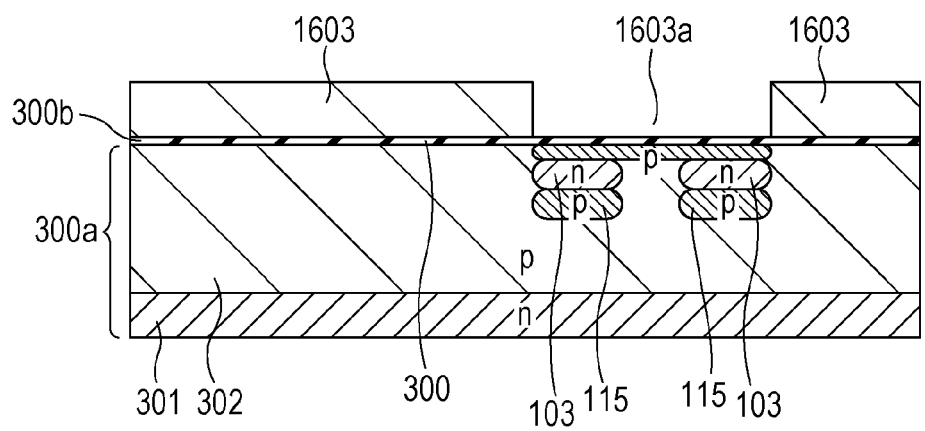
Figure 18C:
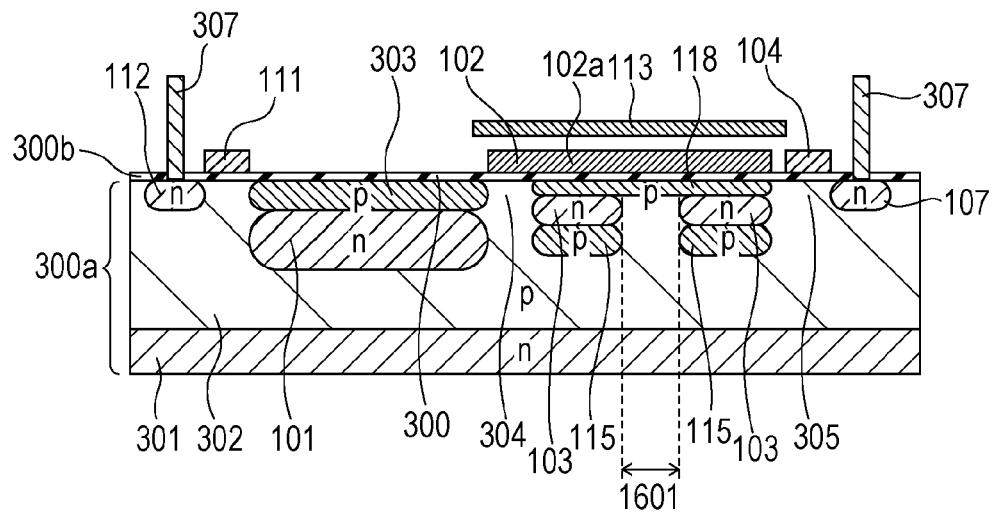

FIGS. 18A to 18C illustrate another example of an image pickup apparatus manufacturing method according to one or more embodiments. An area 1601 in FIGS. 18A to 18C illustrate an area where the first conductive-type impurity is not introduced at the time of forming the first conductive-type first semiconductor region 103. In this manner, the second semiconductor region 114 or second portion 103b is formed by controlling the profile of the impurity which forms the first semiconductor region 103.

According to the above-mentioned configuration, a pixel configuration which enables global electronic shutter may be provided, and also transfer of charge from a holding unit may be performed with low voltage.

Hereinafter, advantages of reduction in transfer voltage will be described. Therefore, a configuration where the area 114 is not disposed will be considered as a comparative example. With the comparative example, an impurity concentration distribution of the first semiconductor region 103 making up the holding unit is even in the planar direction.

In FIGS. 7A to 7D and 8A to 8D, an example of a potential distribution along a transfer path of charge in a pixel is illustrated. With these drawings, the transfer path is illustrated as the photoelectric conversion unit 8, first charge transfer unit 9, first holding unit 10, second charge transfer unit 11, and input node 14. Potential in a pixel of the image pickup apparatus according to one or more embodiments is illustrated with a solid line. A potential distribution in pixels of the comparative example is illustrated with a dashed line.

Figure 7A:
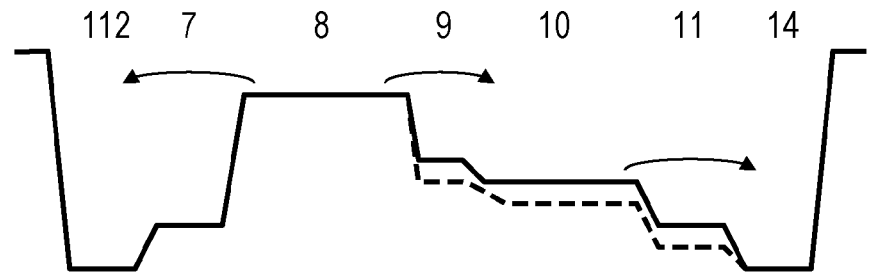
FIGS. 7A to 7D are schematic diagrams representing potential with an embodiment of the image pickup apparatus.
Figure 7B:
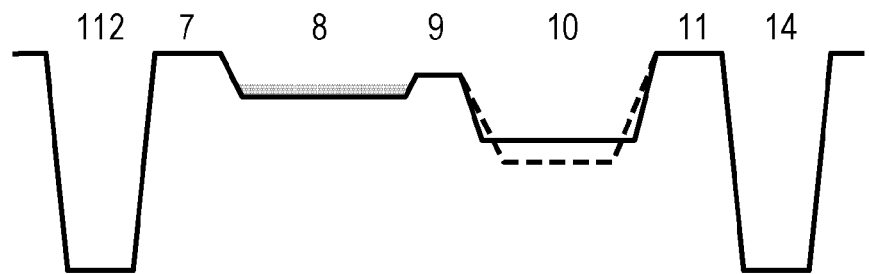

As illustrated in FIG. 7B, the bottom of a potential distribution of the first holding unit 10 according to one or more embodiments is shallower as compared to the comparative example. That is to say, potential at the bottom of the potential distribution is high. As compared to the comparative example, the bottom of the potential distribution of the first holding unit 10 according to one or more embodiments extends in the transfer direction of charge, i.e., the direction of the second charge transfer unit 11. Thus, the bottom of the potential distribution at the holding unit according to one or more embodiments comes closer to the transfer unit as compared to the comparative example. This is owing to the second semiconductor region having a side face surrounded with the first semiconductor region being disposed.

According to such a configuration, the a potential barrier is not readily formed in the charge transfer path from the first holding unit 10 to the input node 14 as compared to the comparative example. Therefore, transfer of charge from the holding unit may be performed with lower voltage.

Figure 8A:
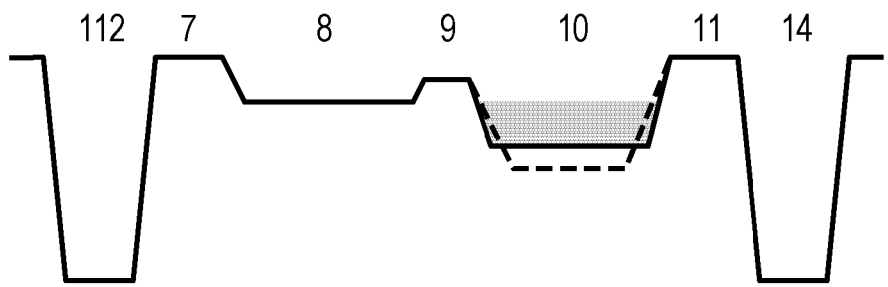
FIGS. 8A to 8D are schematic diagrams representing potential with an embodiment of the image pickup apparatus.
Figure 8B:
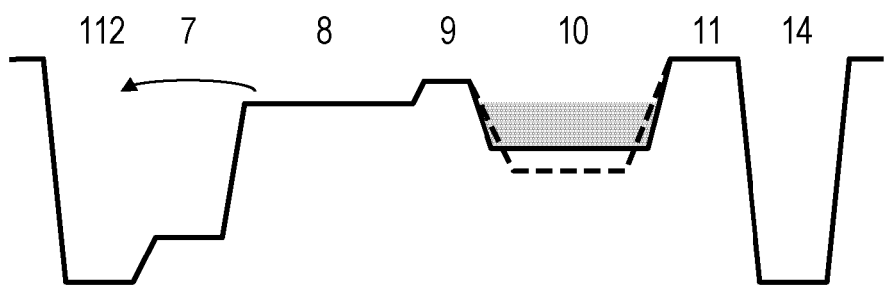
Figure 8C:
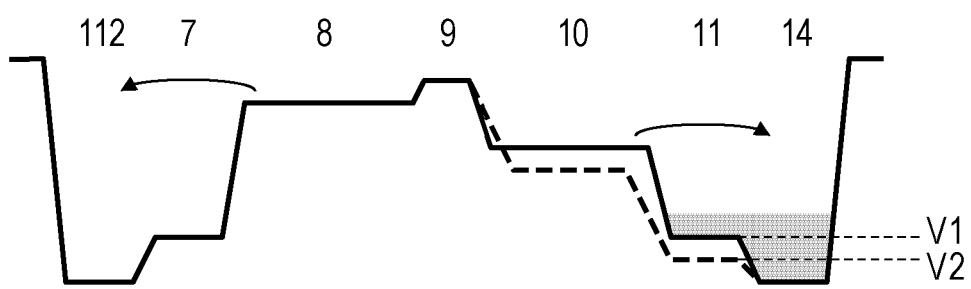
Figure 9:
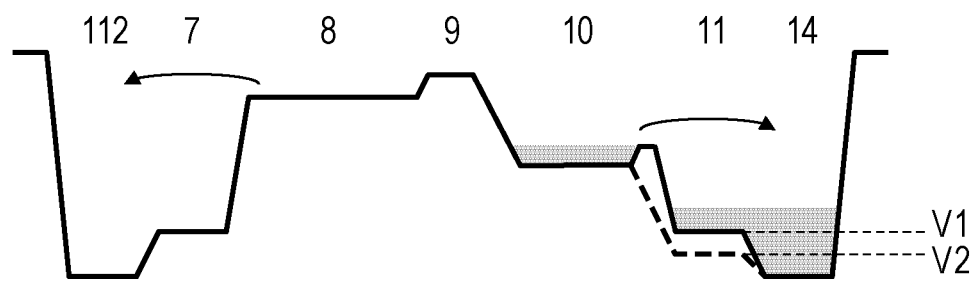
FIG. 9 is a schematic diagram representing potential with a comparative example.

Specifically, as illustrated in FIG. 8C for example, with an image pickup apparatus according to one or more embodiments, charge of the first holding unit 10 may be transferred to the input node 14 by the potential of the second charge transfer unit 11 being V1. On the other hand, with the comparative example, charge of the first holding unit 10 is transferred to the input node 14 by the potential of the second charge transfer unit 11 being V2 that is lower than the V1. With the comparative example, when taking the potential of the second charge transfer unit 11 as the V1, as illustrated in FIG. 9, a potential barrier occurs between the first holding unit and the input node 14. Therefore, with the comparative example, part of charge is not transferred and remaining in the first holding unit 10. In this manner, with the image pickup apparatus according to one or more embodiments, transfer of charge may be performed without decreasing the potential of the second charge transfer unit to the V2. That is to say, transfer of charge may be performed with low voltage.

Note that the bottom of a potential distribution at the holding unit according to one or more embodiments is higher than that of the comparative example. However, the bottom of a potential distribution at the holding unit according to one or more embodiments laterally extends as described above, and accordingly, deterioration in saturation charge amount is suppressed by this. Also, the saturation charge amount may be increased by enhancing the impurity concentration of the first semiconductor region.

Hereinafter, embodiments of the disclosure will be described. "first conductive-type" and "second conductive-type" are terms to be used for representing mutually different conductive types. In the event that "first conductive-type" is N type, "second conductive-type" is P type. In the event that "first conductive-type" is P type, "second conductive-type" is N type. Hereinafter, for simplification of description, an example will be described wherein "first conductive-type" is N type, "second conductive-type" is P type. However, the disclosure is not restricted to this, and may also be applied to a case where "first conductive-type" is P type, "second conductive-type" is N type. In the event that the semiconductor region making up the holding unit is N type, electrons caused due to photoelectric conversion and of positive holes electrons are accumulated in the holding unit. In the event that the semiconductor region making up the holding unit is P type, electrons caused due to photoelectric conversion and of positive holes positive holes are accumulated in the holding unit.

Also, hereinafter, an embodiment of a pixel-amplification-type image pickup apparatus having an amplifier element for each pixel will be described. The disclosure is not restricted to this, and may include a charge holding unit and various sensors having a transfer unit which transfers charge held at the holding unit.

First Embodiment

Figure 1:
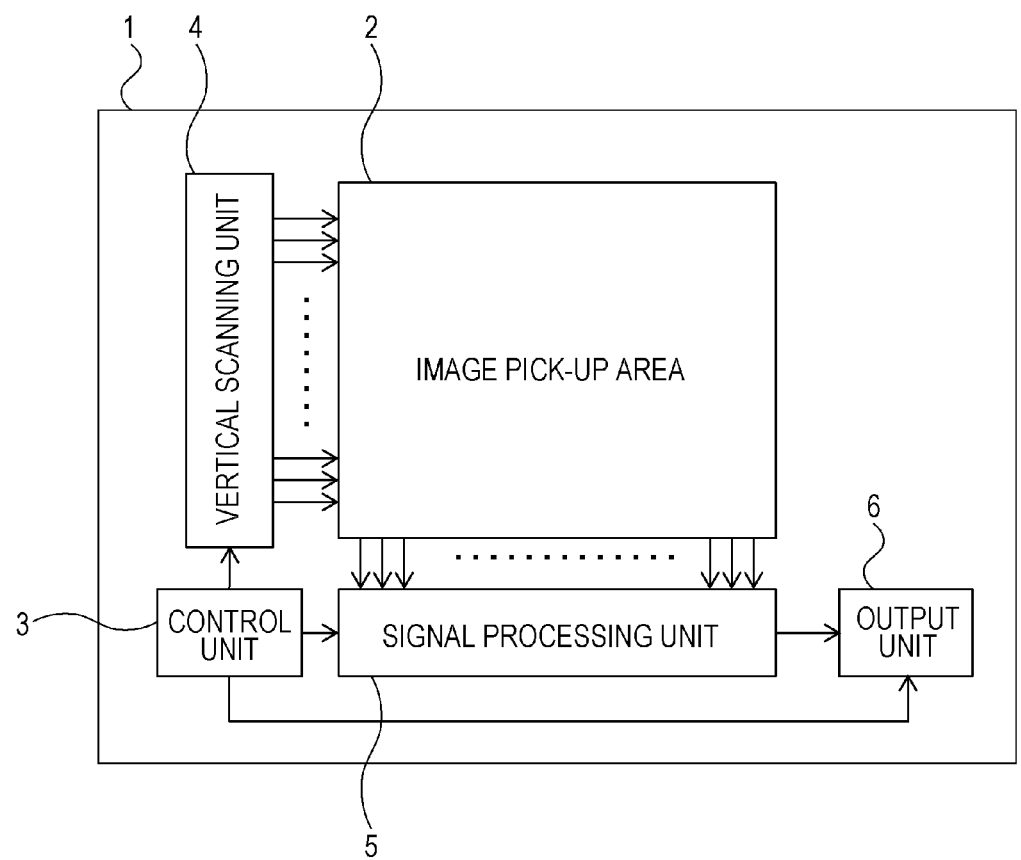
FIG. 1 is a block diagram of an embodiment of an image pickup apparatus.

An embodiment of an image pickup apparatus will be described. FIG. 1 is an overall block diagram of image pickup apparatuses according to some embodiments. An image pickup apparatus 1 may be configured of one chip using a semiconductor substrate. The image pickup apparatus 1 includes multiple pixels disposed in an image pickup area 2. Further, the image pickup apparatus 1 includes a control unit 3. The control unit 3 supplies a control signal, power supply voltage, and so forth to a vertical scanning unit 4, a signal processing unit 5, and an output unit 6.

The vertical scanning unit 4 supplies a driving pulse to multiple pixels disposed in the image pickup area 2. Usually, the vertical scanning unit 4 supplies a driving pulse for each pixel row or for every multiple pixel rows. The vertical scanning unit 4 may be configured of a shift register or address decoder.

The signal processing unit 5 is configured to include a column circuit, a horizontal scanning circuit, and a horizontal output line. The column circuit is configured of multiple circuit blocks which each receive the signals of multiple pixels included in a pixel row selected by the vertical scanning unit 4. Each of the circuit blocks may be configured of one or all of a memory unit, an amplifier circuit, a denoising circuit, and an analog-to-digital conversion circuit, or a combination of these. These circuits may be a circuit which processes digital signals or may be a circuit which processes analog signals. The horizontal scanning circuit may be configured of a shift register or address decoder.

The output unit 6 outputs a signal transmitted via a horizontal output line out of the image pickup apparatus 1. The output unit 6 is configured to include a buffer or amplifier circuit.

FIG. 2 illustrates an equivalent circuit of image pickup apparatuses according to some embodiments. Here, though six pixels in a total of two rows by three columns are illustrated, an image pickup area may be configured by an even greater number of pixels being disposed.

The photoelectric conversion unit 8 converts incident light into signal charge (electron or positive hole). A photodiode is illustrated as an example of the photoelectric conversion unit 8.

The first charge transfer unit 9 transfers charge generated at the photoelectric conversion unit 8 to a circuit element on the subsequent stage. Hereinafter, a case where electrons are employed as signal charge will be described as an example. The first charge transfer unit 9 is configured to include a control electrode disposed on the semiconductor substrate via an insulating film.

The first holding unit 10 holds electrons generated at the photoelectric conversion unit 8. The second charge transfer unit 11 transfers the electrons held at the first holding unit 10 to a circuit element on the subsequent stage. The second charge transfer unit 11 is configured to include a control electrode disposed on the semiconductor substrate via an insulating film.

An input node 14 of a amplifier element 15 is configured so as to hold electrons transferred from the first holding unit 10 via the second charge transfer unit 11. The input node 14 of the amplifier element 15 may be configured to include a floating diffusion area (hereinafter, FD area) disposed in the semiconductor substrate. The amplifier element 15 amplifies a signal based on electrons transferred to the input node 14 and outputs to a vertical signal line 20. Here, a MOS transistor (hereinafter, amplifier transistor) is employed as the amplifier element 15. For example, the amplifier transistor makes up a source follower circuit. Also, the second charge transfer unit 11 is disposed in an electrical path between the input node 14 of the amplifier element 15 and the first holding unit 10. That is to say, the input node 14 of the amplifier element 15 and the first holding unit 10 are different nodes. The configuration is not restricted to such an example, and as long as two nodes are configured so as to be electrically insulated, these nodes are different nodes.

A fourth charge transfer unit 7 transfers the electrons of the photoelectric conversion unit 8 to an overflow drain area (hereinafter, OFD area). The OFD area may be configured of an N-type semiconductor region electrically connected to a wiring 16 which supplies power supply voltage, for example. The fourth charge transfer unit 7 may be configured to include a control electrode disposed on the semiconductor substrate via the insulating film. Electronic shutter operation may be performed with the fourth charge transfer unit 7. That is to say, a period to discharge electrons generated at the photoelectric conversion unit 8 (shutter period) and a period to accumulate electrons (exposure period) may be controlled by controlling the fourth charge transfer unit 7.

A reset unit 17 supplies reference voltage to the input node 14 of the amplifier element 15. The reset unit 17 resets the electrons held at the input node 14 of the amplifier element 15. Here, a MOS transistor (hereinafter, reset transistor) is employed as the reset unit 17.

A selecting unit 18 selects each pixel to read out the signal of a pixel to a vertical signal line 20 for each pixel or for every pixel row. Here, a MOS transistor (hereinafter, selecting transistor) is employed as the selecting unit 18. Note that the selecting unit 18 may be disposed in a path between the amplifier element 15 and the vertical signal line 20. Alternatively, the selecting unit 18 may be omitted. With an example of the selecting unit 18 being omitted, a pixel is selected by voltage that the reset unit 17 supplies to the input node 14 of the amplifier element 15.

Predetermined voltage is supplied to the drain of the reset transistor and the drain of the selecting transistor via a wiring 19. The predetermined voltage is power supply voltage, for example. Note that, in the event that the selecting unit 18 has been disposed in a path between the amplifier element 15 and the vertical signal line 20, and also in the event that the selecting unit 18 has been omitted, the drain of the amplifier transistor is connected to the wiring 19.

A reset control wiring 21 supplies a driving pulse PRES to the gate of the reset transistor. A selection control wiring 22 supplies a driving pulse PSEL to the gate of the selecting transistor. A second transfer control wiring 24 supplies a driving pulse PTX2 to a control electrode (hereinafter, second control gate) making up the second charge transfer unit 11. A first transfer control wiring 25 supplies a driving pulse PTX1 to a control electrode (hereinafter, first control gate) making up the first charge transfer unit 9. A fourth transfer control wiring 26 supplies a driving pulse PTX4 to a control electrode (hereinafter, fourth control gate) making up the fourth charge transfer unit 7. The height of the potential barrier of the semiconductor region below each of the control gates may be changed by changing a pulse value to be supplied to each of the control gates.

With some embodiments, at the pixel configuration illustrated with the equivalent circuit exemplified in FIG. 2, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the first charge transfer unit 9 does not have to be so-called completely off, and the non-conductive state of the first charge transfer unit 9 also includes a state in which some sort of potential barrier has occurred as compared to a case where the first charge transfer unit 9 has completely been turned on.

For example, in the event that a MOS transistor is used as the first charge transfer unit 9, a specific configuration may be made by this MOS transistor having an embedded channel configuration. More generally speaking, this configuration is a configuration wherein there is a portion in an area deeper than the surface where the potential barrier for an electrode is lower than the surface when the first charge transfer unit 9 is in a non-conductive state. In this case, a driving pulse to be supplied to the first charge transfer unit 9 may be a fixed value. That is to say, a fixed potential barrier may be employed instead of a configuration wherein two states of a conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned.

Further, when the first charge transfer unit 9 is in a non-conductive state, a hole is accumulated on the surface. Also, in the event that the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed, and accordingly, a configuration wherein no electrons are moved from the photoelectric conversion unit 8 to the first holding unit 10 may be obtained. As for a specific configuration, when the first charge transfer unit 9 and fourth charge transfer unit 7 are in a non-conductive state, a potential barrier to be formed below the first control gate is higher than a potential barrier to be formed below the fourth control gate. Note that, when the first charge transfer unit 9 and fourth charge transfer unit 7 are in a non-conductive state, electrons may be accumulated at the photoelectric conversion unit 8.

According to such a configuration, the majority of electrons generated by photoelectric conversion at the time of light being input to the photoelectric conversion unit 8 are accumulated in the photoelectric conversion unit 8 during the exposure period. Accordingly, with all of the pixels disposed in the image pickup area 2, charge accumulated in the photoelectric conversion units 8 is simultaneously transferred to the first holding unit 10, whereby the accumulation periods of all of the pixels may be aligned.

Specific configurations of pixels of some embodiments will be described with reference to FIGS. 3, 4A, and 4B. Members having the same names as members described in FIG. 2 have the same function, and accordingly, detailed description will be omitted.

FIG. 3 illustrates a top view of image pickup apparatuses according to some embodiments. Here, though six pixels in a total of two rows by three columns are illustrated, an image pickup area may be configured by an even greater of pixels being disposed.

Pixels 100 are configured of an N-type semiconductor region 101 making up the photoelectric conversion unit 8, a control electrode 102 making up the first charge transfer unit 9, an N-type semiconductor region 103 making up the first holding unit 10, a control electrode 104 making up the second charge transfer unit 11, an FD area 107, a reset transistor 108, an amplifier transistor 109, and a selecting transistor 110. Further, the pixels 100 include a control electrode 111 and an OFD area 112 which make up the fourth charge transfer unit 7. The FD area 107 is configured to include an N-type semiconductor region where electrons held at the first holding unit 10 are transferred. The OFD area 112 is configured to include an N-type semiconductor region where electrons from the photoelectric conversion unit 8 are transferred.

Note that the OFD area 112 may be shared with the source or drain of the reset transistor, selecting transistor, or amplifier transistor. That is to say, the charge of the first holding unit 10 is transferred to the source or drain of one of the reset transistor, selecting transistor, and amplifier transistor. According to such a configuration, the area of the photoelectric conversion unit 8 may be increased, and accordingly, sensitivity may be improved.

Also, a P-type semiconductor region 115 is disposed below the N-type semiconductor region 103. The N-type semiconductor region 103 and P-type semiconductor region 115 make up a PN junction. Note that, with some embodiments, the P-type semiconductor region 115 may be omitted.

Features of some embodiments are in that a portion of the N-type semiconductor region 103 is disposed between the P-type semiconductor region 114 and the control electrode 102, and also, a portion of the N-type semiconductor region 103 is disposed between the P-type semiconductor region 114 and the control electrode 104. Preferably, as illustrated in FIG. 3, the N-type semiconductor region 103 surrounds the P-type semiconductor region 114 as viewed at a certain planar surface.

Here, that the P-type semiconductor region 114 is surrounded with the N-type semiconductor region 103 is that with a planar surface, projection of the P-type semiconductor region 114 as to this planar surface is surrounded with projection of the N-type semiconductor region 103 as to this planar surface. Here, the planar surface may be a surface including at least a portion of the interface 300 between the semiconductor substrate 300*a* in the first holding unit 10 and the insulating film 300*b* disposed thereon. For example, the top face view in FIG. 3 is a diagram illustrating the projection of the N-type semiconductor region 103 and the projection of the P-type semiconductor region 114 at the same planar surface.

With another point of view, the P-type semiconductor region 114 is surrounded with the N-type semiconductor region 103 at a surface having depth where the P-type semiconductor region 114 is disposed, in parallel with the interface 300 between the semiconductor substrate 300a and the insulating film 300b disposed thereon. For example, an arrangement may be made wherein, with first depth, the P-type semiconductor region 114 is surrounded with an N-type semiconductor region, and with second depth deeper than the first depth, the P-type semiconductor region 114 is not surrounded with an N-type semiconductor region.

FIGS. 4A and 4B illustrate schematic views of a cross-sectional configuration along the line IV-IV in FIG. 3. Members having the same function in FIG. 3 will be denoted with the same reference numerals, and detailed description will be omitted. As some embodiments, two cross-sectional configurations in FIGS. 4A and 4B are illustrated. FIGS. 4A and 4B are the same except that the configuration of the P-type semiconductor region 114 differs.

The image pickup apparatuses according to some embodiments include a semiconductor substrate 300a and an insulating film 300b disposed thereon. The semiconductor substrate 300a is silicon, for example. The semiconductor substrate 300a may include a semiconductor region formed with epitaxial growth. The insulating film 300b is a silicon oxide film, for example. A semiconductor region is formed within the semiconductor substrate 300a. Also, a control electrode is disposed on the semiconductor substrate 300a via the insulating film 300b.

An N-type semiconductor region 301 is disposed in the semiconductor substrate 300a. A P-type semiconductor region 302 is disposed on the N-type semiconductor region 301. The N-type semiconductor region 101 is disposed so as to make up a PN junction with the P-type semiconductor region 302. A P-type semiconductor region 303 is disposed on the surface side of the N-type semiconductor region 101, i.e., a side close to the insulating film 300b. A so-called embedded-type photodiode is made up of the P-type semiconductor region 302, N-type semiconductor region 101, and P-type semiconductor region 303.

Electrons generated at the photoelectric conversion unit 8 move in a first channel 304, and reach the N-type semiconductor region 103 which makes up the first holding unit 10. The electrons held at the N-type semiconductor region 103 move in a second channel 305, and reach an N-type semiconductor region 107 which makes up the FD area. Also, electrons generated at the photoelectric conversion unit 8 may be discharged to the OFD area 112 via the control electrode 111.

The control electrode 102 is disposed on the upper portion of the first channel 304 via the insulating film 300b. With some embodiments, the control electrode 102 includes a portion 102a disposed on the N-type semiconductor region 103. The control electrode 102 is shared by the first charge transfer unit 9 and first holding unit 10. That is to say, potential between the photoelectric conversion unit 8 and the first holding unit 10 is controlled by voltage to be applied to the control electrode 102. The first charge transfer unit 9 is configured to include the first channel 304 and a portion of the control electrode 102 disposed on the first channel 304 via the insulating film.

The first holding unit 10 includes the N-type semiconductor region 103 and the P-type semiconductor region 115 which makes up a PN junction with the N-type semiconductor region 103. Electrons are accumulated by the N-type semiconductor region 103 making up PN junction capacitance. Further, the first holding unit 10 is configured to include a portion 102a of the control electrode 102 disposed on the N-type semiconductor region 103 via the insulating film. An inversion layer may be formed on the interface 300 side of the N-type semiconductor region 103 by voltage to be applied to the control electrode 102. Thus, mixing of dark current into the first holding unit 10 may be reduced.

The control electrode 104 is disposed on the second channel 305 via the insulating film 300b. The second charge transfer unit 11 is configured to include the second channel 305 and the control electrode 104 disposed on the second channel 305 via the insulating film.

A plug 307 is connected to the FD area 107 and OFD area 112. The FD area 107 is connected to the gate electrode of the amplifier transistor via the plug 307. The OFD area 112 is connected to a wiring 16 which is not illustrated, via the plug 307.

Also, the P-type semiconductor region 115 is disposed below the N-type semiconductor region 103. The P-type semiconductor region 115 may be disposed below a portion of the N-type semiconductor region 103, or may be disposed below the whole of the N-type semiconductor region 103. The N-type semiconductor region 103 and P-type semiconductor region 115 make up a PN junction. The impurity concentration of the P-type semiconductor region 115 is higher than the impurity concentration of the P-type semiconductor region disposed below the P-type semiconductor region 115. For example, with some embodiments, the impurity concentration of the P-type semiconductor region 115 is higher than the impurity concentration of the P-type semiconductor region 302. According to such a configuration, extension of a depletion layer from the N-type semiconductor region 103 may be reduced, and accordingly, charge may be transferred from the first holding unit 10 with low voltage.

Note that the P-type semiconductor region 115 may be omitted. With an example of the P-type semiconductor region 115 being omitted, the P-type semiconductor region 302 disposed below the N-type semiconductor region 103 may have an impurity distribution where the impurity concentration becomes higher the deeper the depth is, or an even impurity distribution.

With some embodiments, the P-type semiconductor region 114 is disposed below the N-type semiconductor region 103. That is to say, a portion of the N-type semiconductor region 103 which makes up the first holding unit 10 is disposed between the P-type semiconductor region 114 and the interface 300. The interface 300 is a plane where the semiconductor substrate 300a and insulating film 300b are in contact.

As illustrated in FIGS. 4A and 4B, with a plane including line B-B' parallel to the interface 300, a portion of the N-type semiconductor region 103 is disposed between the P-type semiconductor region 114 and the first charge transfer unit 9. Also, a portion of the N-type semiconductor region 103 is disposed between the P-type semiconductor region 114 and the second charge transfer unit 11. With some embodiments, with the plane including line B-B' parallel to the interface 300, the P-type semiconductor region 114 is surrounded with the N-type semiconductor region 103. That is to say, in the depth-wise direction of the drawing, the N-type semiconductor region 103 is disposed adjacent to the P-type semiconductor region 114, and at the close side thereof, the N-type semiconductor region 103 is disposed adjacent to the P-type semiconductor region 114. In this manner, with the depth illustrated in the line B-B', the P-type semiconductor region 114 may be surrounded with the N-type semiconductor region 103.

With the example illustrated in FIG. 4A, a portion disposed in a deep position of the semiconductor substrate 300a of the P-type semiconductor region 114 is not surrounded with the N-type semiconductor region 103. That is to say, the P-type semiconductor region 114 extends deeper than the lower end of the N-type semiconductor region 103. The lower end of the N-type semiconductor region 103 is a PN junction surface with the P-type semiconductor region 115, for example.

With the example illustrated in FIG. 4B, distance from the interface 300 to the lower end of the P-type semiconductor region 114 is shorter than distance from the interface 300 to the lower end of the N-type semiconductor region 103. That is to say, a portion of the N-type semiconductor region 103 is disposed below the P-type semiconductor region 114. Note that the lower end of the P-type semiconductor region 114 is a PN junction surface with the N-type semiconductor region 103, for example. The lower end of the N-type semiconductor region 103 is the PN junction surface with the P-type semiconductor region 115, for example.

Next, the impurity concentration of each of the semiconductor regions will be described. Note that the impurity concentration of each of the semiconductor regions is not restricted to this, and may be changed as appropriate. A P-type semiconductor region surrounded with the N-type semiconductor region 103 is disposed, whereby transfer of charge may be performed with low voltage.

The impurity concentration of the P-type semiconductor region 114 may be higher than that of the P-type semiconductor region 302. Alternatively, the impurity concentration of the P-type semiconductor region 114 may be higher than that of the N-type semiconductor region 103. The higher the impurity concentration of the P-type semiconductor region 114 is, the smaller voltage to be used for transfer of charge from the first holding unit 10 may be reduced. Note that, with some embodiments, the impurity concentration of the P-type semiconductor region 114 may be a concentration almost approximate to an intrinsic semiconductor.

Note that, as with a later-described second embodiment, in the event that the second semiconductor region is the same conductive type as the first semiconductor region which makes up the holding unit, the lower the impurity concentration of the second semiconductor region is, the smaller voltage to be used for transfer of charge from the first holding unit 10 may be reduced.

On the other hand, the impurity concentration of the P-type semiconductor region 114 may be lower than that of the P-type semiconductor region 303. Alternatively, the impurity concentration of the P-type semiconductor region 114 may be lower than the impurity concentration of the P-type semiconductor region which makes up a potential barrier which is not illustrated. In the event that the impurity concentration of the P-type semiconductor region 114 is high, the charge retention capacitance of the holding unit may be reduced. Therefore, according to such a configuration, deterioration in the charge retention capacitance of the holding unit may be suppressed.

It is desirable that the impurity concentration of the N-type semiconductor region 103 is higher than that of the N-type semiconductor region 101. Thus, the charge retention capacitance of the first holding unit 10 may be increased. Alternatively, the sensitivity of the photoelectric conversion unit 8 may be improved.

It is desirable that the impurity concentration of the P-type semiconductor region 303 is higher than that of the P-type semiconductor region 302. Alternatively, it is desirable that the impurity concentration of the P-type semiconductor region 303 is higher than that of the N-type semiconductor region 101. According to such a configuration, noise due to dark current at the photoelectric conversion unit 8 may be reduced.

A light shielding member 113 is disposed above the first holding unit 10. The first holding unit 10 is shielded by the light shielding member 113. Preferably, the light shielding member 113 shields the entire light to be input to the first holding unit 10. The end portion on the photoelectric conversion unit 8 side of the light shielding member 113 is closer to the photoelectric conversion unit 8 than the end portion on the photoelectric conversion unit 8 side of the first holding unit 10. The end portion on the FD area 107 side of the light shielding member 113 is closer to the FD area 107 than the end portion on the FD area 107 side of the first holding unit 10.

However, the configuration is not restricted to this, and as with some embodiments, an arrangement may be made wherein in the event that the control electrode 102 is shared by the first charge transfer unit 9 and first holding unit 10, at least the end portion of the photoelectric conversion unit 8 side of the control electrode 102 is not covered. According to such a configuration, influence of the light shielding member 113 as to the photoelectric conversion unit 8 is reduced, and accordingly, the sensitivity of the photoelectric conversion unit 8 may be improved. Further, influence as to a pixel position of light to be input with a certain angle against the vertical direction may be reduced. Alternatively, electrons subjected to photoelectric conversion at the N-type semiconductor region 103 or P-type semiconductor region 302 which makes up the first holding unit 10 may be accumulated at the N-type semiconductor region 103. Thus, the sensitivity of pixels may be improved.

Note that the entirety of the first holding unit 10 does not have to be covered with the light shielding member 113. For example, in order to dispose a conductor for supplying a driving pulse to the control electrode 102 which makes up the first holding unit 10, an opening may be provided to the light shielding member 113.

Metal making up a wiring layer may be employed as the light shielding member 113. Alternatively, there may be employed metal making up a plug for electrically connecting different wiring layers or between a wiring and a semiconductor region. It is desirable to dispose the light shielding member 113 in a place as close as possible to the semiconductor substrate 300a. It is desirable to employ metal making up a wiring layer disposed closest to the semiconductor substrate 300a of the multiple wiring layers, or a metal plug which electrically connects the wiring layer of the lowest layer and a semiconductor region. Alternatively, a metal specifically for the light shielding member 113 may be disposed between the wiring layer of the lowest layer and the semiconductor substrate.

FIG. 4 illustrates the light shielding member 113 alone disposed on the first holding unit 10. However, a light shielding member may be disposed on a transistor making up another pixel circuit. Alternatively, a transistor making up another pixel circuit may be shielded by wiring. Transistors making up another pixel circuit include the above-mentioned rest transistor, selecting transistor, amplifier transistor, and so forth.

A manufacturing method according to some embodiments will be described with reference to FIGS. 5A to 5D. FIGS. 5A to 5D are schematic views illustrating a cross section along the line V-V in FIG. 3.

As illustrated in FIG. 5A, the N-type semiconductor region 301 and P-type semiconductor region 302 are formed on the semiconductor substrate 300a. A heretofore known semiconductor process may be employed for formation of each of the semiconductor regions. Each of the semiconductor regions may be formed by introducing an impurity into the semiconductor substrate 300a by, for example, ion implantation or thermal diffusion. In the event of forming an N-type semiconductor region, arsenic or phosphorous is introduced. In the event of forming a P-type semiconductor region, boron is introduced. This is true for other semiconductor regions. Note that no impurity is introduced into the N-type semiconductor region 301, and a portion of the semiconductor substrate 300a may be the N-type semiconductor region 301 without change.

With a process illustrated in FIG. 5A, a P-type impurity is introduced into an area where the P-type semiconductor region 114 is disposed. The P-type semiconductor region 114 may be formed by the P-type impurity introduced in this process. The P-type semiconductor region 114 is formed by ion implantation using a mask 501. That is to say, the ends of the P-type semiconductor region 114 may be defined with the mask 501.

Next, as illustrated in FIG. 5B, an N-type impurity is introduced into an area where the N-type semiconductor region 103 is disposed. The N-type semiconductor region 103 may be formed by the N-type impurity introduced in this process. The N-type semiconductor region 103 is formed by ion implantation using a mask 502. That is to say, the ends of the N-type semiconductor region 103 may be defined with the mask 502.

A feature of the manufacturing method according to some embodiments is layout between a first opening 501a of the mask 501 for forming the P-type semiconductor region 114 and a second opening 502a of the mask 502 for forming the N-type semiconductor region 103. The first opening 501a and second opening 502a are each disposed in the masks so that the P-type semiconductor region 114 is surrounded with the N-type semiconductor region 103.

Thus, a portion of an area where an impurity is introduced at the time of forming the N-type semiconductor region 103, and a portion of an area where an impurity is introduced at the time of forming the P-type semiconductor region 114 may be overlapped. That is to say, an N-type impurity for forming the N-type semiconductor region 103, and a P-type impurity for forming the P-type semiconductor region 114 may be introduced into the same area 114a. As for another point of view, the opposite conductive type (P-type) impurity is introduced into a portion (area 114a) of an area where an N-type impurity is introduced for forming the N-type semiconductor region 103. Therefore, the impurity concentration of this portion (area 114a) decreases. Alternatively, this portion becomes a P-type semiconductor region. With some embodiments, description will be made regarding an example wherein the area 114a is the P-type.

In general, the conductive type of a semiconductor region is determined with a magnitude relation between the amount (dose) of a P-type impurity and the amount (dose) of a P-type impurity introduced thereinto. In the event that the dose of the N-type impurity is greater than the dose of the P-type impurity, the conductive type becomes the N-type. In the event that the dose of the P-type impurity is greater than the dose of the N-type impurity, the conductive type becomes the P-type.

In this manner, a second semiconductor region is formed by an impurity of which the conductive type is the opposite of the first semiconductor region being introduced into a portion of an area where an impurity is introduced at the time of forming a first semiconductor region which makes up the holding unit. According to such a configuration, a configuration of the holding unit whereby charge may be transferred with low voltage is obtained.

Note that multiple portions having different impurity concentration may be included in the P-type semiconductor region 114. This is because of areas where the P-type impurity has been introduced in FIG. 5A, a portion where the N-type impurity has been introduced in the subsequent process in FIG. 5B has lower impurity concentration as compared to the others.

Also, in FIGS. 5A to 5D, an example is illustrated wherein the P-type semiconductor region 114 is formed prior to the N-type semiconductor region 103. However, the disclosure is not restricted to this order. The N-type semiconductor region 103 may be formed prior to the P-type semiconductor region 114. Alternatively, both may be formed at the same time.

With a process in FIG. 5B, the P-type semiconductor region 115 may be formed. At this time, a P-type impurity for forming the P-type semiconductor region 115 is introduced into the semiconductor substrate employing the mask 502 used at the time of forming the N-type semiconductor region 103.

In the event of forming the P-type semiconductor region 115 by ion implantation, an impurity distribution of the P-type semiconductor region 115 has a peak Rp1 at certain depth. In the event of forming the P-type semiconductor region 114 by ion implantation, it is desirable that a peak Rp2 of an impurity distribution of the P-type semiconductor region 114 is disposed in a position closer to the interface 300 than the peak Rp1.

Next, as illustrated in FIG. 5C, the N-type semiconductor regions 101, 107, and 112, P-type semiconductor region 303, and control electrodes 102, 104, and 111 are formed. The control electrodes are formed with polysilicon, for example. The order to form these members is not restricted to any particular order. For example, the N-type semiconductor regions 101, 107, and 112 and P-type semiconductor region 303 may be formed by ion implantation with the control electrodes as a mask by forming the control electrodes first. According to such a method, overlapping precision between the semiconductor regions may be improved.

Thereafter, as illustrated in FIG. 5D, the light shielding member 113 and plug 307 are formed. Note that the light shielding member 113 and plug 307 may be configured of the same material.

The manufacturing method according to some embodiments has been described in FIGS. 5A to 5D with the cross-sectional configuration illustrated in FIG. 4A. In the event of forming the cross-sectional configuration illustrated in FIG. 4B, the manufacturing method in FIGS. 5A to 5D is also employed.

Next, a driving method according to some embodiments will be described. FIG. 6 illustrates a driving pulse diagram of the image pickup apparatus according to some embodiments. This is a pulse diagram illustrating a case of performing global electronic shutter operation wherein exposure periods agree regarding all of the pixels disposed in the image pickup area 2. The numbers in parentheses indicate the number of rows, and in the present drawing, driving pulses to be supplied to the pixels in the first and second rows are illustrated. PSEL indicates a driving pulse to be supplied to the gate of the selecting transistor. PRES indicates a driving pulse to be supplied to the gate of the reset transistor. PTX1 indicates a driving pulse to be supplied to the first control gate. PTX2 indicates a driving pulse to be supplied to the second control gate. PTX4 indicates a driving pulse to be supplied to the fourth control gate. PTS indicates a driving pulse for performing sample hold of a light signal using, for example, the memory unit disposed in the column circuit. PTN indicates a driving pulse for performing sample hold of a noise signal using, for example, the memory unit disposed in the column circuits. All of the driving pulses are in a high level at the time of a conductive state.

At point-in-time t1 and theretofore, the PRES and PTX4 in all of the rows in the image pickup area 2 are in a high level. Here, the other pulses illustrated in FIG. 6 are in a low level.

Thus, electrons generated at the photoelectric conversion unit 8 are discharged to the OFD area.

At the point-in-time t1, in a state in which the PRES and PTX4 maintain a high level, with all of the pixels disposed in the image pickup area 2, the PTX1 and PTX2 make the transition from a low level to a high level. Thus, the photoelectric conversion unit 8 and first holding unit 10 are reset.

At point-in-time t2, the PTX1, PTX2, and PTX4 in all of the rows in the image pickup area 2 make the transition from a high level to a low level. According to this operation, exposure periods in all of the pixels disposed in the image pickup area 2 are started. During exposure periods, of electrons generated at the photoelectric conversion unit 8, a predetermined amount of electrons move to the first holding unit 10.

After elapsing of a predetermined period following the point-in-time t2, at point-in-time t3 the PTX1 in all of the rows in the image pickup area 2 makes the transition from a low level to a high level, at point-in-time t4 the PTX1 in all of the rows in the image pickup area 2 makes the transition from a high level to a low level. According to this operation, the electrons remaining in the photoelectric conversion unit 8 are transferred to the first holding unit 10. According to this operation, the exposure periods are ended.

At point-in-time t5, the PTX4 in all of the rows disposed in the image pickup apparatus make the transition from a low level to a high level. According to this operation, the height of a potential barrier between the photoelectric conversion unit 8 and OFD area 112 becomes lower than the height of a potential barrier between the photoelectric conversion unit 8 and the first holding unit 10. Thus, electrons generated at the photoelectric conversion unit 8 do not move to the first holding unit 10 but move to the OFD area 112.

At point-in-time t6, the PSEL(1) makes the transition from a low level to a high level. According to this operation, the signals of the pixels at the first row is placed in a state enabled to be output to the vertical signal line 20. Further, at the point-in-time t6, the PRES(1) makes the transition from a high level to a low level. Thus, the reset operations of the input nodes 14 of the amplifier elements 15 are completed.

At point-in-time t7, the PTN makes the transition from a low level to a high level, and point-in-time t8 the PTN makes the transition from a high level to a low level. According to this operation, a noise signal is held at, for example, the memory unit for noise signals disposed in the column circuit.

At point-in-time t9, the PTX2(1) makes the transition from a low level to a high level, and at point-in-time t10 the PTX2(1) makes the transition from a high level to a low level. According to this operation, electrons held at the first holding units 10 of the pixels at the first row are transferred to the input nodes 14 of the amplifier elements 15.

At point-in-time t11, the PTS makes the transition from a low level to a high level, and at point-in-time t12 the PTS makes the transition from a high level to a low level. According to this operation, a light signal on which a noise signal is superimposed is held at, for example, the memory unit for light signals disposed in the column circuit.

At point-in-time t13, the PSEL(1) makes the transition from a high level to a low level. According to this operation, the readout periods of the signals of the pixels at the first row are ended. The readout periods of the pixels at the first row are thus a period from the point-in-time t6 to the point-in-time t13. Further, at the point-in-time t13, the PRES(1) makes the transition from a low level to a high level. Thus, reset for the input nodes 14 of the amplifier elements 15 of the pixels of the first row is started.

After this, with a period from point-in-time t14 to point-in-time t21, readout of the signals of the pixels at the second row are performed. This operation is the same operation as the first row, and accordingly, detailed description will be omitted. The operation at each point-in-time from the point-in-time t14 to the point-in-time t21 is the same as the operation at each point-in-time from the point-in-time t6 to the point-in-time t13 except that objects for driving pulses to be set to a high level belong to the second row.

According to such an operation, the exposure periods may be equalized regarding all of the pixels disposed in the image pickup area 2. With this operation, up to transfer to the first holding unit 10 is performed at the entire image pickup surface at the same time. The specific point-in-time thereof is the point-in-time t4. Thereafter, readout of all of the rows in the image pickup area 2 is performed by repeating the readout operation.

FIGS. 7A to 7D and 8A to 8D illustrate a relation of height of a potential barrier at each point-in-time and period in the driving pulse diagram illustrated in FIG. 6. FIGS. 7A to 7D and 8A to 8D illustrate the potentials of the OFD area 112, fourth charge transfer unit 7, photoelectric conversion unit 8, first charge transfer unit 9, first holding unit 10, second charge transfer unit 11, and input node 14 (FD area 107). The potential of a pixel according to some embodiments is illustrated with a solid line. Also, in FIGS. 7A to 7D, the potential of a pixel in a comparative example is illustrated with a dashed line. The comparative example has the same configuration as with some embodiments expect that the P-type semiconductor region 114 is not provided.

Note that, with the present Specification, the potential is the potential energy of signal charge. For example, in the event that signal charge is electrons, the higher the voltage applied to a control electrode is, the lower the potential of the semiconductor region below the control electrode becomes. This is because electrons have negative charge. At an area where voltage is high, the potential energy of electrons is low. On the other hand, in the event that signal charge is a hole, the higher the voltage applied to a control electrode is, the higher the potential of the semiconductor region below the control electrode becomes. This is because holes have positive charge. At an area where voltage is high, the potential energy of a hole is high. In FIGS. 7A to 7D and 8A to 8D, the lower portions in the drawings represent low potential for signal charge, and the upper portions in the drawings represent high potential for signal charge.

FIG. 7A is a diagram illustrating a potential state during a period from the point-in-time t1 to the point-in-time t2. As described in FIG. 6, with the period from the point-in-time t1 to the point-in-time t2, a pulse in a high level is supplied to all of the first charge transfer unit 9, second charge transfer unit 11, and fourth charge transfer unit 7. That is to say, potential barriers generated at all of the charge transfer units are in a low state. Electrons generated at the photoelectric conversion unit 8 are discharged to the OFD area 112 or the drain (not illustrated) of the reset transistor. It is desirable that there are no electrons in the photoelectric conversion unit 8 and first holding unit 10.

As for a preferable potential state as to electrons at this time, the photoelectric conversion unit 8 exhibits the highest potential. Further, as illustrated in the drawings, it is a preferable state in which potential sequentially decreases from the photoelectric conversion unit 8 to the input node 14 of the amplifier element 15. That is to say, the potential of the photoelectric conversion unit 8 may be higher than the potential of the first holding unit 10. The potential of the first holding unit 10 may be higher than the potential of the input node 14.

Figure 7C:
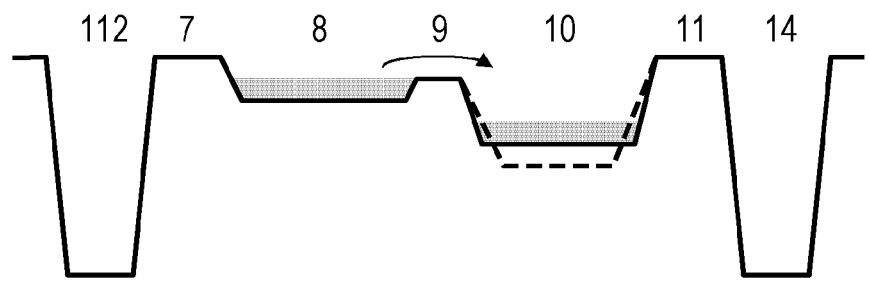

FIGS. 7B and 7C are diagrams illustrating a potential state of a period from the point-in-time t2 to the point-in-time t3, i.e., during the exposure period. The first charge transfer unit 9 is in a non-conductive state. Specifically, as compared to the case in FIG. 7A, the height of a potential barrier between the photoelectric conversion unit 8 and the first holding unit 10 is higher. Further, the fourth charge transfer unit 7 is in a non-conductive state. Specifically, as compared to the case in FIG. 7A, the height of a potential barrier between the photoelectric conversion unit 8 and the OFD area 112 is higher. Thus, in FIG. 7B, small amount of electrons is accumulated at the photoelectric conversion unit 8. Also, in the state in FIG. 7B, the height of a potential barrier to be generated at the first charge transfer unit 9 is lower than the height of a potential barrier to be generated at the fourth charge transfer unit 7.

The potential state in FIG. 7C is the same as with FIG. 7B, but the amount of light input to the photoelectric conversion unit 8 differs. In the event that a certain amount or more of electrons have been generated at the photoelectric conversion unit 8, the electrons cross over the potential barrier generated at the first charge transfer unit 9 and move to the first holding unit 10. That is to say, in the event of predetermined amount or more of light being input, the photoelectric conversion unit 8 and first holding unit 10 hold the electrons during the exposure period.

Figure 7D:
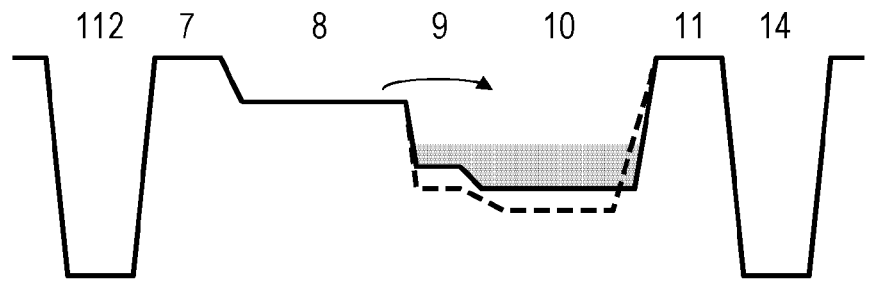

FIG. 7D is a diagram illustrating a potential state during a period from the point-in-time t3 to the point-in-time t4. The electrons accumulated at the photoelectric conversion unit 8 are transferred to the first holding unit 10. In order to improve transfer efficiency of the electrons from the photoelectric conversion unit 8, it is desirable that a potential barrier at a channel region of the first charge transfer unit 9 in a conductive state is lower than the potential of the photoelectric conversion unit 8. Further, it is desirable that the potential of the first holding unit 10 is lower than the potential of the photoelectric conversion unit 8. With some embodiments, the control electrode 102 is shared by the first charge transfer unit 9 and first holding unit 10, and accordingly, in the event of a driving pulse which causes the first charge transfer unit 9 to be a conductive state being supplied, the potential of the first holding unit 10 also becomes low.

FIG. 8A is a diagram illustrating a potential state during a period from the point-in-time t4 to the point-in-time t5. This illustrates a state in which the first charge transfer unit 9 is placed in a non-conductive state, and the second charge transfer unit 11 is in a state before entering the conductive state. The amount of electrons determined by the potential barrier generated at the first charge transfer unit 9 is accumulated in the first holding unit 10.

FIG. 8B is a diagram representing potential states of the pixels at the first row during a period from the point-in-time t5 to the point-in-time t9, and potential states of the pixels at the second row during a period from the point-in-time t5 to the point-in-time t17. The lengths of these periods differ for each pixel row. The fourth charge transfer unit 7 is in a conductive state, and accordingly, the potential barrier at the fourth charge transfer unit 7 becomes lower than the potential barrier at the first charge transfer unit 9. It is desirable that the potential barrier at the fourth charge transfer unit 7 is lower than the potential of the photoelectric conversion unit 8. According to such a potential state, electrons generated at the photoelectric conversion unit 8 may be moved to the OFD area 112 while the first holding unit 10 holds electrons.

FIG. 8C is a diagram representing potential states of the pixels at the first row during a period from the point-in-time t9 to the point-in-time t10, and potential states of the pixels at the second row during a period from the point-in-time t17 to the point-in-time t18. The second charge transfer unit 11 is placed in a conductive state, and the electrons held at the first holding unit 10 are transferred to the input node 14 of the amplifier element 15. In order to improve the transfer efficiency of electrons from the first holding unit 10, it is desirable that the height of the potential barrier at a channel region of the second charge transfer unit 11 in a conductive state is lower than the height of the potential of the first holding unit 10. Further, it is desirable that the height of the potential of the input node 14 of the amplifier element 15 is lower than the height of the potential of the first holding unit 10.

Here, with some embodiments, voltage that causes the potential of the second charge transfer unit 11 to become V1 is supplied to the control electrode 104 of the second charge transfer unit 11. This is voltage lower than voltage that causes the potential of the second charge transfer unit 11 to become V2. That is to say, as compared to the case of the comparative example, electrons held at the first holding unit 10 may be transferred to the input node 14 with low voltage. On the other hand, FIG. 9 illustrates potential of the comparative example at the same timing. In the comparative example, with the voltage that causes the potential of the second charge transfer unit 11 to become V1, a part of electrons held at the first holding unit 10 do not have to be transferred. That is to say, with the comparative example, high voltage may be employed due to transfer of charge.

Figure 8D:
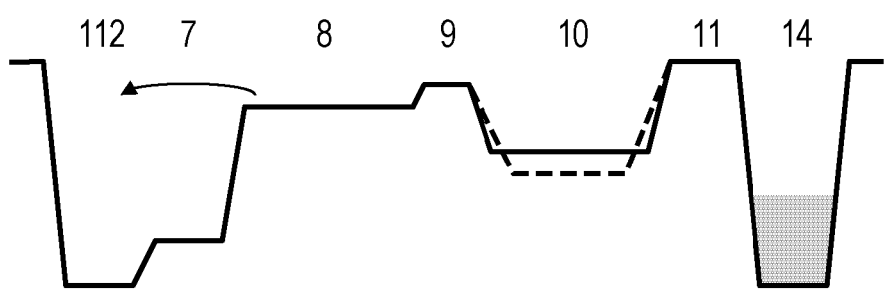

FIG. 8D is a diagram representing potential states of the pixels at the first row during a period from the point-in-time t10 to the point-in-time t13, and potential states of the pixels at the second row during a period from the point-in-time t18 to the point-in-time t21. This is a diagram illustrating a potential state after the second charge transfer unit 11 is placed in a non-conductive state. While light is input to the photoelectric conversion unit 8, electrons are discharged to the OFD area 112 by the fourth charge transfer unit 7. Also, electrons may be mixed into the first holding unit 10. However, the height of the potential barrier of the second charge transfer unit 11 is higher than the height of the potential barrier of the first charge transfer unit 9, which provides a configuration wherein charge is not readily mixed into the input node 14. The potentials of the pixels at the first row at the point-in-time t13 and thereafter, and the potentials of the pixels at the second row at the point-in-time t21 and thereafter may be in a state illustrated in FIG. 7A.

Advantages of some embodiments will be described. As illustrated in FIGS. 7A to 7D and 8A to 8D, the bottom of a potential distribution of the first holding unit 10 according to some embodiments extends in the transfer direction of charge as compared to the comparative example. Thus, the bottom of a potential distribution of the first holding unit 10 according to some embodiments comes closer to the transfer unit as compared to the comparative example. This is caused by the P-type semiconductor region 114 surrounded with the N-type semiconductor region 103 being disposed. In this manner, according to the configuration of some embodiments, a potential barrier is not readily formed on a path of charge from the photoelectric conversion unit to the input node of the amplifier element as compared to the comparative example. Accordingly, transfer of charge from the holding unit may be performed with low voltage.

Also, with some embodiments, the P-type semiconductor region 114 is disposed separately from the interface 300. According to such a configuration, the charge retention capacitance of the first holding unit 10 may be increased. Also, the N-type semiconductor region 103 is disposed below the P-type semiconductor region 114, whereby the charge retention capacitance of the first holding unit 10 may be increased.

Second Embodiment

Another embodiment of the image pickup apparatus will be described. The present embodiment differs from the first embodiment in that the N-type semiconductor region 103 which makes up the first holding unit 10 includes a first portion 103a, and a second portion 103b of which the impurity concentration is lower than that of the first portion 103a. The second portion 103b is surrounded with the first portion 103a. Also, the P-type semiconductor region 114 according to the first embodiment may be omitted. The other portions are all the same as with the first embodiment. Therefore, with the present embodiment, only points different from the first embodiment will be described, and description will be omitted regarding the other portions.

The overall block configuration of the image pickup apparatus according to the present embodiment is the same as with the first embodiment. Specifically, FIG. 1 is an overall block diagram of the image pickup apparatus according to the present embodiment.

An equivalent circuit of the image pickup apparatus according to the present embodiment is the same as with the first embodiment. Specifically, FIG. 2 illustrates an equivalent circuit of the image pickup apparatus according to the present embodiment.

A specific configuration of pixels according to some embodiments will be described with reference to FIGS. 10, 11A, and 11B. Portions having the same functions as with FIGS. 3, 4A, and 4B are denoted with the same reference numerals. The portions denoted with the same reference numerals as with FIGS. 3, 4A, and 4B are the same as with the first embodiment, and accordingly, detailed description will be omitted.

FIG. 10 illustrates a top view of the image pickup apparatus according to some embodiments. Here, though six pixels in a total of two rows by three columns are illustrated, an image pickup area may be configured by an even greater number of pixels being disposed.

With some embodiments, the N-type semiconductor region 103 includes a first portion 103a, and a second portion 103b of which the impurity concentration is lower than that of the first portion 103a. In FIG. 10, of the N-type semiconductor region 103, other than the second portion 103b is the first portion 103a. A feature of some embodiments is in that the first portion 103a is disposed between the second portion 103b and the control electrode 102, and also the first portion 103a is disposed between the second portion 103b and the control electrode 104. Preferably, as illustrated in FIG. 10, the first portion 103a surrounds the second portion 103b as viewed at a certain planar surface.

Here, that the second portion 103b is surrounded with the first portion 103a is that with a planar surface, projection of the second portion 103b as to this planar surface is surrounded with projection of the first portion 103a as to this planar surface. Here, the planar surface may be a surface including at least a portion of the interface 300 between the semiconductor substrate 300a in the first holding unit 10 and the insulating film 300b disposed thereon. For example, the top face view in FIG. 3 is a diagram illustrating the projection of the first portion 103a and the projection of the second portion 103b at the same planar surface. With another point of view, the second portion 103b is surrounded with the first portion 103a at a surface having depth where the second portion 103b is disposed, in parallel with the interface 300 between the semiconductor substrate 300a and the insulating film 300b disposed thereon.

FIGS. 11A and 11B illustrate schematic views of a cross-sectional configuration along the line XI-XI in FIG. 10. Examples of two cross-sectional configurations of FIGS. 11A and 11B are illustrated as some embodiments. FIGS. 11A and 11B are the same except that the placement of the second portion 103b differs.

With some embodiments, the N-type semiconductor region 103 includes the first portion 103a and second portion 103b. With a surface parallel to the interface 300, a portion of the first portion 103a is disposed between the second portion 102b and the first charge transfer unit 9. A portion of the first portion 103a is disposed between the second portion 102b and the second charge transfer unit 11. With some embodiments, the second portion 103b is surrounded with the first portion 103a at a surface parallel to the interface 300. That is to say, in the depth-wise direction of the drawing, the first portion 103a is disposed adjacent to the second portion 103b, and at the close side thereof, the first portion 103a is disposed adjacent to the second portion 103b.

The first portion 103a is disposed between the second portion 103b and the interface 300. Of the first portion 103a, the portion disposed between the second portion 103b and the interface 300 will be called a third portion for descriptive purposes. The impurity concentration of the second portion 103b is lower than the impurity concentration of the third portion.

With the example illustrated in FIG. 11A, a P-type semiconductor region 116 is disposed below the second portion 103b. The impurity concentration of the P-type semiconductor region 116 may be higher than the impurity concentration of the P-type semiconductor region 115.

With the example illustrated in FIG. 11A, the lower end of the first portion 103a and the lower end of the second portion 103b are disposed at the same depth. The lower end of the first portion 103a is, for example, a PN junction surface which the first portion 103a and P-type semiconductor region 115 make up. The lower end of the second portion 103b is, for example, a PN junction surface which the second portion 103b and P-type semiconductor region 116 make up.

With the example illustrated in FIG. 11B, the first portion 103a is disposed below the second portion 103b. Of the first portion 103a, the portion disposed below the second portion 103b will be called a fourth portion for descriptive purposes. The impurity concentration of the second portion 103b is lower than the impurity concentration of the fourth portion.

With some embodiments, the impurity concentration of the second portion 103b may be a concentration to the extent almost approximate to an intrinsic semiconductor.

A manufacturing method according to some embodiments will be described with reference to FIGS. 12A to 12D. FIGS. 12A to 12D are schematic views illustrating a cross section along the line XII-XII in FIG. 10.

Figure 12A:
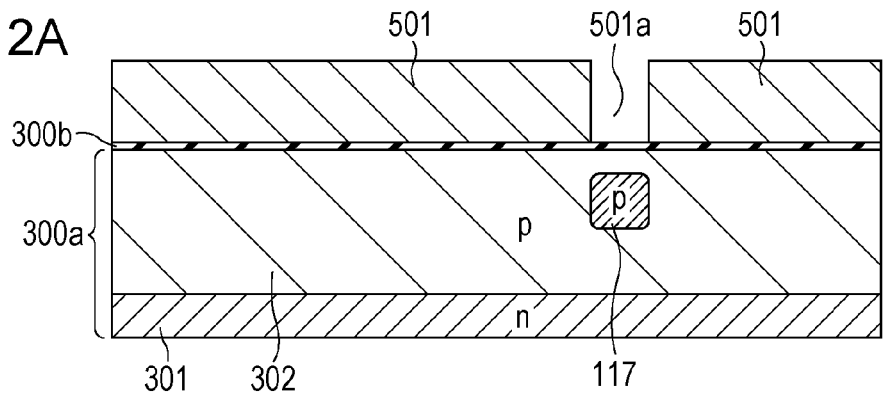
FIGS. 12A to 12D are diagrams illustrating a manufacturing method of an embodiment of the image pickup apparatus.

As illustrated in FIG. 12A, the N-type semiconductor region 301 and P-type semiconductor region 302 are formed on the semiconductor substrate 300a. A heretofore known semiconductor process may be employed for formation of each of the semiconductor regions. Each of the semiconductor regions may be formed by introducing an impurity into the semiconductor substrate 300a by, for example, ion implantation or thermal diffusion. In the event of forming an N-type semiconductor region, arsenic or phosphorous is introduced. In the event of forming a P-type semiconductor region, boron is introduced. This is true for other semiconductor regions. Note that no impurity is introduced into the N-type semiconductor region 301, and a portion of the semiconductor substrate 300a may be the N-type semiconductor region 301 without change.

With a process illustrated in FIG. 12A, a P-type impurity is introduced into the semiconductor region 300a. With this process, at least a P-type impurity is introduced into the area serving as the second portion 103b of the N-type semiconductor region 103. Also, the P-type semiconductor region 116 is formed with the P-type impurity introduced in this process. Also, the P-type semiconductor region 116 is formed with the P-type impurity introduced in this process. With this process, a P-type impurity is introduced into the semiconductor substrate 300a by ion implantation using the mask 501. That is to say, the ends of the second portion 103b are defined by the mask 501.

Figure 12B:
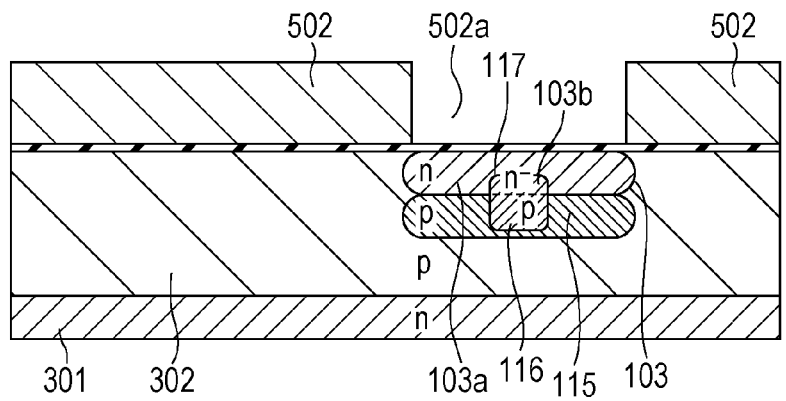

Next, as illustrated in FIG. 12B, an N-type impurity is introduced into the area where the N-type semiconductor region 103 is disposed. The N-type semiconductor region 103 is formed with the N-type impurity introduced in this process. The N-type semiconductor region 103 is formed by ion implantation using the mask 502. That is to say, the ends of the N-type semiconductor region 103 are defined by the mask 502.

A feature of the manufacturing method according to some embodiments is layout between a first opening 501a of the mask 501 and a second opening 502a of the mask 502. The first opening 501a and second opening 502a are each disposed in the masks so that the second portion 103b is surrounded with the first portion 103a at the N-type semiconductor region 103.

Thus, a portion of the area 103 where the N-type impurity is introduced in the process in FIG. 12B, and a portion of the area 117 where the P-type impurity is introduced in the process in FIG. 12A may be overlapped. That is to say, the N-type impurity and P-type impurity are introduced into the same area (second portion 103b). As for another point of view, the opposite conductive type (P-type) impurity is introduced into a portion (second portion 103b) of an area where the N-type impurity is introduced for forming the N-type semiconductor region 103. Therefore, the impurity concentration of a portion of the N-type semiconductor region 103, i.e., the second portion 103b decreases.

In general, the conductive type of a semiconductor region is determined with a magnitude relation between the amount (dose) of a P-type impurity and the amount (dose) of an N-type impurity introduced thereinto. In the event that the dose of the N-type impurity is greater than the dose of the P-type impurity, the conductive type becomes the N-type. In the event that the dose of the P-type impurity is greater than the dose of the N-type impurity, the conductive type becomes the P-type.

In this manner, a portion of which the impurity concentration is low is formed by an impurity of which the conductive type is the opposite of the first semiconductor region being introduced into a portion of an area where an impurity is introduced at the time of forming a first semiconductor region which makes up the holding unit. According to such a configuration, a configuration of the holding unit whereby charge may be transferred with low voltage is obtained.

Note that, in FIGS. 12A to 12D, an example is illustrated wherein the P-type impurity is introduced to the semiconductor substrate prior to the N-type impurity. However, the disclosure is not restricted to this order. Introduction of the N-type impurity for forming the first portion 103a and second portion 103b of the N-type semiconductor region 103 may be formed prior to the P-type impurity. Alternatively, the P-type impurity and N-type impurity may be introduced into the semiconductor substrate 300a at the same time.

With a process in FIG. 12B, the P-type semiconductor region 115 may be formed. At this time, an impurity for forming the P-type semiconductor region 115 is introduced into the semiconductor substrate employing the mask 502 used at the time of forming the N-type semiconductor region 103. Note that, with both of the process in FIG. 12A and the process in FIG. 12B, a P-type impurity is introduced into the area where the P-type semiconductor region 116 is disposed, and accordingly, the impurity concentration of the P-type semiconductor region 116 becomes higher than the impurity concentration of the P-type semiconductor region 115.

In the event of forming the P-type semiconductor region 115 by ion implantation, an impurity distribution of the P-type semiconductor region 115 has a peak Rp1 at certain depth. In the event of ion implantation being employed in the process in FIG. 12A, it is desirable that a peak Rp2 of an impurity distribution of the area 117 where the P-type impurity is introduced is disposed in a position closer to the interface 300 than the peak Rp1.

Figure 12C:
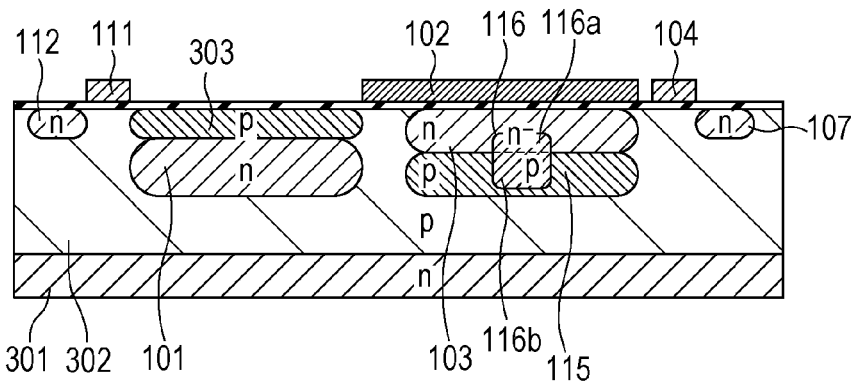

Next, as illustrated in FIG. 12C, the N-type semiconductor regions 101, 107, and 112, P-type semiconductor region 303, and control electrodes 102, 104, and 111 are formed. The control electrodes are formed with polysilicon, for example. The order in which these members are formed is not restricted to any particular order. For example, the N-type semiconductor regions 101, 107, and 112 and P-type semiconductor region 303 may be formed by ion implantation with the control electrodes as a mask by forming the control electrodes first. According to such a method, overlapping precision between the semiconductor regions may be improved.

Figure 12D:
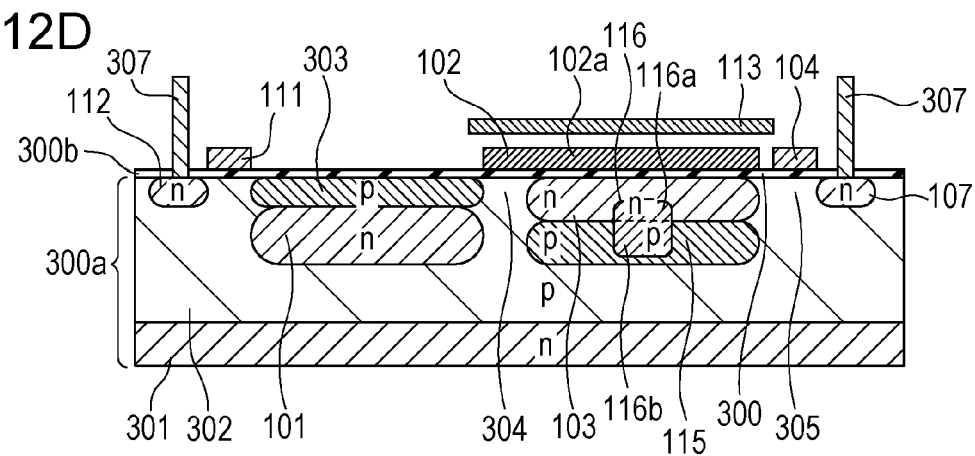

Thereafter, as illustrated in FIG. 12D, the light shielding member 113 and plug 307 are formed. Note that the light shielding member 113 and plug 307 may be configured of the same material.

The manufacturing method according to some embodiments has been described in FIGS. 12A to 12D with the cross-sectional configuration illustrated in FIG. 11A. In the event of forming the cross-sectional configuration illustrated in FIG. 11B, the manufacturing method in FIGS. 12A to 12D is also employed.

The driving method according to the present embodiment is the same as with the first embodiment. Specifically, FIG. 6 illustrates driving pulses of the image pickup apparatus according to the present embodiment.

Also, the height relation of the potential barrier according to the present embodiment is the same as with the first embodiment. Specifically, FIGS. 7A to 7D and 8A to 8D illustrate the height relation of the potential barrier according to the present embodiment.

Advantages of some embodiments will be described. As illustrated in FIGS. 7A to 7D and 8A to 8D, the bottom of a potential distribution of the first holding unit 10 according to some embodiments extends in the transfer direction of charge as compared to the comparative example. Thus, the bottom of a potential distribution of the first holding unit 10 according to some embodiments comes closer to the transfer unit as compared to the comparative example. This is caused by the P-type semiconductor region 114 surrounded with the N-type semiconductor region 103 being disposed. In this manner, according to the configuration of some embodiments, a potential barrier is not readily formed on a path of charge from the photoelectric conversion unit to the input node of the amplifier element as compared to the comparative example. Accordingly, transfer of charge from the holding unit may be performed with low voltage.

Also, with some embodiments, the third portion of the N-type semiconductor region 103 is disposed between the second portion of the N-type semiconductor region 103 and the interface 300. According to such a configuration, the charge retention capacitance of the first holding unit 10 may be increased. Also, the fourth portion of the N-type semiconductor region 103 is disposed below the second portion 103b, whereby the charge retention capacitance of the first holding unit 10 may be increased.

Third Embodiment

Another embodiment of the image pickup apparatus will be described. A feature of the present embodiment is layout in the planar surface of the P-type semiconductor region 114 according to the first embodiment. The other portions are all the same as with the first embodiment. Therefore, with some embodiments, only points different from the first embodiment will be described, and description will be omitted regarding the other portions.

The overall block configuration of the image pickup apparatus according to some embodiments is the same as with the first embodiment. Specifically, FIG. 1 is an overall block diagram of the image pickup apparatus according to some embodiments.

An equivalent circuit of the image pickup apparatus according to some embodiments is the same as with the first embodiment. Specifically, FIG. 2 illustrates an equivalent circuit of the image pickup apparatus according to some embodiments.

A specific configuration of pixels according to some embodiments will be described with reference to FIGS. 13 and 14. Portions having the same functions as with FIGS. 3, 4A, and 4B are denoted with the same reference numerals. The portions denoted with the same reference numerals as with FIGS. 3, 4A, and 4B are the same as with the first embodiment, and accordingly, detailed description will be omitted.

Figure 13:
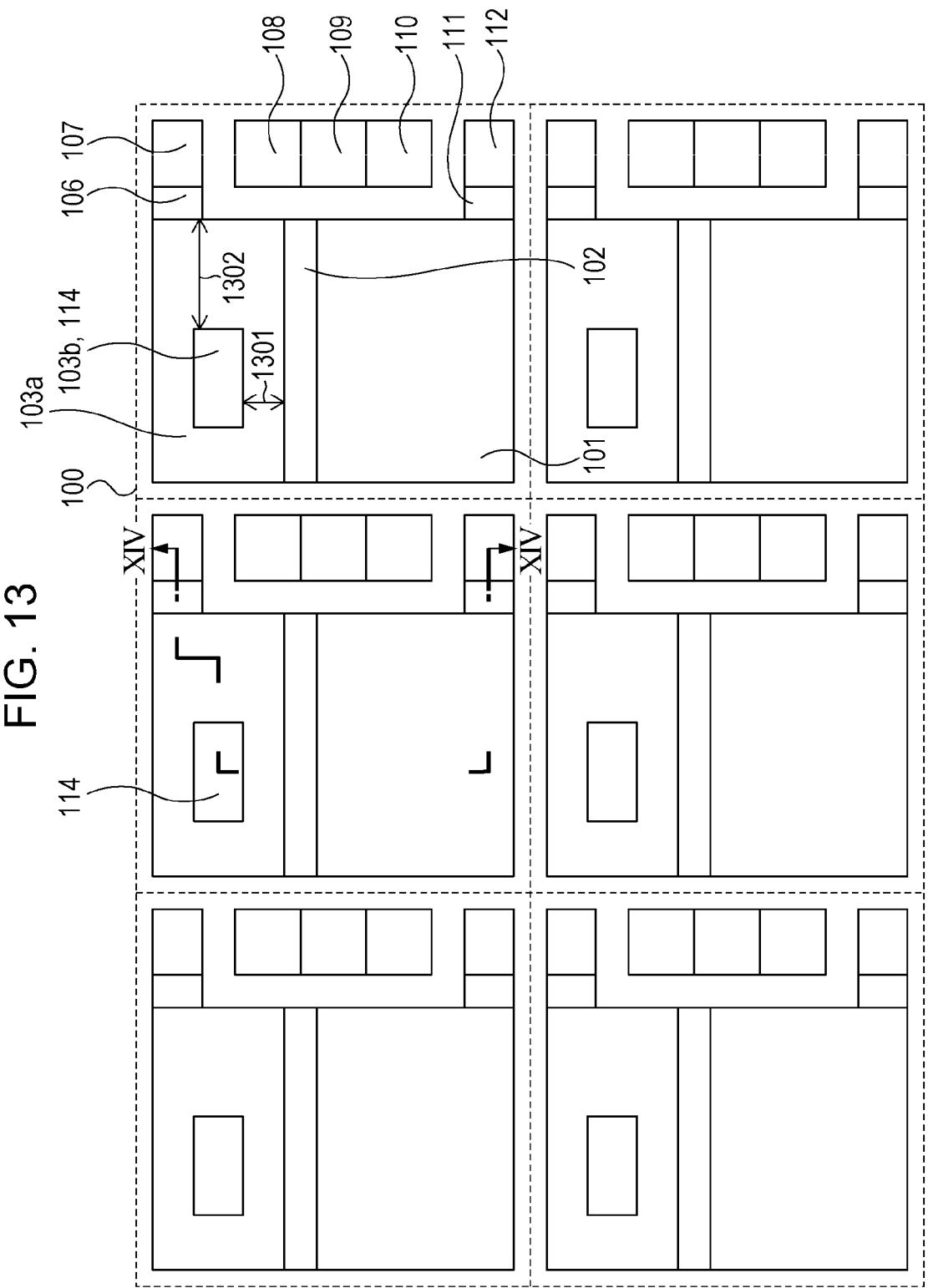
FIG. 13 is a schematic view illustrating the top face of an embodiment of an image pickup apparatus.

FIG. 13 illustrates a top view of the image pickup apparatus according to some embodiments. Here, though six pixels in a total of two rows by three columns are illustrated, an image pickup area may be configured by an even greater of pixels being disposed.

With some embodiments, second distance 1302 from the P-type semiconductor region 114 to the second control electrode 104 is longer than first distance 1301 from the control electrode 102 to the P-type semiconductor region 114.

Figure 14:
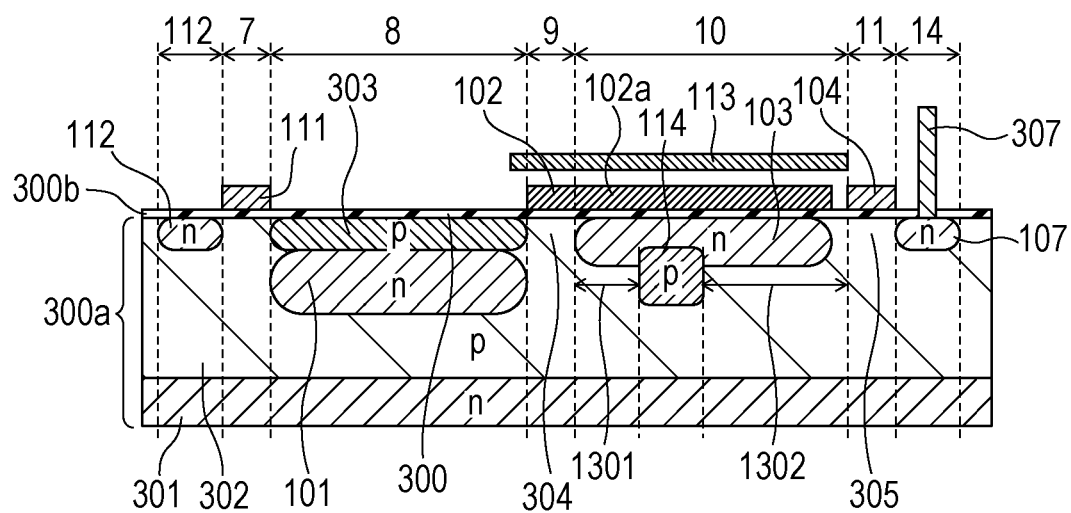
FIG. 14 is a schematic view of a cross section of an embodiment of the image pickup apparatus.

FIG. 14 illustrates a schematic view of a cross-sectional configuration along the line XIV-XIV in FIG. 13. As illustrated in FIG. 14, the first distance 1301 is distance in a direction parallel to the interface 300 between the semiconductor substrate 300a and the insulating film. With this cross section, distance from the end closest to the control electrode 102 of the P-type semiconductor region 114 to the control electrode 102 is the first distance 1301.

Also, the second distance 1302 is distance in a direction parallel to the interface 300 between the semiconductor substrate 300a and the insulating film. With this cross section, distance from the end closest to the control electrode 104 of the P-type semiconductor region 114 to the control electrode 104 is the second distance 1302.

In FIG. 14, the P-type semiconductor region 115 according to the first embodiment is omitted. However, with some embodiments, the same P-type semiconductor region 115 as with the first embodiment may be disposed. Also, in FIG. 14, the P-type semiconductor region 114 extends deeper than the lower end of the N-type semiconductor region 103. On the other hand, as illustrated in FIG. 4B, distance from the interface 300 to the lower end of the P-type semiconductor region 114 may be shorter than distance from the interface 300 to the lower end of the N-type semiconductor region 103.

With the above description, the P-type semiconductor region 114 has been described. However, as with the second embodiment, the N-type semiconductor region 103 may include the first portion 103a and the second portion 103b of which the impurity concentration is lower than that of the first portion 103a. In this case, the second distance 1302 from the second portion 103b to the second control electrode 104 is longer than the first distance 1301 from the control electrode 102 to the second portion 103b.

The same manufacturing method as with the first embodiment or second embodiment is employed as the manufacturing method according to the present embodiment. Specifically, with the present embodiment, in an example wherein the P-type semiconductor region 114 is included, the manufacturing method illustrated in FIGS. 5A to 5D is employed. With an example wherein the N-type semiconductor region 103 includes the first portion 103a and second portion 103b, the manufacturing method illustrated in FIGS. 12A to 12D is employed.

The driving method according to the present embodiment is the same as with the first embodiment. Specifically, FIG. 6 illustrates the driving pulses of the image pickup apparatus according to the present embodiment.

Figure 15A:
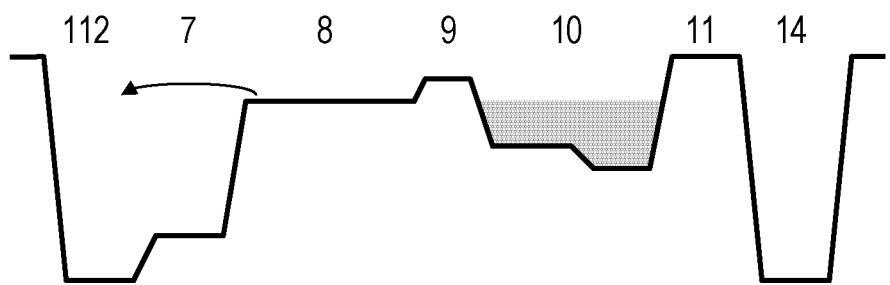
FIGS. 15A and 15B are schematic diagrams representing potential with an embodiment of the image pickup apparatus.
Figure 15B:
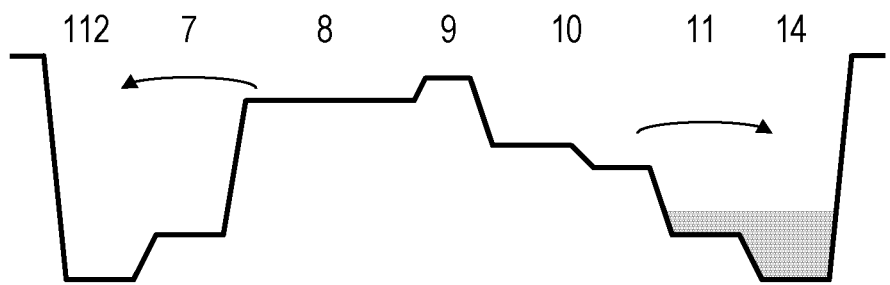

A potential distribution according to some embodiments will be described. FIGS. 15A and 15B illustrate a potential distribution according to some embodiments. FIG. 15A illustrates a potential distribution at the same timing as with FIG. 8B in the first embodiment. FIG. 15B illustrates a potential distribution at the same timing as with FIG. 8C in the first embodiment.

As illustrated in FIG. 15A, with the first holding unit 10, potential decreases from the first charge transfer unit 9 toward the second charge transfer unit 11. Such a potential distribution is obtained by the second distance 1302 being longer than the first distance 1301. According to such a configuration, as illustrated in FIG. 15B, when transferring charge from the first holding unit 10 to the input node 14, the charge may effectively be transferred.

Advantages of some embodiments will be described. With some embodiments, as with the first embodiment or second embodiment, transfer of charge from the holding unit may be performed with low voltage.

Also, with some embodiments, the second distance 1302 is longer than the first distance 1301. According to such a configuration, transfer efficiency of charge may be improved.

Note that, as with some embodiments, the following embodiments to which the layout of the P-type semiconductor region 114 or the layout of the second portion 103b of the N-type semiconductor region 103 has been applied are also encompassed in the embodiments.

Fourth Embodiment

Another embodiment of the image pickup apparatus will be described. With the present embodiment, the shape of the N-type semiconductor region 103 which makes up the first holding unit 10 differs from that in the first embodiment. Also, a portion of the P-type semiconductor region 302 is surrounded with the N-type semiconductor region 103. Further, a P-type semiconductor region 118 is disposed between the N-type semiconductor region 103 and the interface 300. The other portions are all the same as with the first embodiment. Therefore, with the present embodiment, only points different from the first embodiment will be described, and description will be omitted regarding the other portions.

The overall block configuration of the image pickup apparatus according to the present embodiment is the same as with the first embodiment. Specifically, FIG. 1 is an overall block diagram of the image pickup apparatus according to the present embodiment.

An equivalent circuit of the image pickup apparatus according to the present embodiment is the same as with the first embodiment. Specifically, FIG. 2 illustrates an equivalent circuit of the image pickup apparatus according to the present embodiment.

A specific configuration of pixels according to some embodiments will be described with reference to FIGS. 16 and 17. Portions having the same functions as with FIGS. 3, 4A, and 4B are denoted with the same reference numerals. The portions denoted with the same reference numerals as with FIGS. 3, 4A, and 4B are the same as with the first embodiment, and accordingly, detailed description will be omitted.

Figure 16:
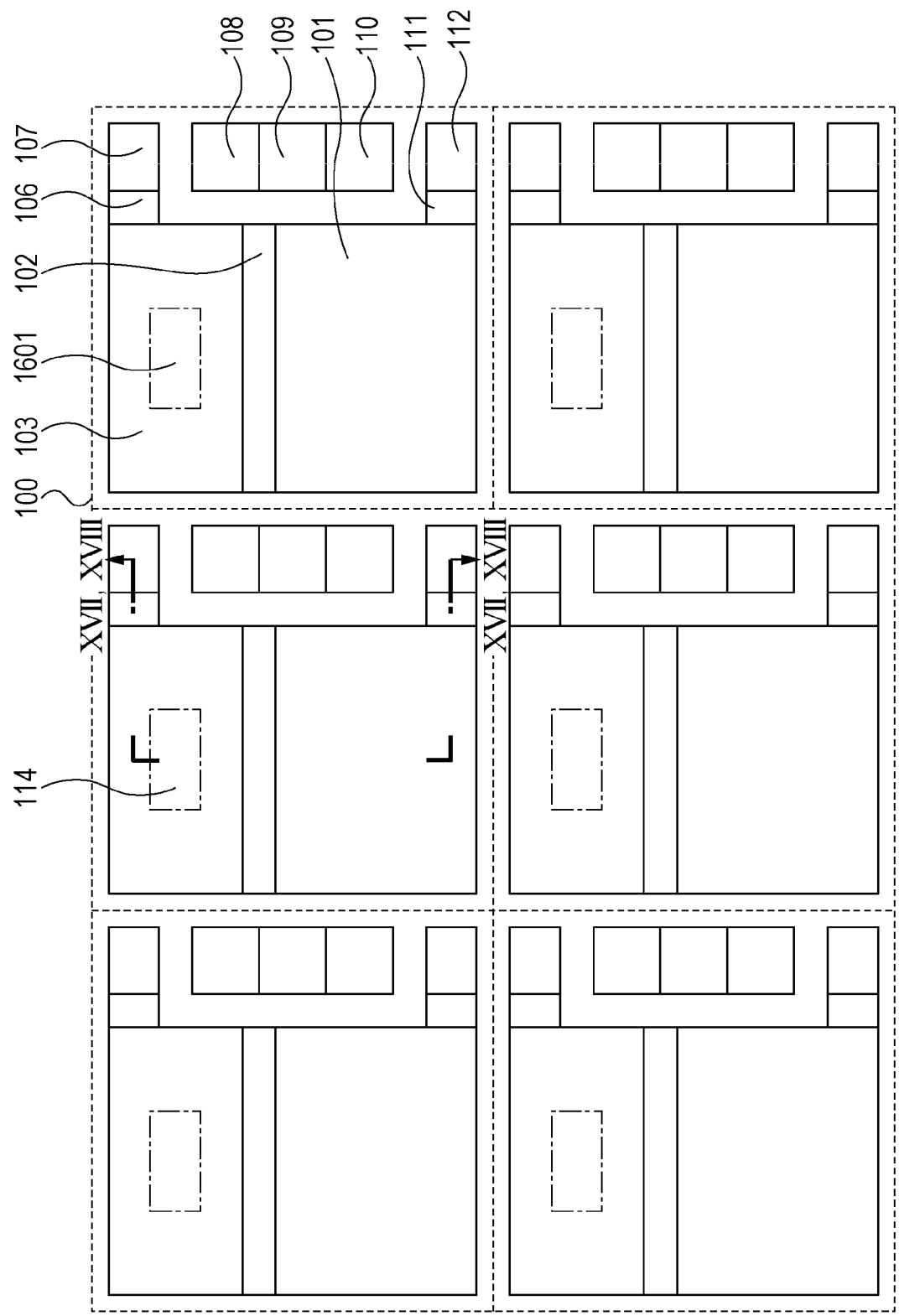
FIG. 16 is a schematic view illustrating the top face of an embodiment of an image pickup apparatus.

FIG. 16 illustrates a top view of the image pickup apparatus according to some embodiments. Here, though six pixels in a total of two rows by three columns are illustrated, an image pickup area may be configured by an even greater of pixels being disposed.

With some embodiments, the N-type semiconductor region 103 which makes up the first holding unit 10 has a shape such as surrounding the area 1601. A portion of the P-type semiconductor region 302 is disposed in the area 1601, for example.

With some embodiments, as with the fourth embodiment, the second distance from the area 1601 to the second control electrode 104 may be longer than the first distance from the control area 102 to the area 1601.

Figure 17:
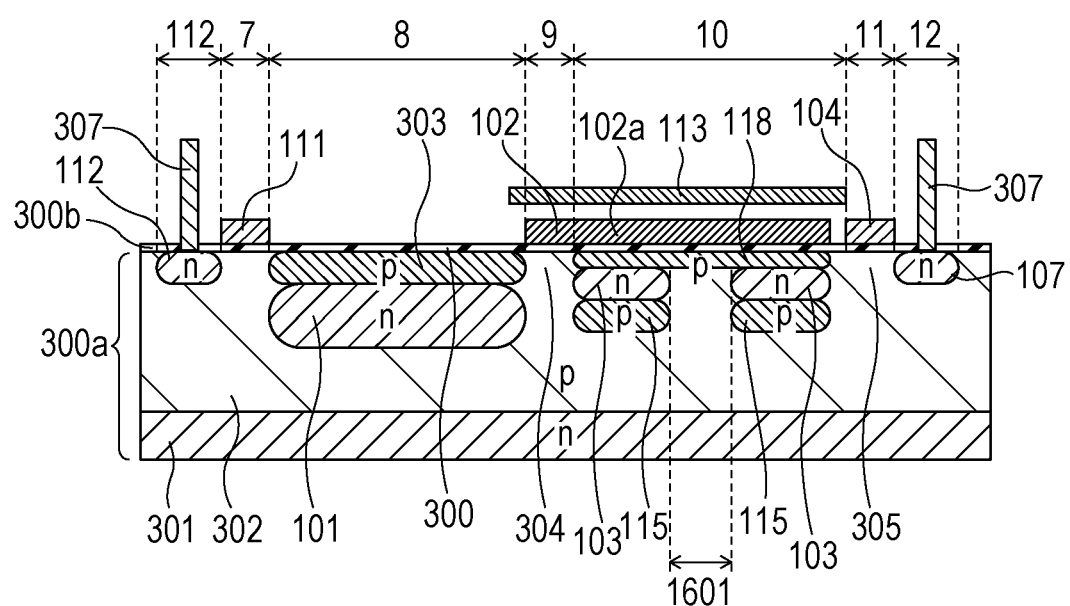
FIG. 17 is a schematic view of a cross section of an embodiment of the image pickup apparatus.

FIG. 17 illustrates a schematic view of a cross-sectional configuration along the line XVII-XVII in FIG. 16. As illustrated in FIG. 17, a portion of the P-type semiconductor region 302 is disposed in the area 1601. The N-type semiconductor region 103 is not disposed in the area 1601. With some embodiments, the N-type semiconductor region 103 surrounds the portion where the area 1601 is disposed of the P-type semiconductor region 302. Therefore, with the cross section in FIG. 17, the N-type semiconductor region 103 is illustrated by being divided into two areas. However, actually, the two N-type semiconductor regions 103 are connected at the near side or deep side in the drawing.

Also, with some embodiments, the P-type semiconductor region 115 is disposed below the N-type semiconductor region 103. A P-type semiconductor region may be disposed only below a portion of the N-type semiconductor region 103, or may be disposed below the entirety of the N-type semiconductor region 103.

Also, with some embodiments, the P-type semiconductor region 118 is disposed between the N-type semiconductor region 103 and the interface 300. A so-called embedded-type holding unit may be configured of the P-type semiconductor region 118 and N-type semiconductor region 103. The P-type semiconductor region 118 may reduce mixture of dark current generated at the interface 300 into the N-type semiconductor region 103. Further, an arrangement may be made wherein mixture of dark current into the N-type semiconductor region 103 is reduced by voltage to be applied to the control electrode 102.

In FIG. 17, the cross section where the P-type semiconductor region 302 alone is disposed in the area 1601 is illustrated. However, the same P-type semiconductor region 114 as with the first embodiment may be disposed in the area 1601.

In this manner, with some embodiments, as viewed with this cross section, a portion of the P-type semiconductor region 302 is disposed between a portion of the N-type semiconductor region 103 and another portion of the N-type semiconductor region 103. According to this portion of the P-type semiconductor region 302, transfer of charge from the first holding unit 10 may be performed with low voltage.

A manufacturing method according to some embodiments will be described with reference to FIGS. 18A to 18C. A point different from the manufacturing method according to the first embodiment illustrated in FIGS. 5A to 5D is in that the step for forming the P-type semiconductor region 114 is omitted. Also, the shape of the mask at the time of forming the N-type semiconductor region 103 differs from the first embodiment. The other process flows are the same as with the first embodiment.

As illustrated in FIG. 18A, the N-type semiconductor region 301 and P-type semiconductor region 302 are formed on the semiconductor substrate 300a. A heretofore known semiconductor process may be employed for formation of each of the semiconductor regions. Each of the semiconductor regions may be formed by introducing an impurity into the semiconductor substrate 300a by, for example, ion implantation or thermal diffusion. In the event of forming an N-type semiconductor region, arsenic or phosphorous is introduced. In the event of forming a P-type semiconductor region, boron is introduced. This is true for other semiconductor regions. Note that no impurity is introduced into the N-type semiconductor region 301, and a portion of the semiconductor substrate 300a may be the N-type semiconductor region 301 without change.

Next, with a process illustrated in FIG. 18A, an N-type impurity is introduced into an area where the N-type semiconductor region 103 is disposed. The N-type semiconductor region 103 may be formed by this N-type impurity introduced in this process. The N-type semiconductor region 103 is formed by ion implantation using a mask 1602. That is to say, the ends of the N-type semiconductor region 103 may be defined with the mask 1602.

A feature of the manufacturing method according to some embodiments is in that a portion of the mask 1602 is disposed on the area 1601. Thus, the N-type impurity is not readily introduced into the area 1601, and accordingly, the N-type semiconductor region 103 is not formed on the area 1601. Instead thereof, a portion of the P-type semiconductor region 302 is disposed on the area 1601.

With a process in FIG. 18A, the P-type semiconductor region 115 may be formed. At this time, a P-type impurity for forming the P-type semiconductor region 115 is introduced into the semiconductor substrate employing the mask 1602 used at the time of forming the N-type semiconductor region 103.

Next, with a process in FIG. 18B, a P-type impurity is introduced into the area where the P-type semiconductor region 118 is disposed. According to the P-type impurity introduced in this process, the P-type semiconductor region 118 may be formed. The P-type semiconductor region 118 is formed by ion implantation employing the mask 1603. That is to say, the ends of the P-type semiconductor region 118 may be defined by the mask 1603.

With a process in FIG. 18C, other members are formed. This is the same process as with the processes in FIGS. 5C and 5D, and accordingly, description will be omitted.

The driving method according to the present embodiment is the same as with the first embodiment. Specifically, FIG. 6 illustrates driving pulses of the image pickup apparatus according to the present embodiment.

Also, the height relation of the potential barrier according to the present embodiment is the same as with the first embodiment. Specifically, FIGS. 7A to 7D and 8A to 8D illustrate the height relation of the potential barrier according to the present embodiment.

Advantages of some embodiments will be described. As illustrated in FIGS. 7A to 7D and 8A to 8D, the bottom of a potential distribution of the first holding unit 10 according to some embodiments extends in the transfer direction of charge as compared to the comparative example. Thus, the bottom of a potential distribution of the first holding unit 10 according to some embodiments comes closer to the transfer unit as compared to the comparative example. This is caused by the P-type semiconductor region 302 surrounded with the N-type semiconductor region 103 being disposed. In this manner, according to the configuration of some embodiments, a potential barrier is not readily formed on a path of charge from the photoelectric conversion unit to the input node of the amplifier element as compared to the comparative example. Accordingly, transfer of charge from the holding unit may be performed with lower voltage.

Also, with some embodiments, the process to form the P-type semiconductor region 114 according to the first embodiment, or the process to introduce a P-type impurity into the area 117 according to the second embodiment may be omitted. Therefore, an image pickup apparatus whereby transfer of charge may be performed with lower voltage may be manufactured by a simple process.

Fifth Embodiment

Another embodiment of the image pickup apparatus will be described. With some embodiments, it is a feature that the pixels include the first holding unit 10 and a second holding unit 12.

FIG. 1 is an overall block diagram of image pickup apparatuses according to some embodiments. An image pickup apparatus 1 may be configured of one chip using a semiconductor substrate. The image pickup apparatus 1 includes multiple pixels disposed in an image pickup area 2. Further, the image pickup apparatus 1 includes a control unit 3. The control unit 3 supplies a control signal, power supply voltage, and so forth to a vertical scanning unit 4, a signal processing unit 5, and an output unit 6.

The vertical scanning unit 4 supplies a driving pulse to multiple pixels disposed in the image pickup area 2. Usually, the vertical scanning unit 4 supplies a driving pulse for each pixel row or for every multiple pixel rows. The vertical scanning unit 4 may be configured of a shift register or address decoder.

The signal processing unit 5 is configured to include a column circuit, a horizontal scanning circuit, and a horizontal output line. The column circuit is configured of multiple circuit blocks which each receive the signals of multiple pixels included in a pixel row selected by the vertical scanning unit 4. Each of the circuit blocks may be configured of one or all of a memory unit, an amplifier circuit, a denoising circuit, and an analog-to-digital conversion circuit, or a combination of these. These circuits may be a circuit which processes digital signals or may be a circuit which processes analog signals. The horizontal scanning circuit may be configured of a shift register or address decoder.

The output unit 6 outputs a signal transmitted via a horizontal output line out of the image pickup apparatus 1. The output unit 6 is configured to include a buffer or amplifier circuit.

Figure 19:
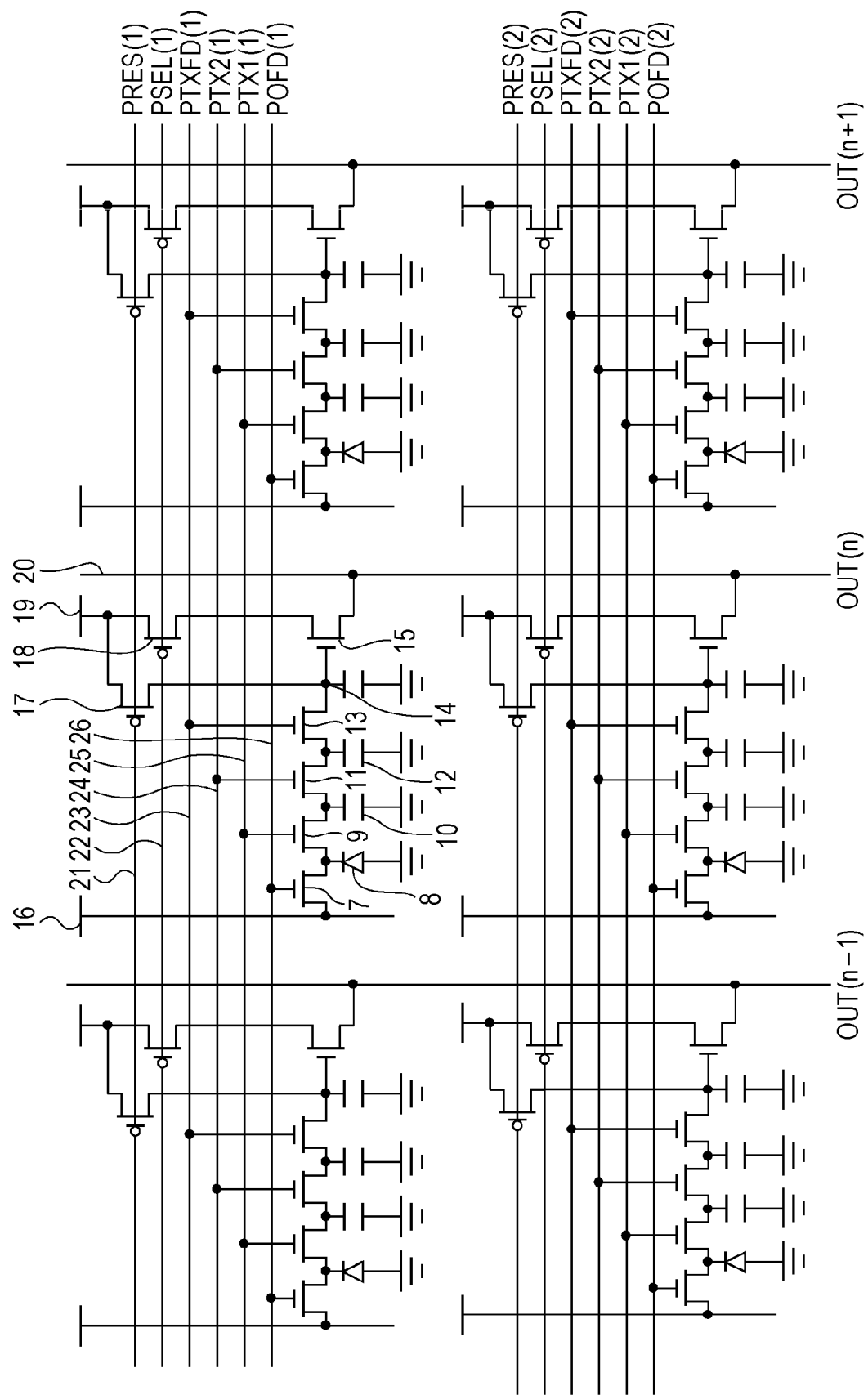
FIG. 19 is a diagram illustrating an equivalent circuit of an embodiment of the image pickup apparatus.

FIG. 19 illustrates an equivalent circuit of image pickup apparatuses according to some embodiments. Here, though six pixels in a total of two rows by three columns are illustrated, an image pickup area may be configured by an even greater of pixels being disposed.

The photoelectric conversion unit 8 converts incident light into signal charge (electron or positive hole). A photodiode is illustrated as an example of the photoelectric conversion unit 8.

The first charge transfer unit 9 transfers charge generated at the photoelectric conversion unit 8 to a circuit element on the subsequent stage. Hereinafter, a case where electrons are employed as signal charge will be described as an example. The first charge transfer unit 9 is configured to include a control electrode disposed on the semiconductor substrate via an insulating film.

The first holding unit 10 holds electrons generated at the photoelectric conversion unit 8. The second charge transfer unit 11 transfers the electrons held at the first holding unit 10 to a circuit element on the subsequent stage. The second charge transfer unit 11 is configured to include a control electrode disposed on the semiconductor substrate via an insulating film.

The second holding unit 12 holds electrons transferred from the first holding unit 10 via the second charge transfer unit 11. A third charge transfer unit 13 transfers the electrons held at the second holding unit 12 to a circuit element on the subsequent stage. The third charge transfer unit 13 is configured to include a control electrode disposed on the semiconductor substrate via an insulating film.

An input node 14 of a amplifier element 15 is configured so as to hold electrons transferred from the second holding unit 12 via the third charge transfer unit 13. The input node 14 of the amplifier element 15 may be configured to include an FD area disposed in the semiconductor substrate. The amplifier element 15 amplifies a signal based on electrons transferred to the input node 14 and outputs to a vertical signal line 20. Here, a MOS transistor (hereinafter, amplifier transistor) is employed as the amplifier element 15. For example, the amplifier transistor makes up a source follower circuit. Also, the third charge transfer unit 13 is disposed in an electrical path between the input node 14 of the amplifier element 15 and the first holding unit 12. That is to say, the input node 14 of the amplifier element 15 and the first holding unit 12 are different nodes. The configuration is not restricted to such an example, and as long as two nodes are configured so as to be electrically insulated, these nodes are different nodes.

A fourth charge transfer unit 7 transfers the electrons of the photoelectric conversion unit 8 to an overflow drain area (hereinafter, OFD area). The OFD area may be configured of an N-type semiconductor region electrically connected to a wiring 16 which supplies power supply voltage, for example. The fourth charge transfer unit 7 may be configured to include a control electrode disposed on the semiconductor substrate via the insulating film. Electronic shutter operation may be performed with the fourth charge transfer unit 7. That is to say, a period to discharge electrons generated at the photoelectric conversion unit 8 (shutter period) and a period to accumulate electrons (exposure period) may be controlled by controlling the fourth charge transfer unit 7.

A reset unit 17 supplies reference voltage to the input node 14 of the amplifier element 15. The reset unit 17 resets the electrons held at the input node 14 of the amplifier element 15. Here, a MOS transistor (hereinafter, reset transistor) is employed as the reset unit 17.

A selecting unit 18 selects each pixel to read out the signal of a pixel to a vertical signal line 20 for each pixel or for every pixel row. Here, a MOS transistor (hereinafter, selecting transistor) is employed as the selecting unit 18. Note that the selecting unit 18 may be disposed in a path between the amplifier element 15 and the vertical signal line 20. Alternatively, the selecting unit 18 may be omitted. With an example of the selecting unit 18 being omitted, a pixel is selected by voltage that the reset unit 17 supplies to the input node 14 of the amplifier element 15.

Predetermined voltage is supplied to the drain of the reset transistor and the drain of the selecting transistor via a wiring 19. The predetermined voltage is power supply voltage, for example. Note that, in the event that the selecting unit 18 has been disposed in a path between the amplifier element 15 and the vertical signal line 20, and also in the event that the selecting unit 18 has been omitted, the drain of the amplifier transistor is connected to the wiring 19.

A reset control wiring 21 supplies a driving pulse PRES to the gate of the reset transistor. A selection control wiring 22 supplies a driving pulse PSEL to the gate of the selecting transistor. A third transfer control wiring 23 supplies a driving pulse PTX3 to a control electrode (hereinafter, third control gate) making up the third charge transfer unit 13. A second transfer control wiring 24 supplies a driving pulse PTX2 to a control electrode (hereinafter, second control gate) making up the second charge transfer unit 11. A first transfer control wiring 25 supplies a driving pulse PTX1 to a control electrode (hereinafter, first control gate) making up the first charge transfer unit 9. A fourth transfer control wiring 26 supplies a driving pulse PTX4 to a control electrode (hereinafter, fourth control gate) making up the fourth charge transfer unit 7. The height of the potential barrier of the semiconductor region below each of the control gates may be changed by changing a pulse value to be supplied to each of the control gates.

With some embodiments, at the pixel configuration illustrated with the equivalent circuit exemplified in FIG. 19, the electrical path between the photoelectric conversion unit 8 and the first holding unit 10 may have the following configuration. The configuration thereof is a configuration wherein the first charge transfer unit 9 disposed in the electrical path between the photoelectric conversion unit 8 and the first holding unit 10 is in a non-conductive state, and electrons are allowed to be moved from the photoelectric conversion unit 8 to the first holding unit 10. Here, the non-conductive state is a state in which of pulse values to be supplied to the first charge transfer unit 9, a pulse value to generate the highest potential barrier has been supplied. Accordingly, the non-conductive state of the first charge transfer unit 9 does not have to be a so-called completely off state, and the non-conductive state of the first charge transfer unit 9 also includes a state in which some sort of potential barrier has occurred as compared to a case where the first charge transfer unit 9 has completely been turned on.

For example, in the event that the first charge transfer unit 9 is a MOS transistor, a specific configuration may be made by this MOS transistor having an embedded channel configuration. More generally speaking, this configuration is a configuration wherein there is a portion in an area deeper than the surface where the potential barrier for an electrode is lower than the surface when the first charge transfer unit 9 is in a non-conductive state. In this case, a driving pulse to be supplied to the first charge transfer unit 9 may be a fixed value. That is to say, a fixed potential barrier may be employed instead of a configuration wherein two states of a conductive state and a non-conductive state are switchable.

According to such a configuration, when light is input to the photoelectric conversion unit 8, almost of electrons generated by photoelectric conversion are moved to the first holding unit 10 during the exposure period. Accordingly, the accumulation periods of all of the pixels disposed in the image pickup area 2 may be aligned.

Further, when the first charge transfer unit 9 is in a non-conductive state, a hole is accumulated on the surface. Also, in the event that the channel where electrons move exists in a predetermined depth portion from the surface, and accordingly, influence of dark current may be reduced as compared to a case where electrons move in an interface between the semiconductor substrate and the insulating film.

Alternatively, the electrical path between the photoelectric conversion unit 8 and the first holding unit 10 may have another configuration. The other configuration is a configuration wherein the first charge transfer unit 9 disposed in the electrical path between the photoelectric conversion unit 8 and the first holding unit 10 is in a non-conductive state, and no electrons are moved from the photoelectric conversion unit 8 to the first holding unit 10. Here, the non-conductive state is a state in which of pulse values to be supplied to the first charge transfer unit 9, a pulse value to generate the highest potential barrier has been supplied. In other words, this is a configuration wherein the majority of electrons generated by photoelectric conversion is accumulated in the photoelectric conversion unit 8.

During a period for accumulating electrons at the photoelectric conversion unit 8, a lower potential barrier than the potential barrier at the first charge transfer unit 9 is formed, and accordingly, a configuration wherein no electrons are moved from the photoelectric conversion unit 8 to the first holding unit 10 may be obtained. As for a specific configuration, when the first charge transfer unit 9 and fourth charge transfer unit 7 are in a non-conductive state, a potential barrier to be formed below the first control gate is higher than a potential barrier to be formed below the fourth control gate. Note that, when the first charge transfer unit 9 and fourth charge transfer unit 7 are in a non-conductive state, electrons are accumulated at the photoelectric conversion unit 8.

According to such a configuration, the majority of electrons generated by photoelectric conversion at the time of light being input to the photoelectric conversion unit 8 is accumulated in the photoelectric conversion unit 8 during the exposure period. Accordingly, with all of the pixels disposed in the image pickup area 2, charge accumulated in the photoelectric conversion units 8 is simultaneously transferred to the first holding unit 10, whereby the accumulation periods of all of the pixels may be aligned.

Specific configurations of pixels of some embodiments will be described with reference to FIGS. 20, 21A, and 21B. Members having the same names as members described in FIG. 19 have the same functions, and accordingly, detailed description will be omitted.

Figure 20:
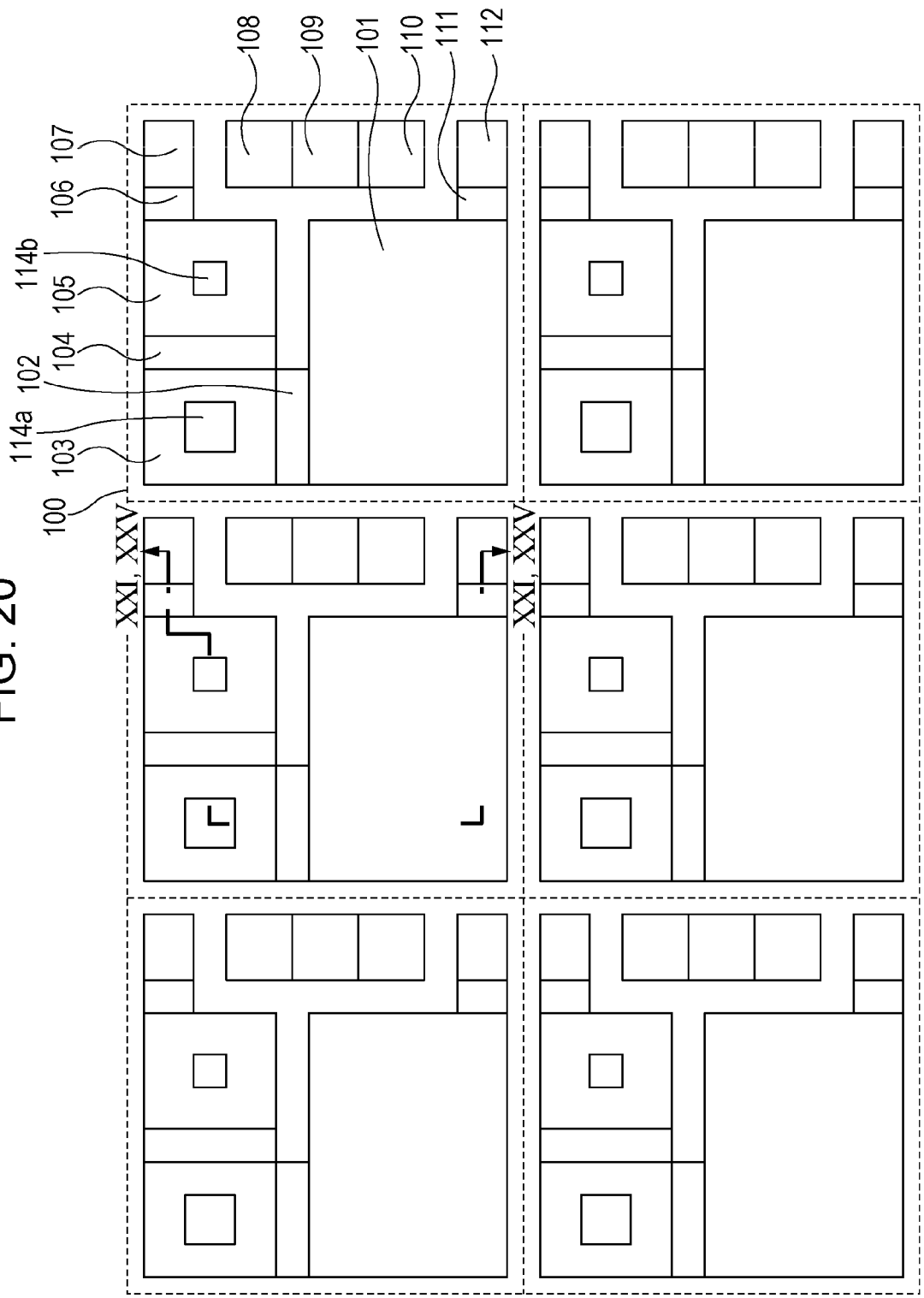
FIG. 20 is a schematic view illustrating the top face of an embodiment of an image pickup apparatus.

FIG. 20 illustrates a top view of image pickup apparatuses according to some embodiments. Here, though six pixels in a total of two rows by three columns are illustrated, an image pickup area may be configured by an even greater of pixels being disposed.

Pixels 100 are configured of an N-type semiconductor region 101 making up the photoelectric conversion unit 8, a control electrode 102 making up the first charge transfer unit 9, an N-type semiconductor region 103 making up the first holding unit 10, a control electrode 104 making up the second charge transfer unit 11, an N-type semiconductor region 105 making up the second holding unit 12, a control electrode 106 making up the third charge transfer unit 13, an FD area 107, a reset transistor 108, an amplifier transistor 109, and a selecting transistor 110. Further, the pixels 100 include a control electrode 111 and an OFD area 112 which make up the fourth charge transfer unit 7. The FD area 107 is configured to include an N-type semiconductor region where electrons held at the second holding unit 12 are transferred. The OFD area 112 is configured to include an N-type semiconductor region where a charge from the photoelectric conversion unit 8 is transferred.

Note that the OFD area 112 may be shared with the source or drain of the reset transistor, selecting transistor, or amplifier transistor. That is to say, the charge of the first holding unit 10 is transferred to the source or drain of one of the reset transistor, selecting transistor, and amplifier transistor. According to such a configuration, the area of the photoelectric conversion unit 8 may be increased, and accordingly, sensitivity may be improved.

A P-type semiconductor region 115a is disposed below the N-type semiconductor region 103. The N-type semiconductor region 103 and P-type semiconductor region 115a make up a PN junction. A P-type semiconductor region 115b is disposed below the N-type semiconductor region 105. The N-type semiconductor region 105 and P-type semiconductor region 115b make up a PN junction. The P-type semiconductor regions 115a and 115b have the same function as with the P-type semiconductor region 115 according to the first embodiment. Note that, with some embodiments, the P-type semiconductor regions 115a and 115b may be omitted.

A feature of some embodiments are in that a P-type semiconductor region 114a and a P-type semiconductor region 114b are disposed in the pixels 100. As illustrated in FIG. 20, as viewed at a certain planar surface, the N-type semiconductor region 103 surrounds the P-type semiconductor region 114a. Therefore, a portion of the N-type semiconductor region 103 is disposed between the P-type semiconductor region 114a and the control electrode 102. Also, a portion of the N-type semiconductor region 103 is disposed between the P-type semiconductor region 114a and the control electrode 104. Note that the N-type semiconductor region 103 does not have to surround the P-type semiconductor region 114a.

As viewed at a certain planar surface, the N-type semiconductor region 105 surrounds the P-type semiconductor region 114b. Therefore, a portion of the N-type semiconductor region 105 is disposed between the P-type semiconductor region 114b and the control electrode 104. Also, a portion of the N-type semiconductor region 105 is disposed between the P-type semiconductor region 114b and the control electrode 106. Note that the N-type semiconductor region 105 does not have to surround the P-type semiconductor region 114b. Any one of the P-type semiconductor regions 114a and 114b may be omitted.

Also, as illustrated in FIG. 20, when projecting the P-type semiconductor regions 114a and 114b on a certain planar surface, the area of projection of the P-type semiconductor region 114a is greater than the area of projection of the P-type semiconductor region 114b. In this manner, in the event of increasing the area of the P-type semiconductor region 114a to be disposed in the first holding unit 10, transfer of charge of the first holding unit 10 may be performed with low voltage. The second holding unit 12 is allowed to transfer charge using voltage from the FD area 107, charge may readily be transferred. On the other hand, transfer of charge from the first holding unit 10 is performed by voltage from the second holding unit 12, and accordingly, transfer of charge is not readily performed. Therefore, as with some embodiments, transfer of charge from the first holding unit 10 to the second holding unit 12 may effectively be performed by increasing the area of the P-type semiconductor region 114a to be disposed on the first holding unit 10.

Note that, as for a modification of some embodiments, the area of projection of the P-type semiconductor region 114a may be the same as the area of projection of the P-type semiconductor region 114b. Alternatively, the area of projection of the P-type semiconductor region 114a may be smaller than the area of projection of the P-type semiconductor region 114b. Also, in these cases, it is desirable that the impurity concentration of the P-type semiconductor region 114a is higher than the impurity concentration of the P-type semiconductor region 114b.

Figure 21A:
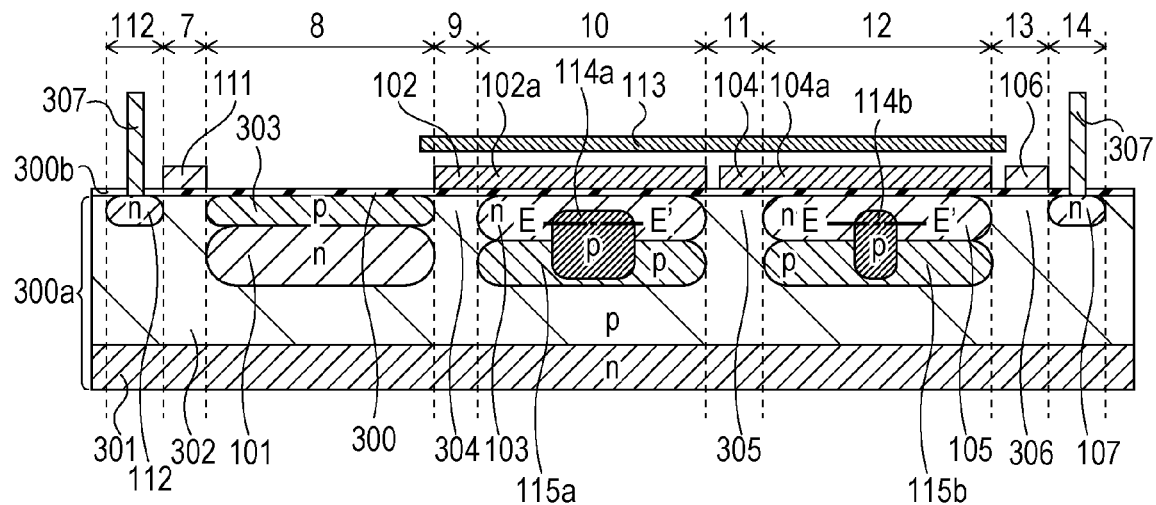
FIGS. 21A and 21B are schematic views of a cross section of an embodiment of the image pickup apparatus.
Figure 21B:
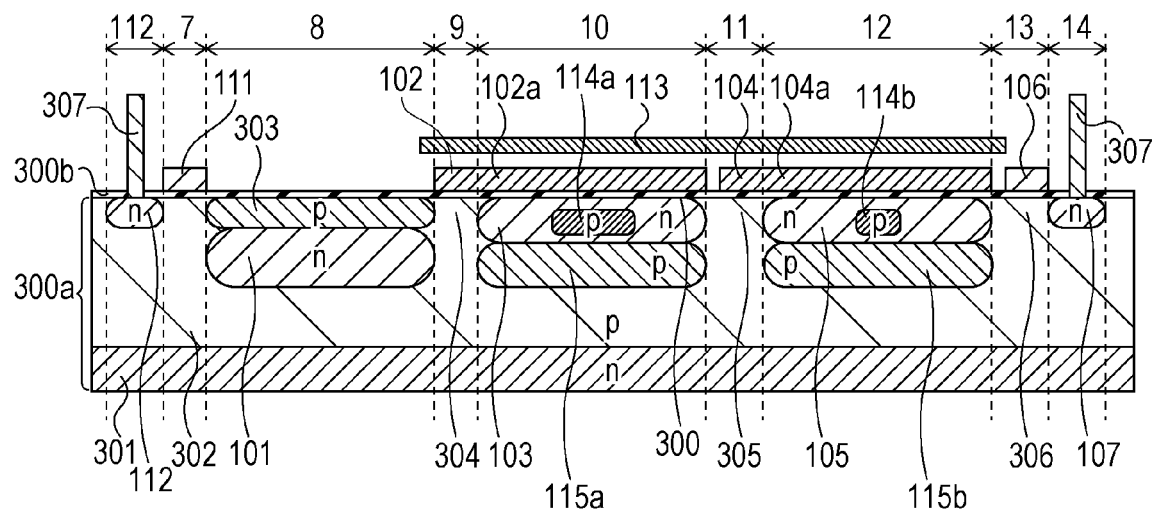

FIGS. 21A and 21B illustrate schematic views of a cross-sectional configuration along the line XXI-XXI in FIG. 20. Members having the same functions in FIG. 19 will be denoted with the same reference numerals, and detailed description will be omitted. As some embodiments, two cross-sectional configuration examples in FIGS. 21A and 21B are illustrated. FIGS. 21A and 21B are the same except that the configurations of the P-type semiconductor regions 114a and 114b differs.

The image pickup apparatuses according to some embodiments include a semiconductor substrate 300a and an insulating film 300b disposed thereon. The semiconductor substrate 300a is silicon, for example. The semiconductor substrate 300a may include a semiconductor region formed with epitaxial growth. The insulating film 300b is a silicon oxide film, for example. A semiconductor region is formed within the semiconductor substrate 300a. Also, a control electrode is disposed on the semiconductor substrate 300a via the insulating film 300b.

An N-type semiconductor region 301 is disposed in the semiconductor substrate 300a. A P-type semiconductor region 302 is disposed on the N-type semiconductor region 301. The N-type semiconductor region 101 is disposed so as to make up a PN junction with the P-type semiconductor region 302. A P-type semiconductor region 303 is disposed on the surface side of the N-type semiconductor region 101, i.e., a side close to the insulating film 300b. A so-called embedded-type photodiode is made up of the P-type semiconductor region 302, N-type semiconductor region 101, and P-type semiconductor region 303.

Electrons generated at the photoelectric conversion unit 8 move in a first channel 304, and reach the N-type semiconductor region 103 which makes up the first holding unit 10. The electrons held at the N-type semiconductor region 103 move in a second channel 305, and reach an N-type semiconductor region 105 which makes up the second holding unit 12. The electrons held at the N-type semiconductor region 105 move in a third channel 306, and reach an N-type semiconductor region 107 which makes up the FD area. Also, electrons generated at the photoelectric conversion unit 8 may be discharged to the OFD area 112 via the fourth charge transfer unit 7.

The control electrode 102 is disposed on the upper portion of the first channel 304 via the insulating film 300b. With some embodiments, the control electrode 102 includes a portion 102a disposed on the N-type semiconductor region 103. The control electrode 102 is shared by the first charge transfer unit 9 and first holding unit 10. That is to say, potential between the photoelectric conversion unit 8 and the first holding unit 10 is controlled by voltage to be applied to the control electrode 102. Additionally, the potential of the holding unit 10 is controlled by voltage to be applied to the control electrode 102. The first charge transfer unit 9 is configured to include the first channel 304 and a portion of the control electrode 102 disposed on the first channel 304 via the insulating film.

The first holding unit 10 includes the N-type semiconductor region 103 and the P-type semiconductor region 115a which makes up a PN junction with the N-type semiconductor region 103. Electrons are accumulated by the N-type semiconductor region 103 making up PN junction capacitance. Further, the first holding unit 10 is configured to include a portion 102a of the control electrode 102 disposed on the N-type semiconductor region 103 via the insulating film. An inversion layer may be formed on the interface 300 side of the N-type semiconductor region 103 by voltage to be applied to the control electrode 102. Thus, mixing of dark current into the first holding unit 10 may be reduced.

The control electrode 104 is disposed on the second channel 305 via the insulating film 300b. With some embodiments, the control electrode 104 includes a portion 104a disposed on the N-type semiconductor region 105. The control electrode 104 is shared by the second charge transfer unit 11 and second holding unit 12. That is to say, potential between the first holding unit 10 and the second holding unit 12 is controlled by voltage to be applied to the control electrode 104. Additionally, the potential of the second holding unit 12 is controlled by voltage to be applied to the control electrode 104. The second charge transfer unit 11 is configured to include the second channel 305 and a portion of the control electrode 104 disposed on the second channel 305 via the insulating film.

The second holding unit 12 includes the N-type semiconductor region 105 and the P-type semiconductor region 115b which makes up a PN junction with the N-type semiconductor region 105. Electrons are accumulated by the N-type semiconductor region 105 making up PN junction capacitance. Further, the second holding unit 12 is configured to include a portion 104a of the control electrode 104 disposed on the N-type semiconductor region 105 via the insulating film. An inversion layer may be formed on the interface 300 side of the N-type semiconductor region 105 by voltage to be applied to the control electrode 104. Thus, mixing of dark current into the second holding unit 12 may be reduced.

The control electrode 106 is disposed on the third channel 306 via the insulating film 300b. The third charge transfer unit 13 is configured to include the third channel 306 and the control electrode 106 disposed on the third channel 306 via the insulating film.

A plug 307 is connected to the FD area 107 and OFD area 112. The FD area 107 is connected to the gate electrode of the amplifier transistor via the plug 307. The OFD area 112 is connected to a wiring 16 which is not illustrated, via the plug 307.

Also, the P-type semiconductor region 115a is disposed below the N-type semiconductor region 103. The P-type semiconductor region 115a may be disposed just below a portion of the N-type semiconductor region 103, or may be disposed below the whole of the N-type semiconductor region 103. The N-type semiconductor region 103 and P-type semiconductor region 115a make up a PN junction. The impurity concentration of the P-type semiconductor region 115a is higher than the impurity concentration of the P-type semiconductor region disposed below the P-type semiconductor region 115a. For example, with some embodiments, the impurity concentration of the P-type semiconductor region 115a is higher than the impurity concentration of the P-type semiconductor region 302. According to such a configuration, extension of a depletion layer from the N-type semiconductor region 103 may be reduced, and accordingly, charge may be transferred from the first holding unit 10 with low voltage.

Also, the P-type semiconductor region 115b is disposed below the N-type semiconductor region 105. The P-type semiconductor region 115b may be disposed just below a portion of the N-type semiconductor region 105, or may be disposed below the whole of the N-type semiconductor region 105. The N-type semiconductor region 105 and P-type semiconductor region 115b make up a PN junction. The impurity concentration of the P-type semiconductor region 115b is higher than the impurity concentration of the P-type semiconductor region disposed below the P-type semiconductor region 115b. For example, with some embodiments, the impurity concentration of the P-type semiconductor region 115b is higher than the impurity concentration of the P-type semiconductor region 302. According to such a configuration, extension of a depletion layer from the N-type semiconductor region 105 may be reduced, and accordingly, charge may be transferred from the second holding unit 12 with low voltage.

Note that either or both of the P-type semiconductor regions 115a and 115b may be omitted. With an example of the P-type semiconductor region 115a being omitted, the P-type semiconductor region 302 disposed below the N-type semiconductor region 103 may have an impurity distribution where the impurity concentration becomes higher the deeper the depth is, or an even impurity distribution.

With some embodiments, the P-type semiconductor region 114a is disposed below the N-type semiconductor region 103. That is to say, a portion of the N-type semiconductor region 103 which makes up the first holding unit 10 is disposed between the P-type semiconductor region 114a and the interface 300. The interface 300 is a plane where the semiconductor substrate 300a and insulating film 300b are in contact.

Also, the P-type semiconductor region 114b is disposed below the N-type semiconductor region 105. That is to say, a portion of the N-type semiconductor region 105 which makes up the second holding unit 12 is disposed between the P-type semiconductor region 114b and the interface 300.

As illustrated in FIGS. 21A and 21B, with a plane including line E-E' parallel to the interface 300, the P-type semiconductor region 114a is surrounded with the N-type semiconductor region 103. That is to say, at the depth-wise direction of the drawing, the N-type semiconductor region 103 is disposed adjacent to the P-type semiconductor region 114a, and at the close side thereof, the N-type semiconductor region 103 is disposed adjacent to the P-type semiconductor region 114a. In this manner, with some embodiments, at the depth illustrated in the line E-E', the P-type semiconductor region 114a is surrounded with the N-type semiconductor region 103.

With the example illustrated in FIG. 21A, a portion disposed in a deep position of the semiconductor substrate 300a of the P-type semiconductor 114a is not surrounded with the N-type semiconductor region 103. That is to say, the P-type semiconductor region 114a extends deeper than the lower end of the N-type semiconductor region 103. The lower end of the N-type semiconductor region 103 is a PN junction surface with the P-type semiconductor region 115a, for example.

With the example illustrated in FIG. 21B, distance from the interface 300 to the lower end of the P-type semiconductor region 114a is shorter than distance from the interface 300 to the lower end of the N-type semiconductor region 103. That is to say, a portion of the N-type semiconductor region 103 is disposed below the P-type semiconductor region 114a. Note that the lower end of the P-type semiconductor region 114a is a PN junction surface with the N-type semiconductor region 103, for example. The lower end of the N-type semiconductor region 103 is the PN junction surface with the P-type semiconductor region 115a, for example.

As illustrated in FIGS. 21A and 21B, with a plane including line E-E' parallel to the interface 300, the P-type semiconductor region 114b is surrounded with the N-type semiconductor region 105. That is to say, at the depth-wise direction of the drawing, the N-type semiconductor region 105 is disposed adjacent to the P-type semiconductor region 114b, and at the close side thereof, the N-type semiconductor region 105 is disposed adjacent to the P-type semiconductor region 114b. In this manner, with some embodiments, at the depth illustrated in the line E-E', the P-type semiconductor region 114b is surrounded with the N-type semiconductor region 105.

With the example illustrated in FIG. 21A, a portion disposed in a deep position of the semiconductor substrate 300a of the P-type semiconductor 114b is not surrounded with the N-type semiconductor region 105. That is to say, the P-type semiconductor region 114a extends deeper than the lower end of the N-type semiconductor region 105. The lower end of the N-type semiconductor region 105 is a PN junction surface with the P-type semiconductor region 115b, for example.

With the example illustrated in FIG. 21B, distance from the interface 300 to the lower end of the P-type semiconductor region 114b is shorter than distance from the interface 300 to the lower end of the N-type semiconductor region 105. That is to say, a portion of the N-type semiconductor region 105 is disposed below the P-type semiconductor region 114b. Note that the lower end of the P-type semiconductor region 114b is a PN junction surface with the N-type semiconductor region 105, for example. The lower end of the N-type semiconductor region 105 is the PN junction surface with the P-type semiconductor region 115b, for example.

Next, the impurity concentration of each of the semiconductor regions will be described. Note that the impurity concentration of each of the semiconductor regions is not restricted to this, and may be changed as appropriate. A P-type semiconductor region surrounded with the N-type semiconductor region 103 is disposed, whereby transfer of charge may be performed with low voltage.

The impurity concentration of the P-type semiconductor regions 114a and 114b may be higher than that of the P-type semiconductor region 302. Alternatively, the impurity concentration of the P-type semiconductor regions 114a and 114b may be higher than that of the N-type semiconductor regions 103 and 105. The higher the impurity concentration of the P-type semiconductor regions 114a and 114b is, the smaller voltage to be used for transfer of charge from the first holding unit 10 or second holding unit 12 may be reduced. Note that, with some embodiments, the impurity concentration of the P-type semiconductor region 114a and 114b may be a concentration almost approximate to an intrinsic semiconductor.

The impurity concentration of the P-type semiconductor region 114a and the impurity concentration of the P-type semiconductor region 114b may be the same. Or, the impurity concentration of the P-type semiconductor region 114a may be higher than the impurity concentration of the P-type semiconductor region 114b. Or, the impurity concentration of the P-type semiconductor region 114a may be lower than the impurity concentration of the P-type semiconductor region 114b.

Note that, as with a later-described embodiment, in the event that the second semiconductor region is the same conductive type as the first semiconductor region making up the holding unit, the lower the impurity concentration of the second semiconductor region is, the smaller voltage to be used for transfer of charge from the first holding unit 10 may be reduced.

On the other hand, the impurity concentration of the P-type semiconductor regions 114a and 114b may be lower than that of the P-type semiconductor region 303, for example. Alternatively, the impurity concentration of the P-type semiconductor regions 114a and 114b may be lower than the impurity concentration of the P-type semiconductor region which makes up a potential barrier which is not illustrated. In the event that the impurity concentration of the P-type semiconductor regions 114a and 114b is high, the charge retention capacitance of the holding unit may be reduced. Therefore, according to such a configuration, deterioration in the charge retention capacitance of the holding unit may be suppressed.

It is desirable that the impurity concentration of the N-type semiconductor regions 103 and 105 is higher than that of the N-type semiconductor region 101. Thus, the charge retention capacitance of the first holding unit 10 and second holding unit 12 may be increased. Alternatively, the sensitivity of the photoelectric conversion unit 8 may be improved.

It is desirable that the impurity concentration of the P-type semiconductor region 303 is higher than that of the P-type semiconductor region 302. Alternatively, it is desirable that the impurity concentration of the P-type semiconductor region 303 is higher than that of the N-type semiconductor region 101. According to such a configuration, noise due to dark current at the photoelectric conversion unit 8 may be reduced.

A light shielding member 113 is disposed above the first holding unit 10 and second holding unit 12. The first holding unit 10 and second holding unit 12 are shielded by the light shielding member 113. Preferably, the light shielding member 113 shields the entire light to be input to the first holding unit 10 and second holding unit 12. The end portion on the photoelectric conversion unit 8 side of the light shielding member 113 is closer to the photoelectric conversion unit 8 than the end portion on the photoelectric conversion unit 8 side of the first holding unit 10. The end portion on the FD area 107 side of the light shielding member 113 is closer to the FD area 107 than the end portion on the FD area 107 side of the second holding unit 12.

However, the configuration is not restricted to this, and as with some embodiments, an arrangement may be made wherein in the event that the control electrode 102 is shared by the first charge transfer unit 9 and first holding unit 10, at least the end portion of the photoelectric conversion unit 8 side of the control electrode 102 is not covered. According to such a configuration, influence of the light shielding member 113 as to the photoelectric conversion unit 8 is reduced, and accordingly, the sensitivity of the photoelectric conversion unit 8 may be improved. Further, influence as to a pixel position of light to be input with a certain angle against the vertical direction may be reduced. Alternatively, electrons subjected to photoelectric conversion at the N-type semiconductor region 103 or P-type semiconductor region 302 which makes up the first holding unit 10 may be accumulated at the N-type semiconductor region 103. Thus, the sensitivity of pixels may be improved.

Note that the overall of the first holding unit 10 does not have to be covered with the light shielding member 113. For example, in order to dispose a conductor for supplying a driving pulse to the control electrode 102 which makes up the first holding unit 10, an opening may be provided to the light shielding member 113.

The entirety of the second holding unit 12 does not have to be covered with the light shielding member 113. For example, in order to dispose a conductor for supplying a driving pulse to the control electrode 104 which makes up the second holding unit 12, an opening may be provided to the light shielding member 113.

Metal making up a wiring layer may be employed as the light shielding member 113. Alternatively, there may be employed metal making up a plug for electrically connecting different wiring layers or between a wiring and a semiconductor region. It is desirable to dispose the light shielding member 113 in a place as close as possible to the semiconductor substrate 300*a*. It is desirable to employ metal making up a wiring layer disposed closest to the semiconductor substrate 300*a* of the multiple wiring layers, or a metal plug which electrically connects the wiring layer of the lowest layer and a semiconductor region. Alternatively, a metal specifically for the light shielding member 113 may be disposed between the wiring layer of the lowest layer and the semiconductor substrate.

FIGS. 21A and 21B illustrate the light shielding member 113 alone disposed on the first holding unit 10. However, a light shielding member may be disposed on a transistor making up another pixel circuit. Alternatively, a transistor making up another pixel circuit may be shielded by wiring. Transistors making up another pixel circuit include the above-mentioned reset transistor, selecting transistor, amplifier transistor, and so forth.

A manufacturing method suitable for the image pickup apparatus according to the present embodiment will be described. The manufacturing method according to the present embodiment is the same as the manufacturing method according to the first embodiment. Specifically, FIGS. 5A to 5D illustrate the manufacturing method according to the present embodiment, though in FIGS. 5A to 5D, the second holding unit 12 is not illustrated. However, a semiconductor region which makes up the second holding unit 12 has to be formed, for example, by changing the patterns of the masks 501 and 502. In this manner, the second holding unit 12 may be formed by the method for manufacturing the first holding unit 10.

Next, a driving method according to some embodiments will be described. FIG. 22 illustrates a driving pulse diagram of the image pickup apparatus according to some embodiments. This is a pulse diagram illustrating a case of performing global electronic shutter operation wherein exposure periods agree regarding all of the pixels disposed in the image pickup area 2. The numbers in parentheses indicate the number of rows, and in the present drawing, driving pulses to be supplied to the pixels in the first and second rows are illustrated. PSEL indicates a driving pulse to be supplied to the gate of the selecting transistor. PRES indicates a driving pulse to be supplied to the gate of the reset transistor. PTX1 indicates a driving pulse to be supplied to the first control gate. PTX2 indicates a driving pulse to be supplied to the second control gate. PTX3 indicates a driving pulse to be supplied to the third control gate. PTX4 indicates a driving pulse to be supplied to the fourth control gate. PTS indicates a driving pulse for performing sample hold of a light signal using, for example, the memory unit disposed in the column circuit. PTN indicates a driving pulse for performing sample hold of a noise signal using, for example, the memory unit disposed in the column circuits. All of the driving pulses are in a high level at the time of a conductive state.

At point-in-time t1 and theretofore, the PRES and PTX4 in all of the rows in the image pickup area 2 are in a high level. Here, the other pulses illustrated in FIG. 22 are in a low level. Thus, electrons generated at the photoelectric conversion unit 8 are discharged to the OFD area.

At the point-in-time t1, in a state in which the PRES and PTX4 maintain a high level, with all of the pixels disposed in the image pickup area 2, the PTX1, PTX2, and PTX3 make the transition from a low level to a high level. Thus, the photoelectric conversion unit 8, first holding unit 10, and second holding unit 12 are reset.

At point-in-time t2, the PTX1, PTX2, PTX3, and PTX4 in all of the rows in the image pickup area 2 make the transition from a high level to a low level. According to this operation, exposure periods in all of the pixels disposed in the image pickup area 2 are started. During exposure periods, of electrons generated at the photoelectric conversion unit 8, predetermined amount of electrons move to the first holding unit 10.

After elapsing of a predetermined period following the point-in-time t2, at point-in-time t3 the PTX1 in all of the rows in the image pickup area 2 makes the transition from a low level to a high level, at point-in-time t4 the PTX1 in all of the rows in the image pickup area 2 makes the transition from a high level to a low level. According to this operation, the electrons remaining in the photoelectric conversion unit 8 are transferred to the first holding unit 10. According to this operation, the exposure periods are ended.

At point-in-time t5, the PTX4 in all of the rows disposed in the image pickup apparatus make the transition from a low level to a high level. According to this operation, the height of a potential barrier between the photoelectric conversion unit 8 and OFD area 112 becomes lower than the height of a potential barrier between the photoelectric conversion unit 8 and the first holding unit 10. Thus, electrons generated at the photoelectric conversion unit 8 do not move to the first holding unit 10 but move to the OFD area 112.

At the point-in-time t5, the PTX2 in all of the rows disposed in the image pickup area 2 make the transition from a low level to a high level, and at point-in-time t6 the PTX2 in all of the rows disposed in the image pickup area 2 make the transition from a high level to a low level. According to this operation, electrons held at the first holding units 10 are transferred to the second holding units 12.

At point-in-time t7, the PSEL(1) makes the transition from a low level to a high level. According to this operation, the signals of the pixels at the first row are in a state enabled to be output to the vertical signal line 20. Further, at the point-in-time t7, the PRES(1) makes the transition from a high level to a low level. Thus, the reset operations of the input nodes 14 of the amplifier elements 15 are completed.

At point-in-time t8, the PTN makes the transition from a low level to a high level, and at point-in-time t9 the PTN makes the transition from a high level to a low level. According to this operation, a noise signal is held at, for example, the memory unit for noise signals disposed in the column circuit.

At point-in-time t10, the PTX3(1) makes the transition from a low level to a high level, and at point-in-time t11 the PTX3(1) makes the transition from a high level to a low level. According to this operation, electrons held at the second holding units 12 of the pixels at the first row are transferred to the input nodes 14 of the amplifier elements 15.

At point-in-time t12, the PTS makes the transition from a low level to a high level, and at point-in-time t13 the PTS makes the transition from a high level to a low level. According to this operation, a light signal on which a noise signal is superimposed is held at, for example, the memory unit for light signals disposed in the column circuit.

At point-in-time t14, the PSEL(1) makes the transition from a high level to a low level. According to this operation, the readout periods of the signals of the pixels at the first row are ended. The readout periods of the pixels at the first row are a period from the point-in-time t7 to the point-in-time t14. Further, at the point-in-time t14, the PRES(1) makes the transition from a low level to a high level. Thus, reset for the input nodes 14 of the amplifier elements 15 of the pixels of the first row is started.

After this, with a period from point-in-time t15 to point-in-time t22, readout of the signals of the pixels at the second row are performed. This operation is the same operation as the first row, and accordingly, detailed description will be omitted. The operation at each point-in-time from the point-in-time t15 to the point-in-time t22 is the same as the operation at each point-in-time from the point-in-time t7 to the point-in-time t14 except that objects for driving pulses to be set to a high level belong to the second row.

According to such an operation, the exposure periods may be equalized regarding all of the pixels disposed in the image pickup area 2. With this operation, up to transfer to the second holding unit 12 is performed at the entire image pickup surface at the same time. The specific point-in-time thereof is the point-in-time t6. Thereafter, readout of all of the rows in the image pickup area 2 is performed by repeating the readout operation.

FIGS. 23A to 23D and 24A to 24E illustrate a relation of height of a potential barrier at each point-in-time and period in the driving pulse diagram illustrated in FIG. 22. FIGS. 23A to 23D and 24A to 24E illustrate the potentials of the OFD area 112, fourth charge transfer unit 7, photoelectric conversion unit 8, first charge transfer unit 9, first holding unit 10, second charge transfer unit 11, second holding unit 12, third charge transfer unit 13, and input node 14 (FD area 107). The potential of a pixel according to some embodiments is illustrated with a solid line.

Note that, with the present Specification, the potential is the potential energy of signal charge. For example, in the event that signal charge is electrons, the higher the voltage applied to a control electrode is, the lower the potential of the semiconductor region below the control electrode becomes. This is because electrons have negative charge. At an area where voltage is high, the potential energy of electrons is low. On the other hand, in the event that signal charge is a hole, the higher the voltage applied from a control electrode is, the higher the potential of the semiconductor region below the control electrode becomes. This is because holes have positive charge. At an area where voltage is high, the potential energy of a hole is high. In FIGS. 23A to 23D and 24A to 24E, the lower portions in the drawings represent low potential for signal charge, and the upper portions in the drawings represent high potential for signal charge.

Figure 23A:
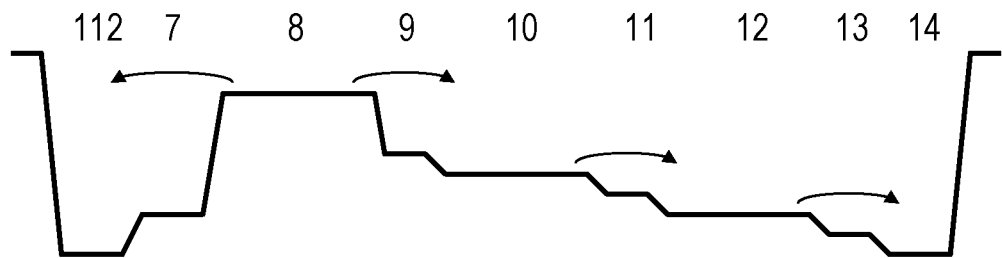
FIGS. 23A to 23D are schematic diagrams representing potential with an embodiment of the image pickup apparatus.

FIG. 23A is a diagram illustrating a potential state during a period from the point-in-time t1 to the point-in-time t2. As described in FIG. 22, with the period from the point-in-time t1 to the point-in-time t2, a pulse in a high level is supplied to all of the first charge transfer unit 9, second charge transfer unit 11, third charge transfer unit 13, and fourth charge transfer unit 7. That is to say, potential barriers generated at all of the charge transfer units are in a low state. Electrons generated at the photoelectric conversion unit 8 is discharged to the OFD area 112 or the drain (not illustrated) of the reset transistor. It is desirable that there are no electrons in the photoelectric conversion unit 8, first holding unit 10, and second holding unit 12.

As for a preferable potential state as to electrons at this time, the photoelectric conversion unit 8 exhibits the highest potential. Further, as illustrated in the drawings, it is a preferable state in which potential sequentially decreases from the photoelectric conversion unit 8 to the input node 14 of the amplifier element 15. That is to say, the potential of the photoelectric conversion unit 8 may be higher than the potential of the first holding unit 10. The potential of the first holding unit 10 may be higher than the potential of the second holding unit 12. The potential of the second holding unit 12 may be higher than the potential of the input node 14.

Figure 23B:
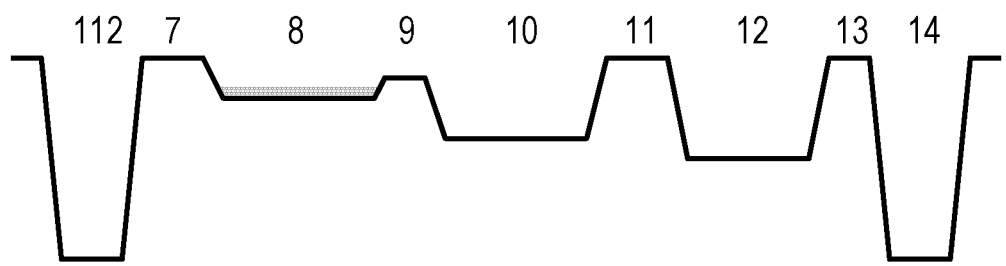
Figure 23C:
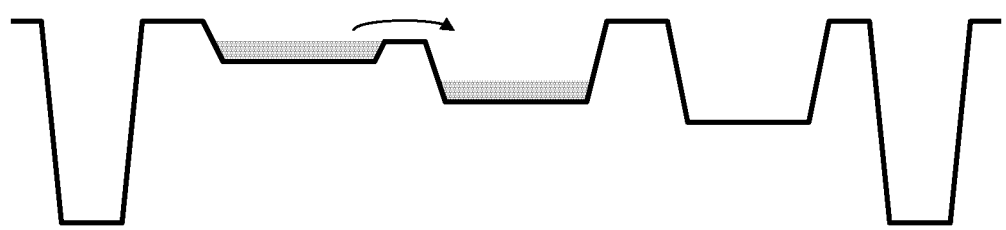

FIGS. 23B and 23C are diagrams illustrating a potential state of a period from the point-in-time t2 to the point-in-time t3, i.e., during the exposure period. The first charge transfer unit 9 is in a non-conductive state. Specifically, as compared to the case in FIG. 23A, the height of a potential barrier between the photoelectric conversion unit 8 and the first holding unit 10 is higher. Further, the fourth charge transfer unit 7 is in a non-conductive state. Specifically, as compared to the case in FIG. 23A, the height of a potential barrier between the photoelectric conversion unit 8 and the OFD area 112 is higher. Thus, in FIG. 23B, small amount of electrons is accumulated at the photoelectric conversion unit 8. Also, in the state in FIG. 23B, the height of a potential barrier to be generated at the first charge transfer unit 9 is lower than the height of a potential barrier to be generated at the fourth charge transfer unit 7.

The potential state in FIG. 23C is the same as with FIG. 23B, but the amount of light input to the photoelectric conversion unit 8 differs. In the event that a certain amount or more of electrons has been generated at the photoelectric conversion unit 8, the electrons cross over the potential barrier generated at the first charge transfer unit 9 and move to the first holding unit 10. That is to say, in the event of predetermined amount or more of light being input, the photoelectric conversion unit 8 and first holding unit 10 hold the electrons during the exposure period.

Figure 23D:
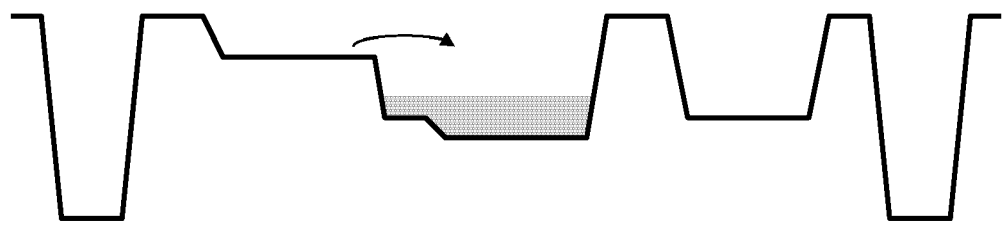

FIG. 23D is a diagram illustrating a potential state during a period from the point-in-time t3 to the point-in-time t4. The electrons accumulated at the photoelectric conversion unit 8 are transferred to the first holding unit 10. In order to improve transfer efficiency of the electrons from the photoelectric conversion unit 8, it is desirable that a potential barrier at a channel region of the first charge transfer unit 9 in a conductive state is lower than the potential of the photoelectric conversion unit 8. Further, it is desirable that the potential of the first holding unit 10 is lower than the potential of the photoelectric conversion unit 8.

With some embodiments, the control electrode 102 is shared by the first charge transfer unit 9 and first holding unit 10, and accordingly, in the event of a driving pulse which causes the first charge transfer unit 9 to be a conductive state being supplied, the potential of the first holding unit 10 also becomes low. Thus, as illustrated in FIG. 23D, the potential in the event that no electrons are held at the first holding unit 10 may be lower than the potential of the second holding unit 12.

Figure 24A:
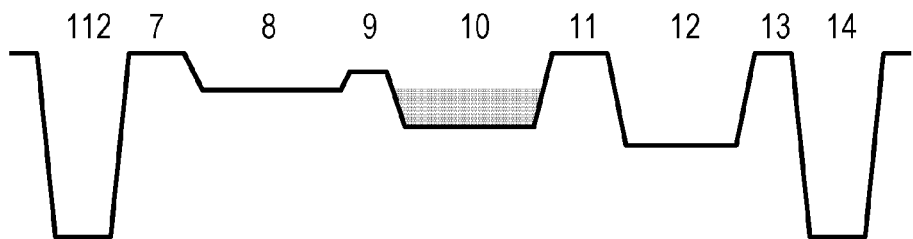
FIGS. 24A to 24E are schematic diagrams representing potential with an embodiment of the image pickup apparatus.

FIG. 24A is a diagram illustrating a potential state during a period from the point-in-time t4 to the point-in-time t5. This illustrates a state after which the first charge transfer unit 9 has entered a non-conductive state, and the second charge transfer unit 11 is in a state before entering the conductive state. The amount of electrons determined by the potential barrier generated at the first charge transfer unit 9 is accumulated in the first holding unit 10.

Figure 24B:
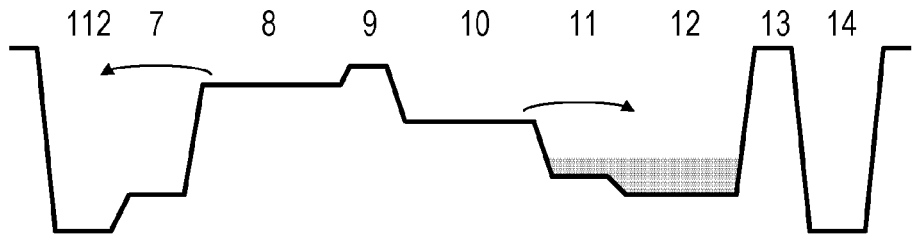

FIG. 24B is a diagram illustrating potential states during a period from the point-in-time t5 to the point-in-time t6. The fourth charge transfer unit 7 is in a conductive state, and accordingly, the potential barrier at the fourth charge transfer unit 7 becomes lower than the potential barrier at the first charge transfer unit 9. It is desirable that the potential barrier at the fourth charge transfer unit 7 is lower than the potential of the photoelectric conversion unit 8. According to such a potential state, electrons generated at the photoelectric conversion unit 8 may be moved to the OFD area 112 while holding electrons at the first holding unit 10.

Also, in FIG. 24B, the second charge transfer unit 11 is in a conductive state. Thus, electrons held at the first holding unit 10 are transferred to the second holding unit 12 via the second charge transfer unit 11. In order to improve the transfer efficiency of electrons from the first holding unit 10, it is desirable that the height of the potential barrier at a channel region of the second charge transfer unit 11 in a conductive state is lower than the potential of the first holding unit 10. Further, it is desirable that the potential of the second holding unit 12 is lower than the potential of the first holding unit 10. With some embodiments, the control electrode 104 is shared by the second charge transfer unit 11 and second holding unit 12, and accordingly, in the event of a driving pulse for causing the second charge transfer unit 11 to be in a conductive state being supplied, the potential of the second holding unit 12 also decreases.

Figure 24C:
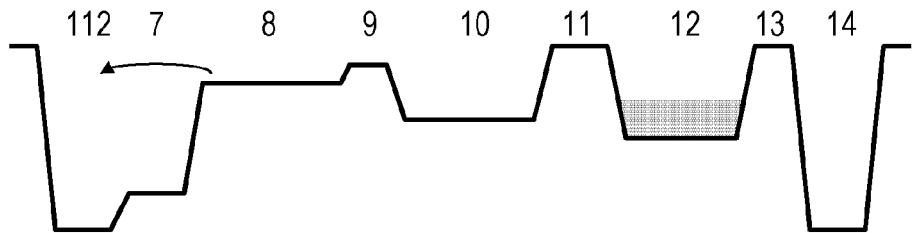

FIG. 24C illustrates potential states of the pixels at the first row during a period from the point-in-time t6 to the point-in-time t10, and potential states of the pixels at the second row during a period from the point-in-time t6 to the point-in-time t18. This is a period after the second charge transfer unit 11 is placed in a non-conductive state until the third charge transfer unit 13 is placed in a conductive state. The length of this period may differ for each pixel row. Both of the second charge transfer unit 11 and third charge transfer unit 13 are in a non-conductive state, and electrons are accumulated in the second holding unit 12 due to the potential barrier.

Figure 24D:
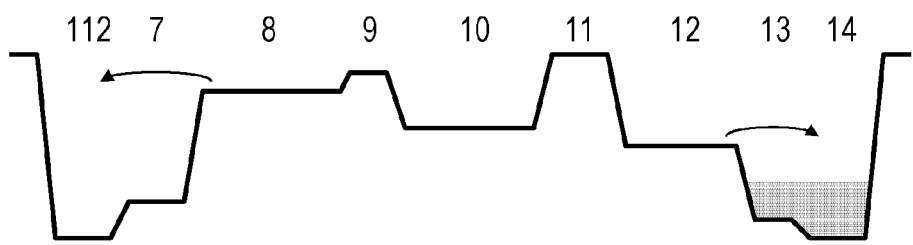

FIG. 24D illustrates potential states of the pixels at the first row during a period from the point-in-time t10 to the point-in-time t11, and potential states of the pixels at the second row during a period from the point-in-time t18 to the point-in-time t19. The third charge transfer unit 13 is placed in a conductive state. Thus, electrons held at the second holding unit 12 are transferred to the input node 14 of the amplifier element 15. In order to improve the transfer efficiency of the electrons from the second holding unit 12, it is desirable that the height of the potential barrier at the time of electroconduction of the third charge transfer unit 13 is lower than the height of potential of the second holding unit 12. Further, it is desirable that the height of potential of the input node 14 of the amplifier element 15 is lower than the height of potential of the second holding unit 12.

Figure 24E:
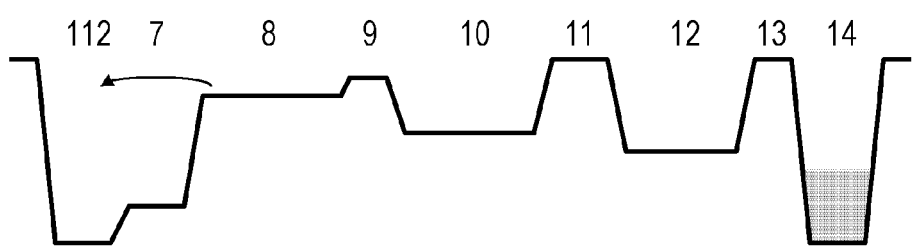

FIG. 24E is a diagram illustrating potential states of the pixels at the first row during a period from the point-in-time t11 to the point-in-time t14, and potential states of the pixels at the second row during a period from the point-in-time t19 to the point-in-time t22. This is a diagram illustrating a potential state after the third charge transfer unit 13 is placed in a non-conductive state. While light is input to the photoelectric conversion unit 8, electrons are discharged to the OFD area by the fourth charge transfer unit 7. Also, electrons may also be mixed into the first holding unit 10. However, the height of the potential barrier of the second charge transfer unit 11 is higher than the height of the potential barrier of the first charge transfer unit 9, and accordingly, charge is not readily mixed into the second holding unit 12. The potentials of the pixels at the first row at the point-in-time t14 and thereafter and the potentials of the pixels at the second row at the point-in-time t22 and thereafter may be in a state illustrated in FIG. 23A.

With some embodiments, the P-type semiconductor region 114a is disposed in the first holding unit 10. Thus, as illustrated in FIG. 24B, at the time of transferring electrons from the first holding unit 10 to the second holding unit 12, voltage to be supplied to the control electrode 104 of the second charge transfer unit may be decreased. That is to say, transfer of charge with low voltage is enabled.

Also, with some embodiments, the P-type semiconductor region 114b is disposed in the second holding unit 12. Thus, as illustrated in FIG. 24D, at the time of transferring electrons from the second holding unit 12 to the input node 14, voltage to be supplied to the control electrode 106 of the third charge transfer unit may be decreased. That is to say, transfer of charge with low voltage is enabled.

In this manner, according to the configuration according to some embodiments, a potential barrier is not readily formed on a path of charge from the photoelectric conversion unit to the input node of the amplifier element as compared to the comparative example. Accordingly, transfer of charge from the holding unit may be performed with lower voltage.

Also, with some embodiments, the P-type semiconductor regions 114a and 114b are disposed separately from the interface 300. According to such a configuration, the charge retention capacitance of the first holding unit 10 may be increased. Also, the N-type semiconductor region 103 is disposed below the P-type semiconductor region 114, whereby the charge retention capacitance of the first holding unit 10 may be increased.

Sixth Embodiment

Another embodiment of the image pickup apparatus will be described. The present embodiment differs from the fifth embodiment in that the N-type semiconductor region 103 which makes up the first holding unit 10 includes a first portion 103a and a second portion 103b of which the impurity concentration is lower than that of the first portion 103a. Further, the second portion 103b is surrounded with the first portion 103a. Further, the present embodiment differs from the fifth embodiment in that the N-type semiconductor region 105 which makes up the second holding unit 12 includes a first portion 105a and a second portion 105b of which the impurity concentration is lower than that of the first portion 105a. The second portion 105b is surrounded with the first portion 105a. Also, the P-type semiconductor regions 114a and 114b according to the fifth embodiment may be omitted. The other portions are all the same as with the fifth embodiment. Therefore, with the present embodiment, points different from the fifth embodiment will be described, and description will be omitted regarding the other portions.

The overall block configuration of the image pickup apparatus according to the present embodiment is the same as with the fifth embodiment. Specifically, FIG. 1 is an overall block diagram of the image pickup apparatus according to the present embodiment.

An equivalent circuit of the image pickup apparatus according to the present embodiment is the same as with the first embodiment. Specifically, FIG. 19 illustrates an equivalent circuit of the image pickup apparatus according to the present embodiment.

The top view of the image pickup apparatus according to the present embodiment is the same as with the fifth embodiment. Specifically, FIG. 20 illustrates a top view of the image pickup apparatus according to the present embodiment. However, the second portion 103b of the N-type semiconductor region 103 is disposed in the place where the P-type semiconductor region 114a is disposed. Also, the second portion 105b of the N-type semiconductor region 105 is disposed in the place where the P-type semiconductor region 114b is disposed.

With some embodiments, the N-type semiconductor region 103 includes a first portion 103a and a second portion 103b of which the impurity concentration is lower than that of the first portion 103a. As viewed at a certain planar surface, the first portion 103a surrounds the second portion 103b. Therefore, the first portion 103a is disposed between the second portion 103b and the control electrode 102. Also, the first portion 103a is disposed between the second portion 103b and the control electrode 104. Note that the first portion 103a does not have to surround the second portion 103b.

Also, with some embodiments, the N-type semiconductor region 105 includes a first portion 105a and a second portion 105b of which the impurity concentration is lower than that of the first portion 105a. As viewed at a certain planar surface, the first portion 105a surrounds the second portion 105b. Therefore, the first portion 105a is disposed between the second portion 105b and the control electrode 104. Also, the first portion 105a is disposed between the second portion 105b and the control electrode 106. Note that the first portion 105a does not have to surround the second portion 105b.

A specific configuration of pixels according to some embodiments will be described with reference to FIGS. 25A and 25B. Portion having the same functions as with FIGS. 21A and 21B are denoted with the same reference numerals. The portions denoted with the same reference numerals as with FIGS. 21A and 21B are the same as with the fifth embodiment, and accordingly, detailed description will be omitted.

Figure 25A:
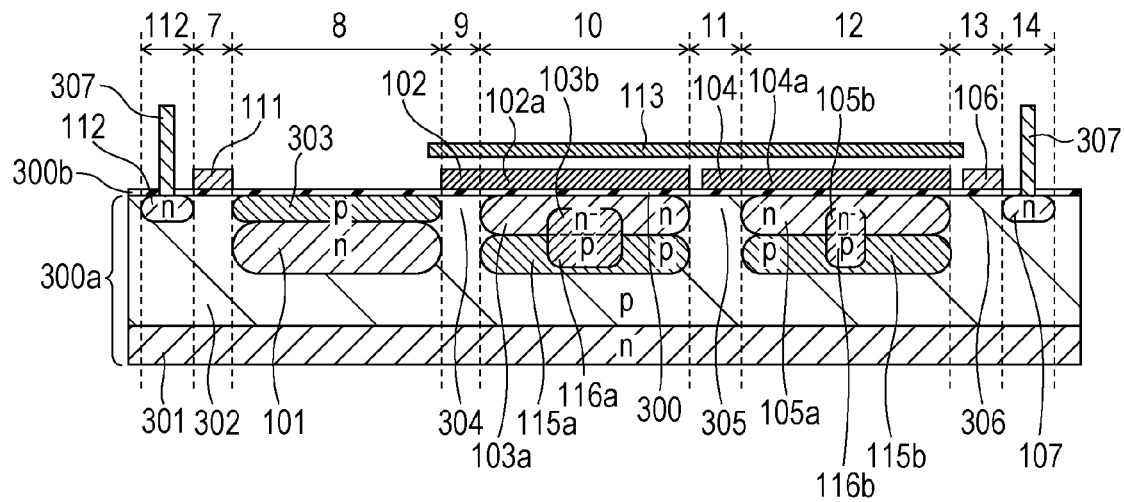
FIGS. 25A and 25B are schematic diagrams representing potential with an embodiment of the image pickup apparatus.
Figure 25B:
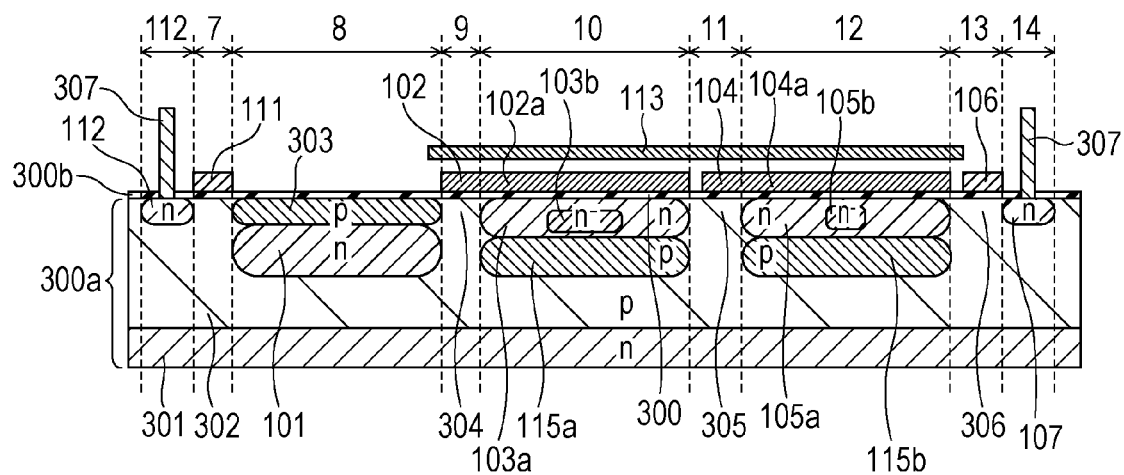

FIGS. 25A and 25B illustrate schematic views of a cross-sectional configuration along the line XXV-XXV in FIG. 21. As some embodiments, two cross-sectional configuration examples in FIGS. 25A and 25B are illustrated. FIGS. 25A and 25B are the same except that the layouts of the second portions 103b and 105b differ.

With some embodiments, the N-type semiconductor region 103 includes the first portion 103a and second portion 103b. The second portion 103b is surrounded with the first portion 103a at a surface parallel to the interface 300. That is to say, at the depth-wise direction of the drawing, the first portion 103a is disposed adjacent to the second portion 103b, and at the close side thereof, the first portion 103a is disposed adjacent to the second portion 103b.

The first portion 103a is disposed between the second portion 103b and the interface 300. Of the first portion 103a, a portion disposed between the second portion 103b and the interface 300 will be referred to as third portion as appropriate. The impurity concentration of the second portion 103b is lower than the impurity concentration of the third portion.

Also, with some embodiments, the N-type semiconductor region 105 includes the first portion 105a and second portion 105b. The second portion 105b is surrounded with the first portion 105a at a surface parallel to the interface 300. That is to say, at the depth-wise direction of the drawing, the first portion 105a is disposed adjacent to the second portion 105b, and with at the close side thereof, the first portion 105a is disposed adjacent to the second portion 105b. The first portion 105a is disposed between the second portion 105b and the interface 300.

With the example illustrated in FIG. 25A, a P-type semiconductor region 116a is disposed below the second portion 103b. The impurity concentration of the P-type semiconductor region 116a may be higher than that of the P-type semiconductor region 115a.

With the example illustrated in FIG. 25A, the lower end of the first portion 103a and the lower end of the second portion 103b are disposed at the same depth. The lower end of the first portion 103a is, for example, a PN junction which the first portion 103a and P-type semiconductor region 115a make up. The lower end of the second portion 103b is, for example, a PN junction which the second portion 103b and P-type semiconductor region 116a make up.

With the example illustrated in FIG. 25A, a P-type semiconductor region 116b is disposed below the second portion 105b. The impurity concentration of the P-type semiconductor region 116b may be higher than that of the P-type semiconductor region 115b.

With the example illustrated in FIG. 25A, the lower end of the first portion 105a and the lower end of the second portion 105b are disposed at the same depth. The lower end of the first portion 105a is, for example, a PN junction which the first portion 105a and P-type semiconductor region 115b make up. The lower end of the second portion 105b is, for example, a PN junction which the second portion 105b and P-type semiconductor region 116b make up.

With the example illustrated in FIG. 25B, the first portion 103a is disposed below the second portion 103b. Of the first portion 103a, a portion disposed below the second portion 103b will be referred to as fourth portion as appropriate. The impurity concentration of the second portion 103b is lower than the impurity concentration of the fourth portion. Also, with the example illustrated in FIG. 25B, the first portion 105a is disposed below the second portion 105b.

With some embodiments, the impurity concentration of the second portion 103b of the N-type semiconductor region 103 may be a concentration to the extent almost approximate to an intrinsic semiconductor. Also, the impurity concentration of the second portion 105b of the N-type semiconductor region 105 may be a concentration to the extent almost approximate to an intrinsic semiconductor.

Next, a manufacturing method suitable for the image pickup apparatus according to the present embodiment will be described. The manufacturing method according to the present embodiment is the same as the manufacturing method according to the second embodiment. Specifically, FIGS. 12A to 12D illustrate the manufacturing method according to the present embodiment. However, in FIGS. 12A to 12D, the second holding unit 12 is not illustrated. However, a semiconductor region which makes up the second holding unit 12 has to be formed, for example, by changing the patterns of the masks 501 and 502. In this manner, the second holding unit 12 may be formed by the method for manufacturing the first holding unit 10.

A driving method according to the present embodiment is the same as with the fifth embodiment. Specifically, FIG. 22 illustrates driving pulses of the image pickup apparatus according the present embodiment.

Also, height relations of the potential barriers according to the present embodiment are the same as with the fifth embodiment. Specifically, FIGS. 23A to 23D and 24A to 24E illustrate the height relations of the potential barriers according to the present embodiment.

Seventh Embodiment

Figure 26:
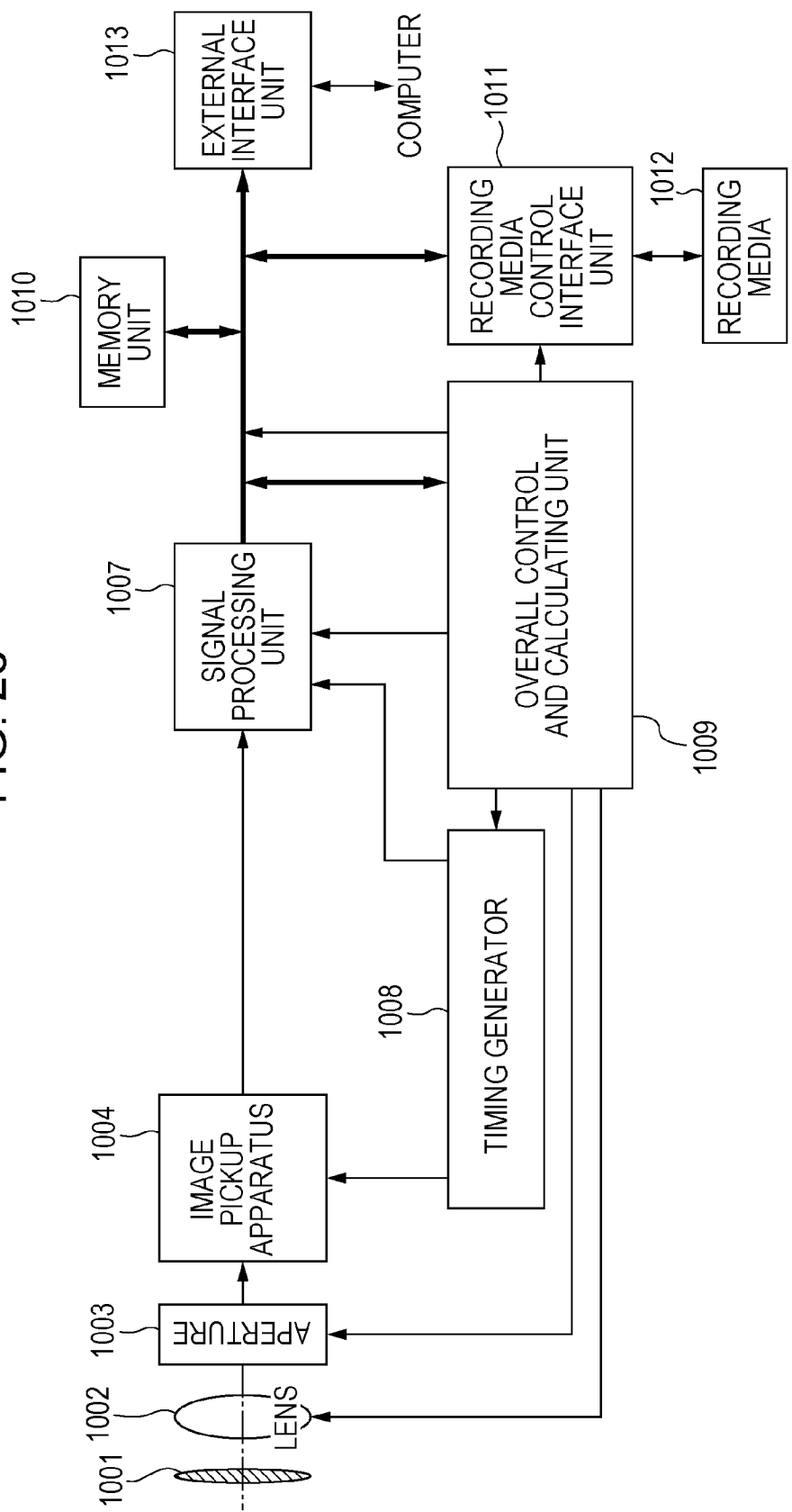
FIG. 26 is a block diagram of an image pickup system.

An embodiment of an image pickup system will be described. Examples of the image pickup system include digital still cameras, digital cam coders, duplicating machines, fax machines, cellular phones, in-vehicle cameras, and observation satellites. FIG. 26 illustrates a block diagram of a digital still camera as an example of the image pickup system.

In FIG. 26, reference numeral 1001 denotes a barrier for protecting a lens, 1002 denotes a lens which causes an image pickup apparatus 1004 to form an optical image of a subject, and 1003 denotes an aperture for varying the amount of light passed through the lens 1002. Reference numeral 1004 denotes an image pickup apparatus described in the above-mentioned embodiments, which converts an optical image formed by the lens 1002 as image data. Now, let us say that an AD conversion unit has been formed on the semiconductor substrate of the image pickup apparatus 1004. Reference numeral 1007 denotes a signal processing unit which subjects image pickup data output from the image pickup apparatus 1004 to various types of corrections, or compresses the data. In FIG. 26, reference numeral 1008 denotes a timing generator which outputs various timing signals to the image pickup apparatus 1004 and signal processing unit 1007, and 1009 is denotes overall control unit which controls the entire digital still camera. Reference numeral 1010 denotes a frame memory unit for temporarily storing image data, 1011 denotes an interface unit for performing recording in or read-out from a recording medium, and 1012 denotes a detachable recording medium such as semiconductor memory for recording or readout of image data. Reference numeral 1013 denotes an interface unit for communicating with an external computer or the like. Here, a timing signal and so forth may be input out of the image pickup system, and the image pickup system may include at least the image pickup apparatus 1004 and the signal processing unit 1007 which processes an image pickup signal output from the image pickup apparatus 1004.

With some embodiments, the configuration has been described wherein the image pickup apparatus 1004 and AD conversion unit are formed on the same semiconductor substrate. However, the image pickup apparatus 1004 and AD conversion unit may be provided to another semiconductor substrate. Also, the image pickup apparatus 1004 and signal processing unit 1007 may be formed on the same substrate.

As described above, the image pickup apparatus according to one or more embodiments may be applied to the image pickup system. The image pickup system may be driven with low voltage by applying the image pickup apparatus according to one or more embodiments to the image pickup system.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-033362, filed Feb. 17, 2012, which is hereby incorporated by reference herein in its entirety.

What is claimed is:

1. An image pickup apparatus comprising:
a semiconductor substrate; and
a plurality of pixels,
wherein
each of the plurality of pixels includes
a photoelectric conversion unit disposed in the semiconductor substrate;
a first semiconductor region of a first conductive-type disposed in the semiconductor substrate, and configured to hold charge generated by the photoelectric conversion unit at a place different from the photoelectric conversion unit;
a first transfer unit configured to transfer charge to the first semiconductor region; and
a second transfer unit configured to transfer charge held at the first semiconductor region,
the first semiconductor region includes
a first portion,
a second portion, and
a third portion, the first portion, the second portion and the third portion being disposed at a same depth in the semiconductor substrate,
the first portion is disposed between the third portion and the first transfer unit, and the second portion is disposed between the third portion and the second transfer unit; and
impurity concentration of the third portion is lower than impurity concentration of the first portion and impurity concentration of the second portion.

2. The image pickup apparatus according to claim 1, further comprising:
an insulating film disposed on the semiconductor substrate;
wherein a portion of the first semiconductor region is disposed between the third portion and an interface between the semiconductor substrate and the insulating film.

3. The image pickup apparatus according to claim 1, wherein the first substrate area includes
a fourth portion disposed below the third portion;
and wherein the impurity concentration of the third portion is lower than impurity concentration of the fourth portion.

4. The image pickup apparatus according to claim 1, wherein a lower end of the first portion, a lower end of the second portion, and a lower end of the third portion are disposed at the same depth of the semiconductor substrate.

5. An image pickup apparatus comprising:
a semiconductor substrate; and
a plurality of pixels;
wherein
each of the plurality of pixels includes:
a photoelectric conversion unit disposed in the semiconductor substrate;
a first semiconductor region of a first conductive-type disposed in the semiconductor substrate, and configured to hold charge generated by the photoelectric conversion unit at a place different from the photoelectric conversion unit;
a first transfer unit configured to transfer charge to the first semiconductor region; and
a second transfer unit configured to transfer charge held at the first semiconductor region,
the first semiconductor region includes
a first portion and
a second portion,
a second semiconductor region of a second conductive-type is disposed in the semiconductor substrate,
the first portion, the second portion and the second semiconductor region are disposed at a same depth in the semiconductor substrate, and
the first portion is disposed between the second semiconductor region and the first transfer unit, and the second portion is disposed between the second semiconductor region and the second transfer unit.

6. The image pickup apparatus according to claim 5, further comprising:
an insulating film disposed on the semiconductor substrate;
wherein the second semiconductor region is disposed at a distance from an interface between the semiconductor substrate and the insulating film.

7. The image pickup apparatus according to claim 5, further comprising:
an insulating film disposed on the semiconductor substrate;
wherein the second semiconductor region is disposed at a distance from an interface between the semiconductor substrate and the insulating film; and wherein distance from the interface to a lower end of the second semiconductor region is shorter than distance from the interface to a lower end of the first semiconductor region.

8. The image pickup apparatus according to claim 6, wherein a portion of the first semiconductor region is disposed between the second semiconductor region and the interface.

9. The image pickup apparatus according to claim 5, further comprising:
an insulating film disposed on the semiconductor substrate;
wherein distance from an interface between the semiconductor region and the insulating film to a lower end of the second semiconductor region is shorter than distance from the interface to a lower end of the first semiconductor region.

10. The image pickup apparatus according to claim 1, further comprising:
a third semiconductor region of a second conductive-type disposed below the first semiconductor region so as to configure a PN junction with the first semiconductor region;
wherein a second conductive-type semiconductor region of which the impurity concentration is lower than that of the third semiconductor region is disposed below the third semiconductor region.

11. The image pickup apparatus according to claim 10, wherein the first semiconductor region and the third semiconductor region are formed by ion implantation using a same mask.

12. The image pickup apparatus according to claim 1, wherein each of the plurality of pixels includes
a fourth semiconductor region of the first conductive-type configured to hold the charge generated by the photoelectric conversion unit at a place different from the photoelectric conversion unit and the first semiconductor region; and
wherein the second transfer unit is configured to transfer the charge held at the first semiconductor region to the fourth semiconductor region.

13. The image pickup apparatus according to claim 12, wherein each of the plurality of pixels includes
a third transfer unit configured to transfer charge held at the fourth semiconductor region;
wherein the fourth semiconductor region includes
a first portion,
a second portion, and
a third portion;
wherein, at a depth where the third portion of the fourth semiconductor region is disposed, the first portion of the fourth semiconductor region is disposed between the third portion of the fourth semiconductor region and the second transfer unit;
wherein, at the depth where the third portion of the fourth semiconductor region is disposed, the second portion of the fourth semiconductor region is disposed between the third portion of the fourth semiconductor region and the third transfer unit; and
wherein the impurity concentration of the third portion is lower than the impurity concentration of the first portion and the impurity concentration of the second portion.

14. The image pickup apparatus according to claim 13, wherein an area in a planar view of the third portion of the first semiconductor region is greater than an area in a planar view of the third portion of the fourth semiconductor region.

15. The image pickup apparatus according to claim 12, wherein each of the plurality of pixels includes a third transfer unit configured to transfer charge held at the fourth semiconductor region;
wherein the fourth semiconductor region includes
a first portion, and
a second portion;
wherein a fifth semiconductor region of a second conductive-type is disposed in the semiconductor substrate;
wherein, at a depth where the fifth semiconductor region is disposed, the first portion of the fourth semiconductor region is disposed between the fifth semiconductor region and the second transfer unit; and
wherein, at a depth where the fifth semiconductor region is disposed, the second portion of the fourth semiconductor region is disposed between the fifth semiconductor region and the third transfer unit.

16. The image pickup apparatus according to claim 15, wherein an area in a planar view of the second semiconductor region is greater than an area in a planar view of the fifth semiconductor region.

17. The image pickup apparatus according to claim 1, wherein each of the plurality of pixels includes
a fourth semiconductor region of the first conductive-type configured to hold the charge generated by the photoelectric conversion unit at a place different from the photoelectric conversion unit and the first semiconductor region; and
wherein the first transfer unit is configured to transfer charge held at the fourth semiconductor region to the first semiconductor region.

18. The image pickup apparatus according to claim 5, further comprising:
a third semiconductor region of the second conductive-type disposed below the first semiconductor region so as to configure a PN junction with the first semiconductor region;
wherein a second conductive-type semiconductor region of which the impurity concentration is lower than that of the third semiconductor region is disposed below the third semiconductor region.

19. The image pickup apparatus according to claim 18, wherein the first semiconductor region and the third semiconductor region are formed by ion implantation using a same mask.

20. The image pickup apparatus according to claim 5, wherein each of the plurality of pixels includes
a fourth semiconductor region of the first conductive-type configured to hold the charge generated by the photoelectric conversion unit at a place different from the photoelectric conversion unit and the first semiconductor region; and
wherein the second transfer unit is configured to transfer the charge held at the first semiconductor region to the fourth semiconductor region.

21. The image pickup apparatus according to claim 20, wherein each of the plurality of pixels includes
a third transfer unit configured to transfer charge held at the fourth semiconductor region;
wherein the fourth semiconductor region includes
a first portion,
a second portion, and
a third portion;
wherein, at a depth where the third portion of the fourth semiconductor region is disposed, the first portion of the fourth semiconductor region is disposed between the third portion of the fourth semiconductor region and the second transfer unit;

wherein, at the depth where the third portion of the fourth semiconductor region is disposed, the second portion of the fourth semiconductor region is disposed between the third portion of the fourth semiconductor region and the third transfer unit; and wherein the impurity concentration of the third portion is lower than the impurity concentration of the first portion and the impurity concentration of the second portion.

22. The image pickup apparatus according to claim 21, wherein an area in a planar view of the third portion of the first semiconductor region is greater than an area in a planar view of the third portion of the fourth semiconductor region.

23. The image pickup apparatus according to claim 20, wherein each of the plurality of pixels includes
a third transfer unit configured to transfer charge held at the fourth semiconductor region;
wherein the fourth semiconductor region includes
a first portion, and
a second portion;
wherein a fifth semiconductor region of the second conductive-type is disposed in the semiconductor substrate;
wherein, at a depth where the fifth semiconductor region is disposed, the first portion of the fourth semiconductor region is disposed between the fifth semiconductor region and the second transfer unit; and
wherein, at a depth where the fifth semiconductor region is disposed, the second portion of the fourth semiconductor region is disposed between the fifth semiconductor region and the third transfer unit.

24. The image pickup apparatus according to claim 23, wherein an area in a planar view of the second semiconductor region is greater than an area in a planar view of the fifth semiconductor region.

25. The image pickup apparatus according to claim 5, wherein each of the plurality of pixels includes
a fourth semiconductor region of the first conductive-type configured to hold the charge generated by the photoelectric conversion unit at a place different from the photoelectric conversion unit and the first semiconductor region; and
wherein the first transfer unit is configured to transfer charge held at the fourth semiconductor region to the first semiconductor region.

26. An image pickup system comprising:
the image pickup apparatus according to claim 1; and
a signal processing unit configured to process a signal to be output from the image pickup apparatus.

27. An image pickup system comprising:
the image pickup apparatus according to claim 5; and
a signal processing unit configured to process a signal to be output from the image pickup apparatus.

28. An image pickup apparatus manufacturing method comprising:
forming a photoelectric conversion unit in a first area of a semiconductor substrate; and
forming, in a second area of the semiconductor substrate, a first semiconductor region of the first conductive-type configured to hold charge generated by the photoelectric conversion unit at a place different from the photoelectric conversion unit;
wherein
the forming the first semiconductor region includes
introducing a first impurity of the first conductive-type into the second area,
the second area includes
a first portion and
a second portion surrounded with the first portion, a part of the first portion and the second portion being disposed at a same depth in the semiconductor substrate, and
the manufacturing method further comprises:
introducing a second impurity of a second conductive-type into the second area so that an amount of the second impurity to be introduced into the second portion is greater than an amount of the second impurity to be introduced into the first portion.

29. The image pickup apparatus manufacturing method according to claim 28, further comprising:
forming a second semiconductor region of the second conductive-type to form a PN junction with the first semiconductor region in a third area below the second area of the semiconductor substrate;
wherein the forming the second semiconductor region includes
introducing a third impurity of the second conductive-type into the third area; and
wherein a peak of a distribution of the second impurity is above a peak of a distribution of the third impurity.

30. The image pickup apparatus manufacturing method comprising:
forming a photoelectric conversion unit in a first area of a semiconductor substrate;
forming, in a second area of the semiconductor substrate, a first semiconductor region of a first semiconductor-type configured to hold charge generated by the photoelectric conversion unit at a place different from the photoelectric conversion unit, wherein the forming the first semiconductor region includes introducing a first impurity of the first conductive-type into the second area, and wherein the second area includes a first portion and a second portion surrounded with the first portion;
introducing a second impurity of a second conductive-type into the second area so that an amount of the second impurity to be introduced into the second portion is greater than an amount of the second impurity to be introduced into the first portion; and
forming a second semiconductor region of second conductive-type forming a PN junction with the first semiconductor region in a third area below the second area of the semiconductor substrate, wherein the forming the second semiconductor region includes introducing a third impurity of the second conductive-type into the third area;
wherein
a peak of a distribution of the second impurity is above a peak of a distribution of the third impurity,
the first impurity is introduced into the first area by a first ion implantation,
the third impurity is introduced into the third area by a second ion implantation, and
a same mask is used with the first ion implantation and the second ion implantation.

31. An image pickup apparatus manufacturing method comprising:
forming a photoelectric conversion unit in a first area of a semiconductor substrate; and
forming, in a second area of the semiconductor substrate, a first semiconductor region of a first conductive-type configured to hold charge generated by the photoelectric conversion unit at a place different from the photoelectric conversion unit,
wherein the second area includes
a first portion, and a second portion surrounded with the first portion, a part of the first portion and the second portion being disposed at a same depth in the semiconductor substrate, and the forming the first semiconductor region includes introducing a first impurity of a first conductive-type into the second area so that the amount of the first impurity to be introduced into the first portion is greater than the amount of the first impurity to be introduced into the second portion.

* * * * *